(12) United States Patent
Kimura

(10) Patent No.: US 10,043,794 B2
(45) Date of Patent: Aug. 7, 2018

(54) SEMICONDUCTOR DEVICE AND ELECTRONIC DEVICE

(71) Applicant: Semiconductor Energy Laboratory Co., Ltd., Atsugi-shi Kanagawa-ken (JP)

(72) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 435 days.

(21) Appl. No.: 13/795,908

(22) Filed: Mar. 12, 2013

(65) Prior Publication Data

US 2013/0249857 A1 Sep. 26, 2013

(30) Foreign Application Priority Data

Mar. 22, 2012 (JP) .................................. 2012-066111

(51) Int. Cl.
*G09G 3/30* (2006.01)
*H01L 27/06* (2006.01)
(Continued)

(52) U.S. Cl.
CPC .......... *H01L 27/0629* (2013.01); *G06F 3/044* (2013.01); *G09G 3/3225* (2013.01);
(Continued)

(58) Field of Classification Search
CPC ......... G09G 3/3233; G09G 2300/0819; G09G 2320/045; G09G 2320/043; G09G 3/3258; G09G 3/3225; G09G 3/3241
See application file for complete search history.

(56) References Cited

U.S. PATENT DOCUMENTS 4,417,162 A 11/1983 Keller et al.
5,432,477 A 7/1995 Nishiyama et al.
(Continued)

FOREIGN PATENT DOCUMENTS

JP 09-081053 A 3/1997
JP 2000-259098 A 9/2000
(Continued)

OTHER PUBLICATIONS

US 8,587,500, 11/2013, Kimura (withdrawn)
(Continued)

*Primary Examiner* — William Boddie
*Assistant Examiner* — Bipin Gyawali
(74) *Attorney, Agent, or Firm* — Fish & Richardson P.C.

(57) ABSTRACT

A semiconductor device includes a first wiring; a first switch having a function of controlling electrical connection between the first wiring and first and second capacitors; a second wiring; a transistor electrically connected to the second wiring and the first capacitor; a second switch having a function of controlling electrical connection between a gate and a source or a drain of the transistor; a third switch having a function of controlling electrical connection between the transistor and the first and second capacitors; a fourth switch having a function of controlling electrical connection between the second capacitor and the transistor; a third wiring; and a fifth switch having a function of controlling electrical connection between the third wiring and the second capacitor so that an operation defect of the semiconductor device can be prevented.

15 Claims, 23 Drawing Sheets

(51) Int. Cl.
  *G06F 3/044*        (2006.01)
  *G09G 3/3225*       (2016.01)
  *G09G 3/3233*       (2016.01)
  *H01L 27/32*            (2006.01)
  *H01L 27/12*            (2006.01)

(52) U.S. Cl.
  CPC ....... *G09G 3/3233* (2013.01); *H01L 27/1255* (2013.01); *G09G 2300/0819* (2013.01); *G09G 2300/0852* (2013.01); *G09G 2320/043* (2013.01); *H01L 27/1225* (2013.01); *H01L 27/326* (2013.01)

(56) References Cited

U.S. PATENT DOCUMENTS

| | | | |
|---|---|---|---|
| 5,528,032 A | 6/1996 | Uchiyama | |
| 5,550,066 A | 8/1996 | Tang et al. | |
| 5,684,365 A | 11/1997 | Tang et al. | |
| 5,872,473 A | 2/1999 | Williams | |
| 5,949,259 A | 9/1999 | Garcia | |
| 5,956,011 A | 9/1999 | Koyama et al. | |
| 6,037,924 A | 3/2000 | Koyama et al. | |
| 6,048,573 A | 4/2000 | Tang et al. | |
| 6,229,506 B1 | 5/2001 | Dawson et al. | |
| 6,310,598 B1 | 10/2001 | Koyama et al. | |
| 6,362,798 B1 | 3/2002 | Kimura et al. | |
| 6,448,836 B2 | 9/2002 | Kokubun et al. | |
| 6,476,792 B2 | 11/2002 | Hattori et al. | |
| 6,518,945 B1 | 2/2003 | Pinkham | |
| 6,548,960 B2 | 4/2003 | Inukai | |
| 6,577,302 B2 | 6/2003 | Hunter et al. | |
| 6,583,775 B1 | 6/2003 | Sekiya et al. | |
| 6,608,613 B2 | 8/2003 | Koyama et al. | |
| 6,611,108 B2 | 8/2003 | Kimura | |
| 6,611,130 B2 | 8/2003 | Chang | |
| 6,693,383 B2 | 2/2004 | Bae et al. | |
| 6,709,901 B1 | 3/2004 | Yamazaki et al. | |
| 6,737,813 B2 | 5/2004 | Kawasaki et al. | |
| 6,750,833 B2 | 6/2004 | Kasai | |
| 6,753,654 B2 | 6/2004 | Koyama | |
| 6,768,348 B2 | 7/2004 | Shionoiri et al. | |
| 6,774,577 B2 | 8/2004 | Choi | |
| 6,798,148 B2 | 9/2004 | Inukai | |
| 6,809,482 B2 | 10/2004 | Koyama | |
| 6,839,057 B2 | 1/2005 | Iguchi | |
| 6,858,989 B2 | 2/2005 | Howard | |
| 6,859,193 B1 | 2/2005 | Yumoto | |
| 6,873,116 B2 | 3/2005 | Kimura et al. | |
| 6,873,216 B2 | 3/2005 | Seya | |
| 6,876,350 B2 | 4/2005 | Koyama | |
| 6,891,356 B2 | 5/2005 | Kimura et al. | |
| 6,909,242 B2 | 6/2005 | Kimura | |
| 6,914,390 B2 | 7/2005 | Koyama | |
| 6,928,136 B2 | 8/2005 | Nagao et al. | |
| 6,958,750 B2 | 10/2005 | Azami et al. | |
| 6,963,336 B2 | 11/2005 | Kimura | |
| 6,975,142 B2 | 12/2005 | Azami et al. | |
| 7,015,884 B2 | 3/2006 | Kwon | |
| 7,030,847 B2 | 4/2006 | Kimura | |
| 7,042,162 B2 | 5/2006 | Yamazaki et al. | |
| 7,042,426 B2 | 5/2006 | Shin | |
| 7,046,240 B2 | 5/2006 | Kimura | |
| 7,053,890 B2 | 5/2006 | Inukai | |
| 7,057,588 B2 | 6/2006 | Asano et al. | |
| 7,068,076 B2 | 6/2006 | Azami | |
| 7,068,246 B2 | 6/2006 | Yamazaki et al. | |
| 7,091,750 B2 | 8/2006 | Shionoiri et al. | |
| 7,106,006 B2 | 9/2006 | Koyama | |
| 7,106,125 B1 | 9/2006 | Drapkin et al. | |
| 7,129,917 B2 | 10/2006 | Yamazaki et al. | |
| 7,133,012 B2 | 11/2006 | Abe | |
| 7,151,278 B2 | 12/2006 | Nagao et al. | |
| 7,170,094 B2 | 1/2007 | Yamazaki et al. | |
| 7,173,584 B2 | 2/2007 | Kimura et al. | |
| 7,173,590 B2 | 2/2007 | Uchino et al. | |
| 7,180,485 B2 | 2/2007 | Kimura et al. | |
| 7,187,351 B2 | 3/2007 | Kwon | |
| 7,218,294 B2 | 5/2007 | Koyama et al. | |
| 7,230,592 B2 | 6/2007 | Sato et al. | |
| 7,242,376 B2 | 7/2007 | Yamashita et al. | |
| 7,253,665 B2 | 8/2007 | Kimura | |
| 7,268,498 B2 | 9/2007 | Miyagawa et al. | |
| 7,277,071 B2 | 10/2007 | Oh | |
| 7,317,429 B2 | 1/2008 | Shirasaki et al. | |
| 7,319,443 B2 | 1/2008 | Kimura et al. | |
| 7,324,101 B2 | 1/2008 | Miyazawa | |
| 7,327,168 B2 | 2/2008 | Kimura | |
| 7,327,357 B2 | 2/2008 | Jeong | |
| 7,336,251 B2 | 2/2008 | Osada | |
| 7,345,657 B2 | 3/2008 | Kimura | |
| 7,348,825 B2 | 3/2008 | Kimura et al. | |
| 7,362,289 B2 | 4/2008 | Yamazaki et al. | |
| 7,365,713 B2 | 4/2008 | Kimura | |
| 7,365,742 B2 | 4/2008 | Kim et al. | |
| 7,378,739 B2 | 5/2008 | Kwak et al. | |
| 7,378,882 B2 | 5/2008 | Kimura | |
| 7,382,342 B2 | 6/2008 | Uchino et al. | |
| 7,411,586 B2 | 8/2008 | Kimura | |
| 7,423,638 B2 | 9/2008 | Kwon | |
| 7,429,985 B2 | 9/2008 | Kimura et al. | |
| 7,435,992 B2 | 10/2008 | Choi et al. | |
| 7,443,367 B2 | 10/2008 | Numao | |
| 7,456,810 B2 | 11/2008 | Kimura | |
| 7,462,897 B2 | 12/2008 | Endo | |
| 7,463,223 B2 | 12/2008 | Kimura | |
| 7,502,001 B2 | 3/2009 | Fish et al. | |
| 7,508,361 B2 | 3/2009 | Uchino et al. | |
| 7,515,121 B2 | 4/2009 | Sato et al. | |
| 7,518,580 B2 | 4/2009 | Kwon | |
| 7,528,643 B2 | 5/2009 | Kimura | |
| 7,532,209 B2 | 5/2009 | Kimura | |
| 7,542,019 B2 | 6/2009 | Park et al. | |
| 7,554,362 B2 | 6/2009 | Kimura | |
| 7,561,129 B2 | 7/2009 | Lee et al. | |
| 7,626,199 B2 | 12/2009 | Kim | |
| 7,646,364 B2 | 1/2010 | Yamashita et al. | |
| 7,649,515 B2 | 1/2010 | Ozawa et al. | |
| 7,649,516 B2 | 1/2010 | Azami et al. | |
| 7,671,826 B2 | 3/2010 | Kimura | |
| 7,674,650 B2 | 3/2010 | Akimoto et al. | |
| 7,679,585 B2 | 3/2010 | Kimura | |
| 7,679,587 B2 | 3/2010 | Kwak | |
| 7,692,610 B2 | 4/2010 | Kimura | |
| 7,710,368 B2 | 5/2010 | Chung | |
| 7,714,813 B2 | 5/2010 | Uchino et al. | |
| 7,714,815 B2 | 5/2010 | Kim et al. | |
| 7,724,245 B2 | 5/2010 | Miyazawa | |
| 7,738,014 B2 | 6/2010 | Kwak et al. | |
| 7,755,617 B2 | 7/2010 | Miyazawa | |
| 7,800,565 B2 | 9/2010 | Nathan et al. | |
| 7,817,117 B2 | 10/2010 | Kimura | |
| 7,843,442 B2 | 11/2010 | Choi et al. | |
| 7,847,768 B2 | 12/2010 | Kim | |
| 7,859,488 B2 | 12/2010 | Kimura | |
| 7,872,259 B2 | 1/2011 | Den et al. | |
| 7,889,159 B2 | 2/2011 | Nathan et al. | |
| 7,903,079 B2 | 3/2011 | Azami et al. | |
| 7,924,244 B2 | 4/2011 | Kimura et al. | |
| 7,940,233 B2 | 5/2011 | Kim et al. | |
| 7,965,106 B2 | 6/2011 | Kimura | |
| 7,978,156 B2 | 7/2011 | Kim | |
| 7,982,696 B2 | 7/2011 | Kimura | |
| 7,986,287 B2 | 7/2011 | Umezaki et al. | |
| 7,995,010 B2 | 8/2011 | Yamazaki et al. | |
| 8,004,477 B2 | 8/2011 | Uchino et al. | |
| 8,040,163 B2 | 10/2011 | Jinta | |
| 8,049,743 B2 | 11/2011 | Kang | |
| 8,059,068 B2 | 11/2011 | Kimura | |
| 8,059,071 B2 | 11/2011 | Kim et al. | |
| 8,063,859 B2 | 11/2011 | Kimura | |
| 8,120,556 B2 | 2/2012 | Kim | |
| 8,149,185 B2 | 4/2012 | Uchino et al. | |
| 8,159,420 B2 | 4/2012 | Takahashi et al. | |

(56) References Cited

U.S. PATENT DOCUMENTS

| | | |
|---|---|---|
| 8,159,449 B2 | 4/2012 | Kimura et al. |
| 8,164,547 B2 | 4/2012 | Kimura |
| 8,242,986 B2 | 8/2012 | Kimura |
| 8,264,430 B2 | 9/2012 | Kimura |
| 8,299,821 B2 | 10/2012 | Chen et al. |
| 8,305,306 B2 | 11/2012 | Kimura |
| 8,325,111 B2 | 12/2012 | Kimura |
| 8,395,604 B2 | 3/2013 | Kimura |
| 8,426,866 B2 | 4/2013 | Kimura et al. |
| 8,710,505 B2 | 4/2014 | Kimura |
| 8,710,749 B2 | 4/2014 | Kimura |
| 8,842,058 B2 | 9/2014 | Kwak et al. |
| 8,941,314 B2 | 1/2015 | Kimura |
| 9,171,870 B2 | 10/2015 | Kimura |
| 2001/0043168 A1 | 11/2001 | Koyama et al. |
| 2002/0070913 A1 | 6/2002 | Kimura et al. |
| 2003/0090481 A1 | 5/2003 | Kimura |
| 2003/0095087 A1 | 5/2003 | Libsch et al. |
| 2003/0103022 A1 | 6/2003 | Noguchi et al. |
| 2003/0112208 A1 | 6/2003 | Okabe et al. |
| 2003/0117352 A1 | 6/2003 | Kimura |
| 2003/0132931 A1 | 7/2003 | Kimura et al. |
| 2003/0137503 A1 | 7/2003 | Kimura et al. |
| 2004/0070557 A1 | 4/2004 | Asano et al. |
| 2004/0080474 A1 | 4/2004 | Kimura |
| 2004/0095305 A1 | 5/2004 | Kimura et al. |
| 2004/0174349 A1 | 9/2004 | Libsch et al. |
| 2004/0174354 A1 | 9/2004 | Ono et al. |
| 2004/0207614 A1 | 10/2004 | Yamashita et al. |
| 2005/0057459 A1 | 3/2005 | Miyazawa |
| 2005/0083270 A1 | 4/2005 | Miyazawa |
| 2005/0151705 A1 | 7/2005 | Fish |
| 2005/0200618 A1 | 9/2005 | Kim et al. |
| 2005/0206593 A1 | 9/2005 | Kwon |
| 2005/0237273 A1 | 10/2005 | Ozawa et al. |
| 2005/0243032 A1 | 11/2005 | Lee |
| 2005/0243079 A1 | 11/2005 | Ozaki |
| 2005/0259051 A1 | 11/2005 | Lee et al. |
| 2005/0269959 A1 | 12/2005 | Uchino et al. |
| 2005/0285825 A1* | 12/2005 | Eom et al. ............... 345/76 |
| 2005/0285826 A1 | 12/2005 | Park et al. |
| 2006/0066532 A1 | 3/2006 | Jeong |
| 2006/0077194 A1* | 4/2006 | Jeong ................. 345/204 |
| 2006/0082528 A1 | 4/2006 | Guo et al. |
| 2006/0109225 A1 | 5/2006 | Haga et al. |
| 2006/0132055 A1* | 6/2006 | Kwak ................. 315/169.3 |
| 2006/0156121 A1 | 7/2006 | Chung |
| 2006/0170628 A1 | 8/2006 | Yamashita et al. |
| 2006/0176250 A1 | 8/2006 | Nathan et al. |
| 2006/0208977 A1 | 9/2006 | Kimura |
| 2006/0221005 A1 | 10/2006 | Omata et al. |
| 2006/0238461 A1 | 10/2006 | Goh et al. |
| 2006/0255837 A1 | 11/2006 | Shionoiri et al. |
| 2006/0256047 A1 | 11/2006 | Kimura et al. |
| 2006/0279499 A1 | 12/2006 | Park et al. |
| 2006/0290613 A1 | 12/2006 | Hong et al. |
| 2006/0290617 A1 | 12/2006 | Miyazawa |
| 2007/0002084 A1 | 1/2007 | Kimura et al. |
| 2007/0063993 A1 | 3/2007 | Shishido |
| 2007/0064469 A1 | 3/2007 | Umezaki |
| 2007/0085847 A1 | 4/2007 | Shishido |
| 2007/0103419 A1 | 5/2007 | Uchino et al. |
| 2007/0115225 A1 | 5/2007 | Uchino et al. |
| 2007/0120785 A1* | 5/2007 | Kimura ............ G09G 3/3233 345/82 |
| 2007/0120795 A1* | 5/2007 | Uchino ............ G09G 3/3233 345/92 |
| 2007/0120810 A1 | 5/2007 | You et al. |
| 2007/0126664 A1 | 6/2007 | Kimura |
| 2007/0126665 A1 | 6/2007 | Kimura |
| 2007/0126668 A1 | 6/2007 | Kimura |
| 2007/0132694 A1 | 6/2007 | Uchino et al. |
| 2007/0164962 A1 | 7/2007 | Uchino et al. |
| 2007/0200793 A1 | 8/2007 | Kwon |
| 2007/0236424 A1 | 10/2007 | Kimura |
| 2007/0247398 A1 | 10/2007 | Nathan et al. |
| 2007/0273618 A1 | 11/2007 | Hsieh et al. |
| 2007/0279403 A1 | 12/2007 | Uchino et al. |
| 2007/0290954 A1 | 12/2007 | Miyazawa |
| 2007/0290973 A1* | 12/2007 | Wei ................ 345/92 |
| 2008/0030435 A1* | 2/2008 | Kim ................ 345/76 |
| 2008/0225061 A1 | 9/2008 | Kimura et al. |
| 2008/0278425 A1 | 11/2008 | Koyama |
| 2008/0284312 A1 | 11/2008 | Kimura |
| 2008/0316152 A1 | 12/2008 | Kimura et al. |
| 2009/0009676 A1 | 1/2009 | Kimura et al. |
| 2009/0021539 A1 | 1/2009 | Kimura |
| 2009/0027312 A1* | 1/2009 | Han ............ G09G 3/3233 345/76 |
| 2009/0051674 A1 | 2/2009 | Kimura et al. |
| 2009/0096727 A1 | 4/2009 | Kimura |
| 2009/0134920 A1 | 5/2009 | Kimura |
| 2009/0140981 A1 | 6/2009 | Kwak et al. |
| 2009/0167404 A1 | 7/2009 | Kimura |
| 2009/0225010 A1 | 9/2009 | Kimura |
| 2010/0001983 A1 | 1/2010 | Abe |
| 2010/0079357 A1 | 4/2010 | Ozawa et al. |
| 2010/0149160 A1 | 6/2010 | Kimura |
| 2010/0156877 A1 | 6/2010 | Kimura |
| 2010/0171685 A1 | 7/2010 | Kimura |
| 2010/0220092 A1 | 9/2010 | Kimura |
| 2010/0220117 A1 | 9/2010 | Kimura |
| 2011/0024760 A1 | 2/2011 | Kimura |
| 2011/0115758 A1 | 5/2011 | Kimura et al. |
| 2011/0163320 A1 | 7/2011 | Kimura |
| 2011/0169008 A1 | 7/2011 | Kimura |
| 2011/0175862 A1 | 7/2011 | Umezaki et al. |
| 2011/0198599 A1 | 8/2011 | Kimura |
| 2011/0205144 A1 | 8/2011 | Kimura et al. |
| 2011/0205215 A1 | 8/2011 | Kimura |
| 2011/0210950 A1 | 9/2011 | Kimura |
| 2011/0248746 A1 | 10/2011 | Kimura |
| 2011/0260170 A1 | 10/2011 | Kimura |
| 2012/0248435 A1 | 10/2012 | Koyama |
| 2012/0287025 A1 | 11/2012 | Inoue et al. |
| 2012/0327142 A1 | 12/2012 | Kimura |
| 2013/0003269 A1 | 1/2013 | Kimura |
| 2013/0021316 A1 | 1/2013 | Inoue et al. |
| 2013/0043796 A1* | 2/2013 | Ko ............ G09G 3/3233 315/151 |
| 2013/0057174 A1 | 3/2013 | Kimura |
| 2013/0092930 A1 | 4/2013 | Kimura |
| 2013/0092963 A1 | 4/2013 | Kimura |
| 2013/0249875 A1 | 9/2013 | Tseng et al. |
| 2014/0079176 A1 | 3/2014 | Qian et al. |
| 2014/0232291 A1 | 8/2014 | Kimura |
| 2014/0312347 A1 | 10/2014 | Kimura |
| 2015/0048370 A1 | 2/2015 | Kimura |
| 2015/0129871 A1 | 5/2015 | Kimura |
| 2016/0013261 A1 | 1/2016 | Kimura |

FOREIGN PATENT DOCUMENTS

| | | |
|---|---|---|
| JP | 2003-167533 A | 6/2003 |
| JP | 2003-223138 A | 8/2003 |
| JP | 2005-189381 A | 7/2005 |
| JP | 2005-189387 A | 7/2005 |
| JP | 2005-189643 A | 7/2005 |
| JP | 2005-195756 A | 7/2005 |
| JP | 2005-227562 A | 8/2005 |
| JP | 2005-227625 A | 8/2005 |
| JP | 2005-316474 A | 11/2005 |
| JP | 2005-326754 A | 11/2005 |
| JP | 2006-023515 A | 1/2006 |
| JP | 2006-215275 A | 8/2006 |
| JP | 2008-191450 A | 8/2008 |
| JP | 2009-276796 A | 11/2009 |
| JP | 2011-170335 A | 9/2011 |

OTHER PUBLICATIONS

Goh, J and Kim, C, "P-72:A Novel Pixel Circuit for Active-Matrix Organic Light-Emitting Diodes," SID Digest '03 : SID International

(56) References Cited

OTHER PUBLICATIONS

Symposium Digest of Technical Papers, 2003, vol. 34, pp. 494-497.
Jung, J. H. et al., "A 14.1 inch Full color AMOLED Display With Top Emission Structure and a-SiTFT Backplane," SID Digest '05 : SID International Symposium Digest of Technical Papers, 2005, vol. 36, pp. 1538-1541.
Kamiya, T et al., "Carrier transport properties and electronic structures of amorphous oxide semiconductors: the present status," Solid State Physics, Sep. 2009, vol. 44, No. 9, pp. 621-633 with full English translation.
Goh, J and Kim, C, "P-72:A Novel Pixel Circuit for Active-Matrix Organic Light-Emitting Diodes," SID Digest '03 : SID International Symposium Digest of Technical Papers, vol. 34, pp. 494-497.
Jung, J. H. et al., "A 14.1 inch Full color AMOLED Display With Top Emission Structure and a-SiTFT Backplane," SID Digest '05 : SID International Symposium Digest of Technical Papers, vol. 36, pp. 1538-1541.
Kamiya, T et al., "Carrier transport properties and electronic structures of amorphous oxide semiconductors: the present status," Solid State Physics, vol. 44, No. 9, pp. 621-633 with full English translation.

\* cited by examiner

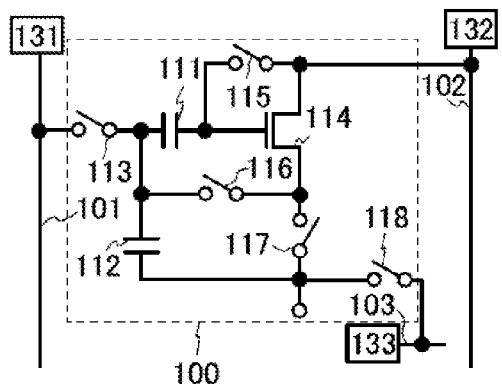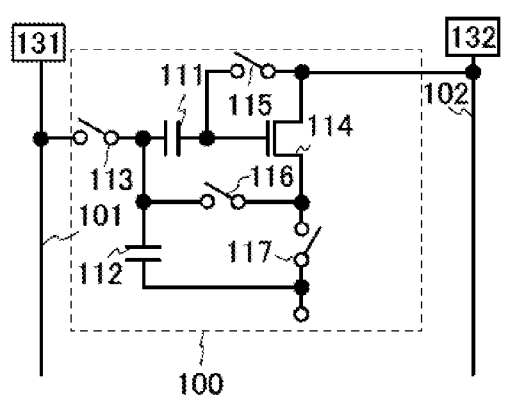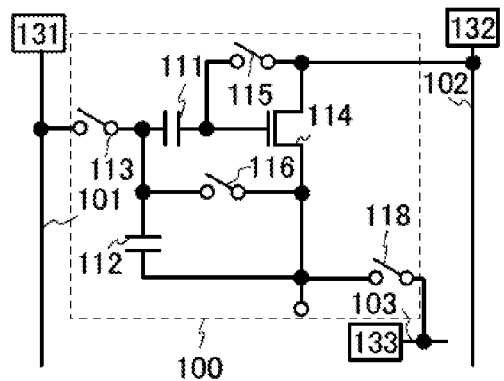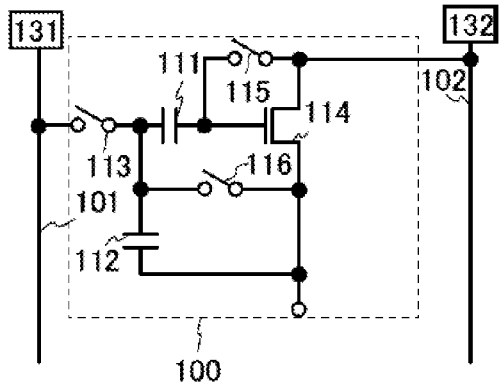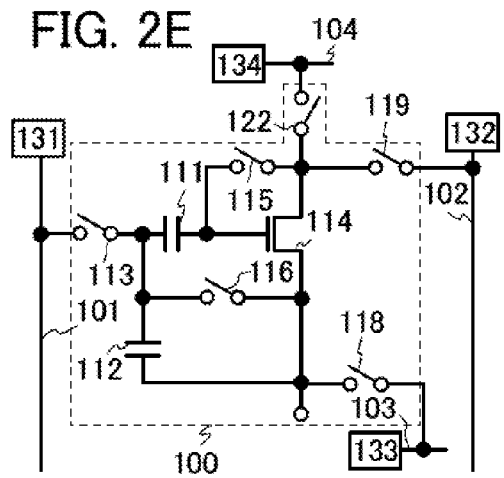

SEMICONDUCTOR DEVICE AND ELECTRONIC DEVICE

BACKGROUND OF THE INVENTION

1. Field of the Invention

One embodiment of the present invention relates to a semiconductor device, a display device, a light-emitting device, a driving method thereof, or a manufacturing method thereof. In particular, one embodiment of the present invention relates to a semiconductor device, a display device, or a light-emitting device which has a function of supplying current to a load. Alternatively, in particular, one embodiment of the present invention relates to a semiconductor device, a display device, or a light-emitting device which has small variations in characteristics among transistors. Alternatively, one embodiment of the present invention relates to an electronic device.

2. Description of the Related Art

In recent years, development of semiconductor devices formed using transistors has been advanced.

As an example of the semiconductor devices, there is a semiconductor device performing a desired operation by controlling the amount of current flowing between a source and a drain of the transistor (for example, see Patent Document 1).

REFERENCE

[Patent Document 1] Japanese Published Patent Application No. 2005-316474

SUMMARY OF THE INVENTION

An object of one embodiment of the present invention is one or more of prevention of operation defects, a reduction in an influence of variations in threshold voltage among transistors, a reduction in an influence of variations in mobility among transistors, and a reduction in an influence of degradation of a transistor.

It is an object of one embodiment of the present invention to provide a semiconductor device, a light-emitting device, or a display device that displays high-quality images. It is an object of one embodiment of the present invention to provide a semiconductor device, a light-emitting device, or a display device that displays images with little unevenness. It is an object of one embodiment of the present invention to provide a semiconductor device, a light-emitting device, or a display device in which a desired circuit can be formed with a small number of transistors. It is an object of one embodiment of the present invention to provide a semiconductor device, a light-emitting device, or a display device in which a desired circuit can be formed with a small number of wirings. It is an object of one embodiment of the present invention to provide a semiconductor device, a light-emitting device, or a display device that is less influenced by degradation of a light-emitting element. It is an object of one embodiment of the present invention to provide a semiconductor device, a light-emitting device, or a display device that is manufactured in a small number of steps.

Note that an object to be achieved by one embodiment of the present invention is not limited to the above objects. For example, at least part of contents of the specification, the drawings, and the scope of claims can also be related to one or more of objects other than the above. Note that in one embodiment of the present invention, there is no need to achieve all the objects.

In one embodiment of the present invention, potentials applied to a gate, a source, and a drain of a transistor are controlled in consideration of the threshold voltage of the transistor, so that the amount of current flowing between the source and the drain of the transistor in operation is controlled.

One embodiment of the present invention is a semiconductor device which includes a first wiring, a first capacitor, a second capacitor, a first switch having a function of controlling electrical connection between the first wiring and one of a pair of electrodes of the first capacitor and between the first wiring and one of a pair of electrodes of the second capacitor, a second wiring, a transistor one of a source and a drain of which is electrically connected to the second wiring and a gate of which is electrically connected to the other of the pair of electrodes of the first capacitor, a second switch having a function of controlling electrical connection between the gate of the transistor and the one of the source and the drain of the transistor, a third switch having a function of controlling electrical connection between the other of the source and the drain of the transistor and the one of the pair of electrodes of the first capacitor and between the other of the source and the drain of the transistor and the one of the pair of electrodes of the second capacitor, a fourth switch having a function of controlling electrical connection between the other of the pair of electrodes of the second capacitor and the other of the source and the drain of the transistor, a third wiring, and a fifth switch having a function of controlling electrical connection between the third wiring and the other of the pair of electrodes of the second capacitor.

One embodiment of the present invention is a semiconductor device which includes a first wiring, a first capacitor, a second capacitor, a first switch having a function of controlling electrical connection between the first wiring and one of a pair of electrodes of the first capacitor and between the first wiring and one of a pair of electrodes of the second capacitor, a second wiring, a transistor one of a source and a drain of which is electrically connected to the second wiring and a gate of which is electrically connected to the other of the pair of electrodes of the first capacitor, a second switch having a function of controlling electrical connection between the gate of the transistor and the one of the source and the drain of the transistor, a third switch having a function of controlling electrical connection between the other of the source and the drain of the transistor and the one of the pair of electrodes of the first capacitor and between the other of the source and the drain of the transistor and the one of the pair of electrodes of the second capacitor, and a fourth switch having a function of controlling electrical connection between the other of the pair of electrodes of the second capacitor and the other of the source and the drain of the transistor.

One embodiment of the present invention is a semiconductor device which includes a first wiring, a first capacitor, a second capacitor, a first switch having a function of controlling electrical connection between the first wiring and one of a pair of electrodes of the first capacitor and between the first wiring and one of a pair of electrodes of the second capacitor, a second wiring, a transistor one of a source and a drain of which is electrically connected to the second wiring and a gate of which is electrically connected to the other of the pair of electrodes of the first capacitor, a second switch having a function of controlling electrical connection between the gate of the transistor and the one of the source and the drain of the transistor, a third switch having a function of controlling electrical connection between the other of the source and the drain of the transistor and the one of the pair of electrodes of the first capacitor and between the other of the source and the drain of the transistor and the one of the pair of electrodes of the second capacitor, a third wiring, and a fourth switch having a function of controlling electrical connection between the third wiring and the other of the pair of electrodes of the second capacitor.

One embodiment of the present invention is a semiconductor device which includes a first wiring, a first capacitor, a second capacitor, a first switch having a function of controlling electrical connection between the first wiring and one of a pair of electrodes of the first capacitor and between the first wiring and one of a pair of electrodes of the second capacitor, a second wiring, a transistor one of a source and a drain of which is electrically connected to the second wiring and a gate of which is electrically connected to the other of the pair of electrodes of the first capacitor, a second switch having a function of controlling electrical connection between the gate of the transistor and the one of the source and the drain of the transistor, and a third switch having a function of controlling electrical connection between the other of the source and the drain of the transistor and the one of the pair of electrodes of the first capacitor and between the other of the source and the drain of the transistor and the one of the pair of electrodes of the second capacitor.

One embodiment of the present invention is a semiconductor device which includes a first wiring, a first capacitor, a second capacitor, a first switch having a function of controlling electrical connection between the first wiring and one of a pair of electrodes of the first capacitor and between the first wiring and one of a pair of electrodes of the second capacitor, a second wiring, a transistor a gate of which is electrically connected to the other of the pair of electrodes of the first capacitor, a second switch having a function of controlling electrical connection between the gate of the transistor and one of the source and the drain of the transistor, a third switch having a function of controlling electrical connection between the other of the source and the drain of the transistor and the one of the pair of electrodes of the first capacitor and between the other of the source and the drain of the transistor and the one of the pair of electrodes of the second capacitor, a third wiring, a fourth switch having a function of controlling electrical connection between the third wiring and the other of the pair of electrodes of the second capacitor, a fourth wiring, a fifth switch having a function of controlling electrical connection between the fourth wiring and the one of the source and the drain of the transistor, and a sixth switch having a function of controlling electrical connection between the second wiring and the one of the source and the drain of the transistor.

According to one embodiment of the present invention, one or more of the following effects can be obtained: prevention of operation defects, a reduction in an influence of variations in threshold voltage among transistors, a reduction in an influence of variations in mobility among transistors, and a reduction in an influence of degradation of a transistor.

According to one embodiment of the present invention, a semiconductor device, a light-emitting device, or a display device that displays high-quality images can be provided. According to one embodiment of the present invention, a semiconductor device, a light-emitting device, or a display device that displays images with little unevenness can be provided. According to one embodiment of the present invention, a semiconductor device, a light-emitting device, or a display device in which a desired circuit can be formed with a small number of transistors can be provided. According to one embodiment of the present invention, a semiconductor device, a light-emitting device, or a display device in which a desired circuit can be formed with a small number of wirings can be provided. According to one embodiment of the present invention, a semiconductor device, a light-emitting device, or a display device that is less influenced by degradation of a light-emitting element can be provided. According to one embodiment of the present invention, a semiconductor device, a light-emitting device, or a display device that is manufactured in a small number of steps can be provided.

BRIEF DESCRIPTION OF THE DRAWINGS

FIGS. 2A to 2E illustrate examples of a semiconductor device.

DETAILED DESCRIPTION OF THE INVENTION

Figure 1A:
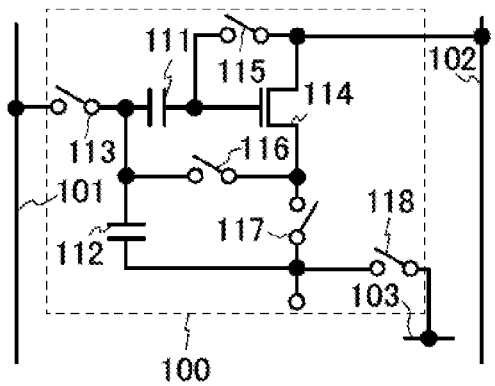
FIGS. 1A to 1E illustrate examples of a semiconductor device.

Example of embodiments of the present invention will be described below. Note that it will be readily appreciated by those skilled in the art that details of the embodiments can be modified in various ways without departing from the spirit and scope of the invention. The present invention is therefore not limited to the following description of the embodiments. Note that in structures of the invention described below, the same portions or portions having similar functions are denoted by the same reference numerals, and description thereof is not repeated.

Each embodiment is obtained by performing change, addition, modification, removal, application, superordinate conceptualization, or subordinate conceptualization on part or all of another embodiment. Thus, part or the whole of each embodiment can be freely applied to, combined with, or replaced with part or all of another embodiment.

The ordinal numbers such as "first" and "second" are used to avoid confusion between components and do not limit the number of the components.

Note that various people can implement examples of embodiments of the present invention, and for example, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a TFT and a light-emitting element, the following case is possible: Company A manufactures and sells semiconductor devices including TFTs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. For example, in the case of a transmission/reception system, one embodiment of the invention can be constituted by only a transmitting device and one embodiment of the invention can be constituted by only a receiving device. As another example, in the case of a light-emitting device including a TFT and a light-emitting element, one embodiment of the invention can be constituted by only a semiconductor device including a TFT, and one embodiment of the invention can be constituted by a light-emitting device including a TFT and a light-emitting element. That is, one embodiment of the invention with which a patent infringement suit can be filed against Company A or Company B is clear and can be regarded as being disclosed in this specification or the like.

Note that a connection includes an electrical connection, a functional connection, and a direct connection. A connection relation of components shown in the embodiment is not limited to the connection relation illustrated in the drawings and the specification.

For example, in the case where two objects are electrically connected, an element which enables electrical connection between the two objects (e.g., a switch, a transistor, an inductor, a resistor, a diode, a display element, a light-emitting element, and a load) may be connected between the two objects.

Alternatively, in the case where the two objects are functionally connected, another circuit which enable functional connection (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up dc-dc converter or a step-down dc-dc converter) or a level shifter circuit; a voltage source; a current source; a switching circuit; an amplifier circuit such as an operational amplifier, a differential amplifier circuit, a source follower circuit, and a buffer circuit; a signal generating circuit; a memory circuit; and/or a control circuit) may be provided between the two objects.

Note that a switch controls turned on or off. That is, the switch has a function of determining whether current flows or not by being turning on or off (becoming an on state and an off state). Alternatively, the switch has a function of selecting and changing a current path. For example, the switch has a function of determining whether current flows through a current path 1 or a current path 2 and switching the paths.

Embodiment 1

In this embodiment, an example of a semiconductor device will be described. As one example, an example of a semiconductor device having a function of a current source will be described.

Note that, a semiconductor device means a device which can function by utilizing semiconductor characteristics; a light-emitting device, a display device, a semiconductor circuit, and an electronic device may be included in examples of the semiconductor device or examples of the unit formed using a semiconductor device.

A current source has a function of supplying current. An ideal current supplied from the current source can be regarded as a constant current, which does not depend on a value of voltage applied to both ends of the current source.

Note that there is a voltage source as a power source other than the current source. The voltage source has a function of supplying a constant voltage even when current flowing through a circuit connected to the voltage source is changed. Accordingly, the voltage source and the current source have a function of supplying voltage and current; however, the function of the voltage source and the function of the current source are different from each other at least in part. For example, the current source has a function of supplying a constant current event when voltage between both ends is changed. The voltage source has a function of supplying a constant voltage even when current is changed.

An example of the semiconductor device in this embodiment will be described with reference to FIGS. 1A to 1E, FIGS. 2A to 2E, FIGS. 3A to 3E, FIGS. 4A to 4E, FIGS. 5A to 5F, FIGS. 6A to 6C, FIGS. 7A to 7E, FIGS. 8A to 8D, FIGS. 9A to 9D, FIGS. 10A to 10D, FIGS. 11A to 11D, and FIGS. 12A to 12D.

A semiconductor device illustrated in FIG. 1A includes a wiring 101, a wiring 102, a wiring 103, a capacitor 111, a capacitor 112, a switch 113, a transistor 114, a switch 115, a switch 116, a switch 117, and a switch 118. Note that the structure of the semiconductor device illustrated in FIG. 1A can be regarded as a structure including a unit circuit 100, the wiring 101, the wiring 102, and the wiring 103. In this case, the unit circuit 100 includes elements other than the wirings (for example, in FIG. 1A, the capacitor 111, the capacitor 112, the switch 113, the transistor 114, the switch 115, the switch 116, the switch 117, and the switch 118). Without limitation to this, the unit circuit 100 can also be regarded as including the wirings 101 to 103. Note that it is possible that one or more of the capacitor 111, the capacitor 112, the switch 113, the transistor 114, the switch 115, the switch 116, the switch 117, the switch 118, the wiring 101, the wiring 102, and the wiring 103 are not provided.

The wiring 101 has a function of inputting, supplying, or transmitting a data signal, a source signal, or a video signal, for example.

The wiring 101 functions as a data signal line, a source signal line, or a video signal line, for example. As an example, the data signal, the source signal, and the video signal are analog signals. Note that in one embodiment of the present invention, without being limited thereto, each of the data signal, the source signal, and the video signal may be a constant potential or a digital signal.

For example, the wiring 101 may be connected to a circuit 131 as illustrated in FIG. 2A. The circuit 131 is formed using, for example, a driver circuit, a source driver, or the like. Note that the circuit 131 is not necessarily provided.

In this embodiment, initialization or precharge of the semiconductor device may be performed by controlling the potential of the wiring 101.

In this embodiment, a bias inverted from a bias applied to the wiring 101 in a certain period may be applied to the wiring 101 in a period different from the certain period.

The wiring 102 has a function of applying, supplying, or transmitting a power supply potential, for example. Further, the wiring 102 has a function of supplying current to a transistor. Furthermore, the wiring 102 has a function of supplying current to a load.

The wiring 103 functions as, for example, a wiring (a potential supplying line) to which a potential is applied.

For example, the wiring 102 may be connected to a circuit 132 as illustrated in FIG. 2A. The circuit 132 is formed using, for example, a driver circuit, a source driver, a power supply circuit, or the like. Note that the circuit 132 is not necessarily provided.

In this embodiment, a pulse signal may be supplied to the wiring 102.

For example, the wiring 103 may be connected to a circuit 133 as illustrated in FIG. 2A. The circuit 133 is formed using, for example, a driver circuit, a source driver, a power supply circuit, or the like. Note that the circuit 133 is not necessarily provided.

In this embodiment, initialization or precharge of the semiconductor device may be performed by controlling the potential of the wiring 103.

In this embodiment, a bias inverted from a bias applied to the wiring 103 in a certain period may be applied to the wiring 103 in a period different from the certain period.

In this embodiment, a pulse signal may be supplied to the wiring 103.

The switch 113 has a function of controlling electrical connection between the wiring 101 and one of a pair of electrodes of the capacitor 111 and between the wiring 101 and one of a pair of electrodes of the capacitor 112.

One of a source and a drain of the transistor 114 is connected to the wiring 102. A gate of the transistor 114 is connected to the other of the pair of electrodes of the capacitor 111. By the potentials applied to the gate, the source, and the drain of the transistor 114, the amount of current flowing between the source and the drain of the transistor 114 is controlled. The transistor 114 may have a function as a current source.

The switch 115 has a function of controlling electrical connection between the one of the source and the drain of the transistor 114 and the gate of the transistor 114.

The switch 116 has a function of controlling electrical connection between the other of the source and the drain of the transistor 114 and the one of the pair of electrodes of the capacitor 111 and between the other of the source and the drain of the transistor 114 and the one of the pair of electrodes of the capacitor 112.

The switch 117 has a function of controlling electrical connection between the other of the source and the drain of the transistor 114 and the other of the pair of electrodes of the capacitor 112.

The switch 118 has a function of controlling electrical connection between the wiring 103 and the other of the pair of electrodes of the capacitor 112.

Note that the structure of the semiconductor device in this embodiment is not limited to that in FIG. 1A.

Figure 1B:
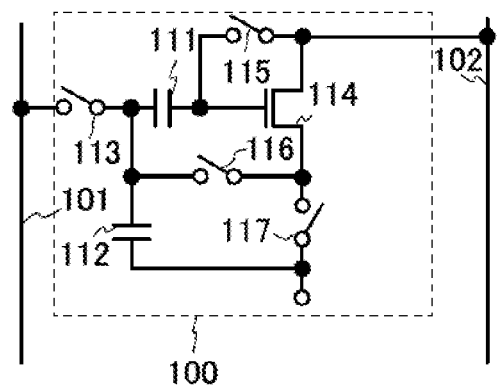

Unlike the semiconductor device illustrated in FIG. 1A, a semiconductor device illustrated in FIG. 1B does not have the wiring 103 and the switch 118. Unlike a semiconductor device illustrated in FIG. 2A, a semiconductor device illustrated in FIG. 2B does not have the wiring 103, the switch 118, and the circuit 133.

Figure 1C:
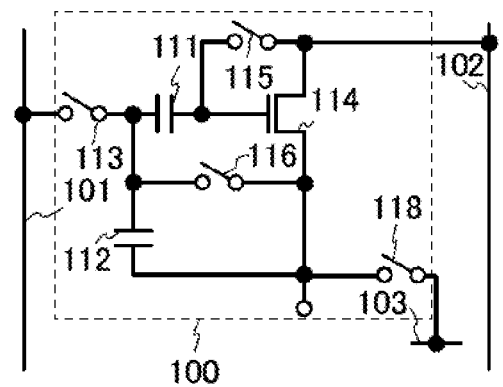

Unlike the semiconductor device illustrated in FIG. 1A, a semiconductor device illustrated in FIG. 1C does not have the switch 117. Unlike the semiconductor device illustrated in FIG. 2A, a semiconductor device illustrated in FIG. 2C does not have the switch 117.

Figure 1D:
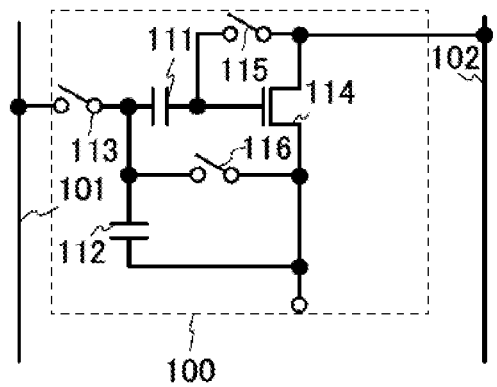

Unlike the semiconductor device illustrated in FIG. 1A, a semiconductor device illustrated in FIG. 1D does not have the switch 117, the wiring 103, and the switch 118. Unlike the semiconductor device illustrated in FIG. 2A, a semiconductor device illustrated in FIG. 2D does not have the switch 117, the wiring 103, the switch 118, and the circuit 133.

Figure 1E:
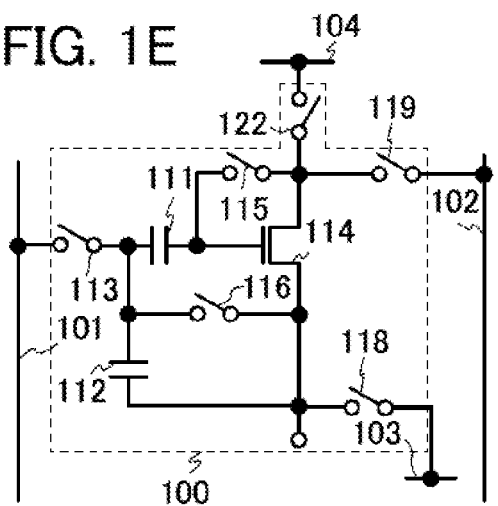

Unlike the semiconductor device illustrated in FIG. 1A, a semiconductor device illustrated in FIG. 1E has a wiring 104, a switch 119, and a switch 122, and does not have the switch 117. Unlike the semiconductor device illustrated in FIG. 2A, a semiconductor device illustrated in FIG. 2E has the wiring 104, a switch 119, a switch 122, and a circuit 134, and does not have the switch 117. In each of the semiconductor devices illustrated in FIG. 1E and FIG. 2E, the switch 122 has a function of controlling electrical connection between the wiring 104 and the one of the source and the drain of the transistor 114.

For example, the wiring 104 may be connected to a circuit 134 as illustrated in FIG. 2E. The circuit 134 is formed using, for example, a driver circuit, a source driver, a power supply circuit, or the like. Note that the circuit 134 is not necessarily provided.

In this embodiment, initialization or precharge of the semiconductor device may be performed by controlling the potential of the wiring 104.

In this embodiment, a bias inverted from a bias applied to the wiring 104 in a certain period may be applied to the wiring 104 in a period different from the certain period.

In this embodiment, a pulse signal may be supplied to the wiring 104.

The switches such as the switch 113, the switch 115, the switch 116, the switch 117, the switch 118, the switch 119, and the switch 122 can be, for example, electrical switches, mechanical switches, or the like. For example, the switches such as the switch 113, the switch 115, the switch 116, the switch 117, the switch 118, the switch 119, and the switch 122 each can be a transistor, a diode, a micro electro mechanical system (MEMS), a digital micromirror device (DMD), or the like. In the case of employing a transistor as the switch, there is no particular limitation on the conductivity type of the transistor.

The switches such as the switch 113, the switch 115, the switch 116, the switch 117, the switch 118, the switch 119, and the switch 122 each can be a logic circuit formed by combining a plurality of transistors. For example, the logic circuit may be a complementary logic circuit (a logic circuit including an n-channel transistor and a p-channel transistor).

An example of a semiconductor device in which transistors are employed as the switch 113, the switch 115, the switch 116, the switch 117, the switch 118, the switch 119, and the switch 122 is described with reference to FIGS. 3A to 3E.

Figure 3A:
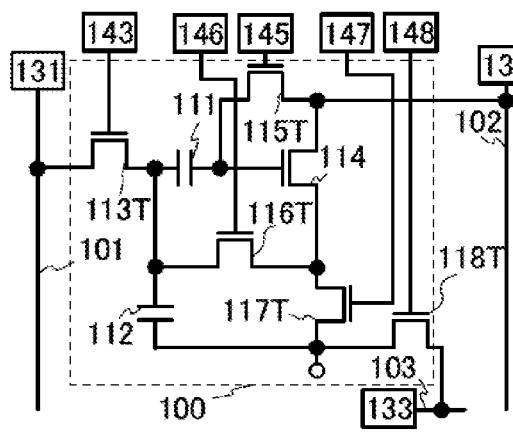
FIGS. 3A to 3E illustrate examples of a semiconductor device.

The semiconductor device illustrated in FIG. 3A is one example of forming the semiconductor device illustrated in FIG. 2A using transistors instead of the switches.

In the semiconductor device illustrated in FIG. 3A, one of a source and a drain of a transistor 113T is connected to the wiring 101. A gate of the transistor 113T may be connected to a circuit 143, for example.

In the semiconductor device illustrated in FIG. 3A, the one of the pair of electrodes of the capacitor 111 and the one of the pair of electrodes of the capacitor 112 are connected to the other of the source and the drain of the transistor 113T.

In the semiconductor device illustrated in FIG. 3A, one of a source and a drain of a transistor 115T is connected to the wiring 102. The other of the source and the drain of the transistor 115T is connected to the gate of the transistor 114. A gate of the transistor 115T may be connected to a circuit 145, for example.

In the semiconductor device illustrated in FIG. 3A, one of a source and a drain of a transistor 116T is connected to the one of the pair of electrodes of the capacitor 111 and the one of the pair of electrodes of the capacitor 112. The other of the source and the drain of the transistor 116T is connected to the other of the source and the drain of the transistor 114. A gate of the transistor 116T may be connected to a circuit 146, for example.

In the semiconductor device illustrated in FIG. 3A, one of a source and a drain of a transistor 117T is connected to the other of the source and the drain of the transistor 114. The other of the source and the drain of the transistor 117T is connected to the other of the pair of electrodes of the capacitor 112. A gate of the transistor 117T may be connected to a circuit 147, for example.

In the semiconductor device illustrated in FIG. 3A, one of a source and a drain of a transistor 118T is connected to the wiring 103. The other of the source and the drain of the transistor 118T is connected to the other of the pair of electrodes of the capacitor 112. A gate of the transistor 118T may be connected to a circuit 148, for example.

Figure 3B:
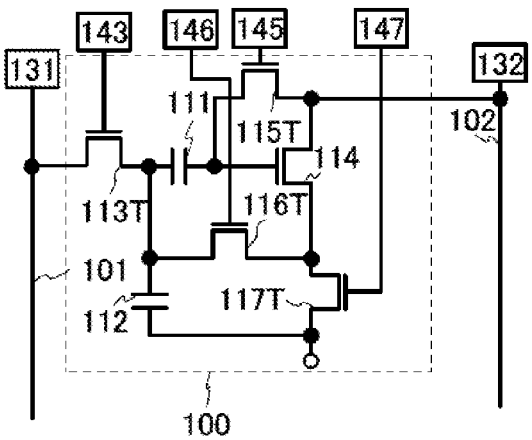

Unlike the semiconductor device illustrated in FIG. 3A, a semiconductor device illustrated in FIG. 3B does not have the wiring 103, the transistor 118T, the circuit 133, and the circuit 148.

Figure 3C:
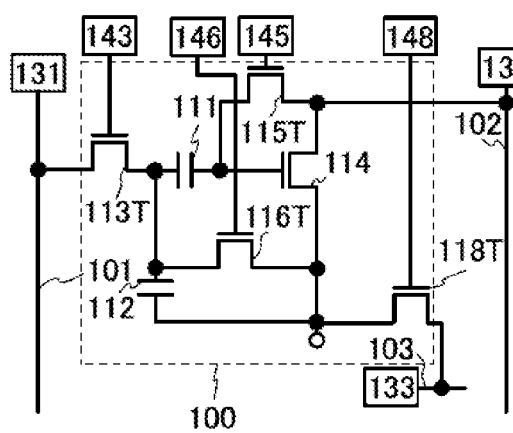

Unlike the semiconductor device illustrated in FIG. 3A, a semiconductor device illustrated in FIG. 3C does not have the transistor 117T and the circuit 147. In the semiconductor device illustrated in FIG. 3C, the other of the source and the drain of the transistor 118T is connected to the other of the source and the drain of the transistor 114.

Figure 3D:
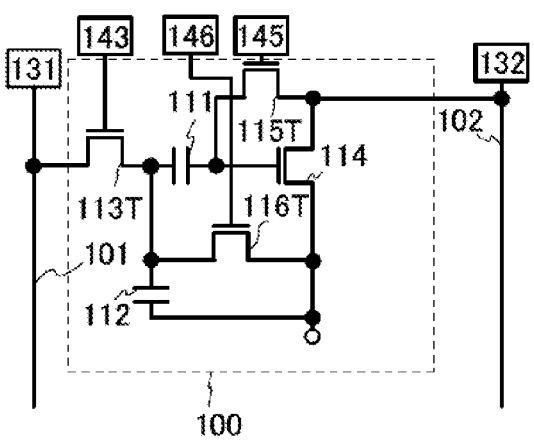

Unlike the semiconductor device illustrated in FIG. 3B, a semiconductor device illustrated in FIG. 3D does not have the transistor 117T and the circuit 147. In the semiconductor device illustrated in FIG. 3D, the other of the source and the drain of the transistor 114 is connected to the other of the pair of electrodes of the capacitor 112.

Figure 3E:
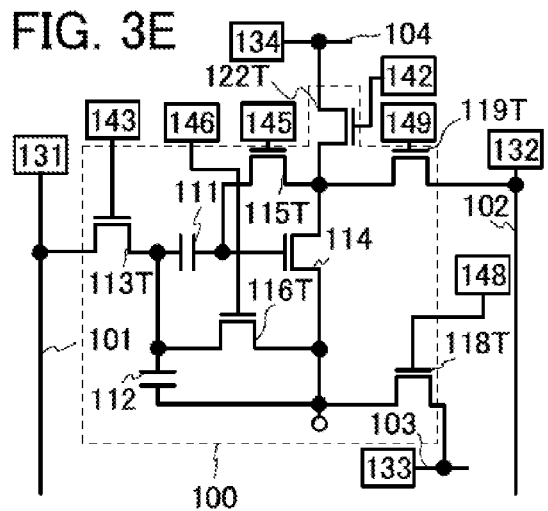

Unlike the semiconductor device illustrated in FIG. 3A, a semiconductor device illustrated in FIG. 3E has a transistor 119T, a transistor 122T, the circuit 134, a circuit 142, and a circuit 149, and does not have the switch 117. In the semiconductor device illustrated in FIG. 3E, one of a source and a drain of the transistor 122T is connected to the wiring 104. The other of the source and the drain of the transistor 122T is connected to the one of the source and the drain of the transistor 114. A gate of the transistor 122T may be connected to the circuit 142, for example. One of a source and a drain of the transistor 119T is connected to the wiring 102. The other of the source and the drain of the transistor 119T is connected to the one of the source and the drain of the transistor 114. A gate of the transistor 119T may be connected to a circuit 149, for example.

In the semiconductor devices illustrated in FIGS. 3A to 3E, a signal may be input to each gate of the transistor 113T, the transistor 115T, the transistor 116T, the transistor 117T, the transistor 118T, the transistor 119T, and the transistor 122T. Note that in the case of turning on or off a plurality of switches concurrently, the same signal may be input to each gate of the transistors which function as the plurality of switches. In the semiconductor devices illustrated in FIGS. 3A to 3E, some of or all of the transistor 113T, the transistor 115T, the transistor 116T, the transistor 117T, the transistor 118T, the transistor 119T, and the transistor 122T may share the wiring if the transistors perform the same operation concurrently. The functions of the transistor 113T, the transistor 115T, the transistor 116T, the transistor 117T, the transistor 118T, the transistor 119T, and the transistor 122T are not limited to switches.

For example, the circuits 142, 143, 145, 146, 147, 148 and 149 are formed using, for example, a driver circuit, a source driver, a power supply circuit, or the like. Note that the circuits 142, 143, 145, 146, 147, 148 and 149 are not necessarily provided.

An example of a semiconductor device including a load will be described with reference to FIGS. 4A to 4E and FIGS. 5A to 5F.

Figure 4A:
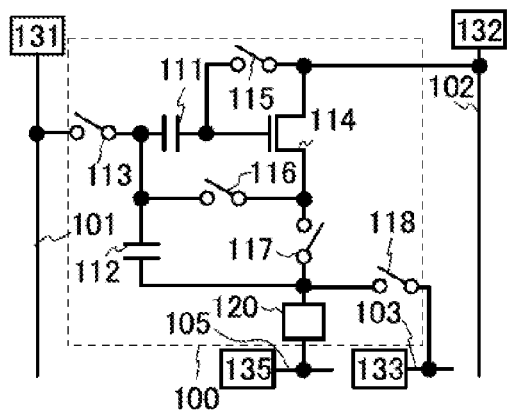
FIGS. 4A to 4E illustrate examples of a semiconductor device.

Unlike the semiconductor device illustrated in FIG. 2A, a semiconductor device illustrated in FIG. 4A has a wiring 105 and a load 120. Note that the unit circuit 100 may include the load 120.

The wiring 105 functions as a potential supplying line, for example. Note that a potential applied to the wiring 105 may be substantially equal to a potential applied to the wiring 103. In this case, the wiring 105 and the wiring 103 may be connected to function as one wiring.

The wiring 105 may be connected to a circuit 135. The circuit 135 is formed using, for example, a driver circuit, a source driver, a power supply circuit, or the like. Note that the circuit 135 is not necessarily provided.

In this embodiment, initialization or precharge of the semiconductor device may be performed by controlling the potential of the wiring 105.

In this embodiment, a bias inverted from a bias applied to the wiring 105 in a certain period may be applied to the wiring 105 in a period different from the certain period.

In this embodiment, a pulse signal may be supplied to the wiring 105.

In this embodiment, the wiring 105 may function as a negative electrode or a counter electrode.

The load 120 includes at least two terminals. One of the two terminals of the load 120 is connected to the other of the pair of electrodes of the capacitor 112. The other of the two terminals of the load 120 is connected to the wiring 105.

The load 120 can be, for example, an active element, a passive element, a circuit using one or both of the active element and the passive element, or the like. For example, the load 120 can be a display element, a light-emitting element, or the like. For example, the load 120 can be a liquid crystal element, an electroluminescent element (also referred to as an EL element), or the like. For example, the load 120 may be part of a liquid crystal element or part of an EL element. In this embodiment, the load 120 may be a pixel circuit.

Further, a display element, a display device which is a device having a display element, a light-emitting element, and a light-emitting device which is a device having a light-emitting element can use various types and can include various elements. Examples of a display element, a display device, a light-emitting element, and a light-emitting device can be a display medium in which contrast, luminance, reflectivity, transmittivity, or the like changes by an electromagnetic action, such as an EL element (e.g., an EL element including both organic and inorganic materials, an organic EL element, or an inorganic EL element), an LED (e.g., a white LED, a red LED, a green LED, or a blue LED), a transistor (e.g., a transistor emitting light in accordance with current), an electron emitter, a liquid crystal element, electronic ink, an electrophoresis element, a grating light valve (also referred to as GLV), a plasma display panel (also referred to as PDP), a digital micromirror device (also referred to as DMD), a piezoelectric ceramic display, or a carbon nanotube can be employed. Note that examples of display devices having EL elements include an EL display and the like. Examples of display devices having electron emitters include a field emission display (also referred to as FED), a surface-conduction electron-emitter display (SED), and the like. Examples of display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Examples of display devices having electronic ink or electrophoretic elements include electronic paper.

Figure 4B:
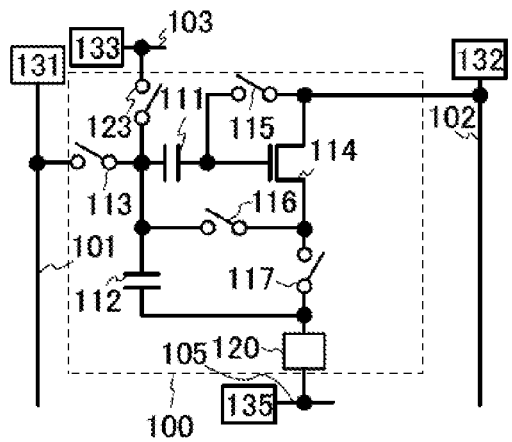

Further, unlike the semiconductor device illustrated in FIG. 4A, a semiconductor device illustrated in FIG. 4B has a switch 123 and does not have the switch 118. In the semiconductor device illustrated in FIG. 4B, the switch 123 has a function of controlling electrical connection between the wiring 103 and the one of the pair of electrodes of the capacitor 112.

Figure 4C:
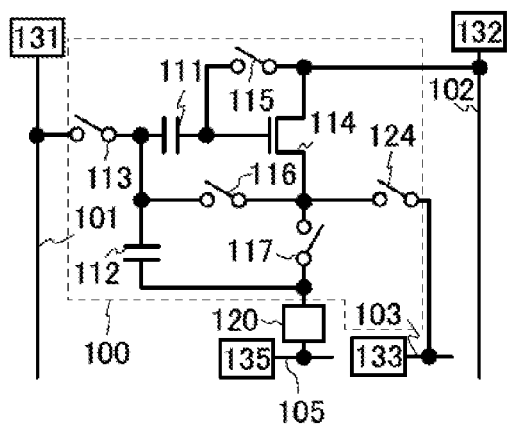

Unlike the semiconductor device illustrated in FIG. 4A, a semiconductor device illustrated in FIG. 4C has a switch 124 and does not have the switch 118. In the semiconductor device illustrated in FIG. 4C, the switch 124 has a function of controlling electrical connection between the wiring 103 and the other of the source and the drain of the transistor 114.

Figure 4D:
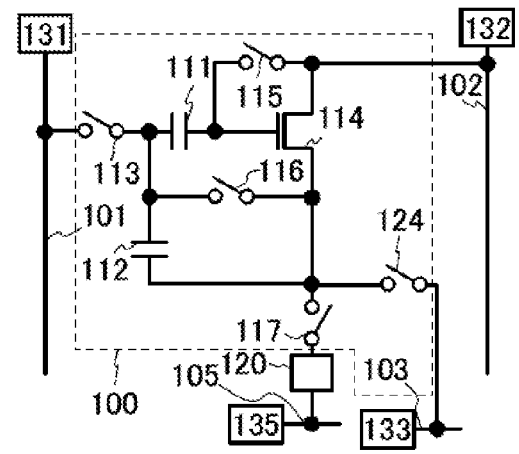

A semiconductor device illustrated in FIG. 4D has a structure in which the function of the switch 117 is different from that in the semiconductor device illustrated in FIG. 4C. In the semiconductor device illustrated in FIG. 4D, the switch 117 has a function of controlling electrical connection between one of the two terminals of the load 120 and the other of the pair of electrodes of the capacitor 112.

Figure 4E:
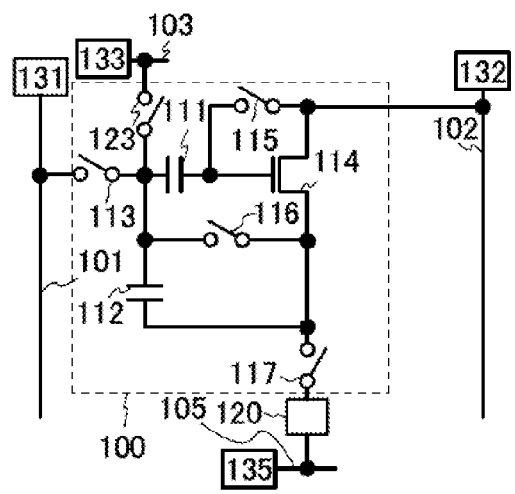

A semiconductor device illustrated in FIG. 4E has a structure in which the function of the switch 117 is different from that in the semiconductor device illustrated in FIG. 4B. In the semiconductor device illustrated in FIG. 4E, the switch 117 has a function of controlling electrical connection between one of the two terminals of the load 120 and the other of the pair of electrodes of the capacitor 112.

Figure 5A:
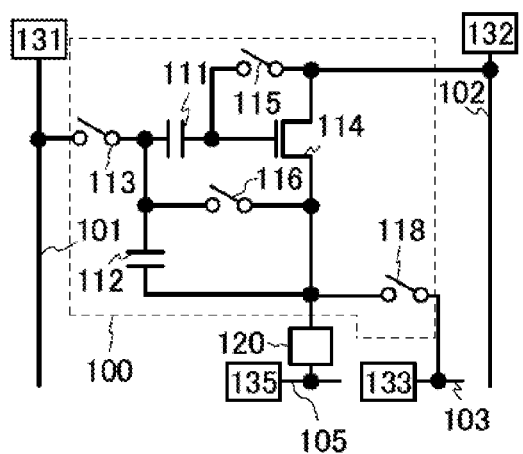
FIGS. 5A to 5F illustrate examples of a semiconductor device.

Unlike the semiconductor device illustrated in FIG. 4A, a semiconductor device illustrated in FIG. 5A does not have the switch 117. In the semiconductor device illustrated in FIG. 5A, the switch 118 has a function of controlling electrical connection between the wiring 103 and the other of the pair of electrodes of the capacitor 112 and between the wiring 103 and the other of the source and the drain of the transistor 114.

Figure 5B:
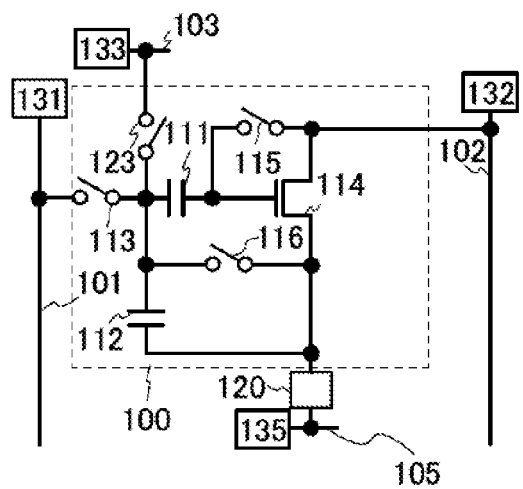

Unlike the semiconductor device illustrated in FIG. 4B, a semiconductor device illustrated in FIG. 5B does not have the switch 117. In the semiconductor device illustrated in FIG. 5B, the switch 123 has a function of controlling electrical connection between the wiring 103 and the one of the pair of electrodes of the capacitor 111 and between the wiring 103 and the one of the pair of electrodes of the capacitor 112.

Figure 5C:
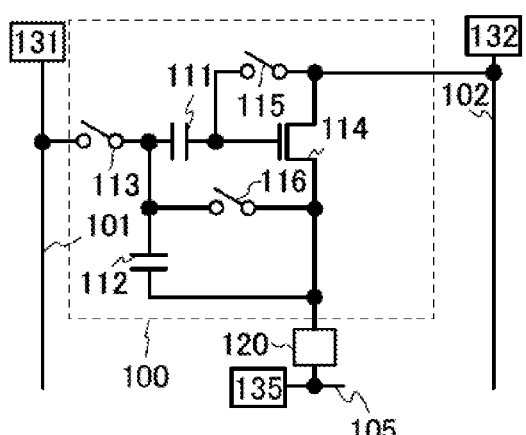

Unlike the semiconductor device illustrated in FIG. 5A, a semiconductor device illustrated in FIG. 5C does not have the wiring 103, the switch 118, and the circuit 133.

Figure 5D:
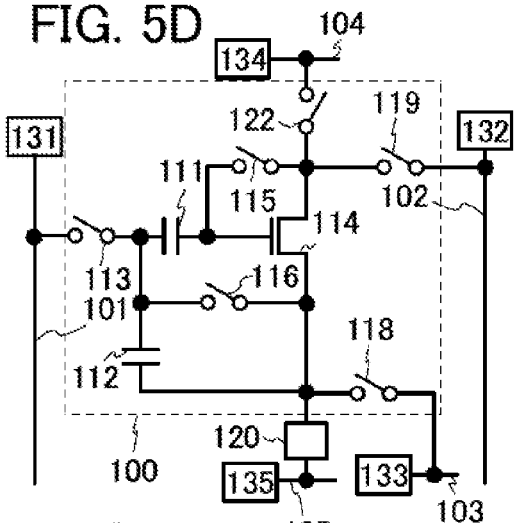

Unlike the semiconductor device illustrated in FIG. 4A, a semiconductor device illustrated in FIG. 5D has the wiring 104, the switch 122 and the circuit 134, and does not have the switch 117. In the semiconductor device illustrated in FIG. 5D, the switch 122 has a function of controlling electrical connection between the wiring 104 and the one of the source and the drain of the transistor 114.

Figure 5E:
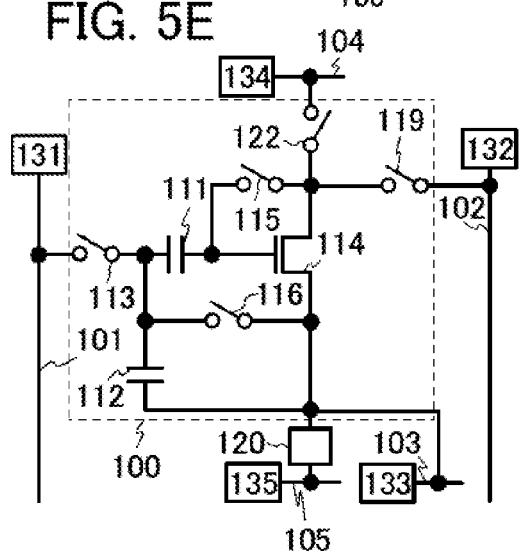

Unlike the semiconductor device illustrated in FIG. 5D, a semiconductor device illustrated in FIG. 5E does not have the switch 118. In the semiconductor device illustrated in FIG. 5E, the other of the pair of electrodes of the capacitor 112 and the other of the source and the drain of the transistor 114 are connected to the wiring 103.

Figure 5F:
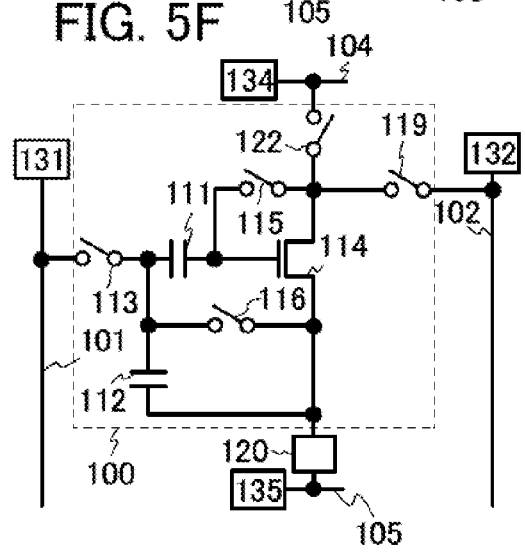

Unlike the semiconductor device illustrated in FIG. 5D, a semiconductor device illustrated in FIG. 5F does not have the wiring 103, the switch 118 and the circuit 133.

Further, an example of a semiconductor device having a small number of wirings will be described with reference to FIGS. 6A to 6C.

Figure 6A:
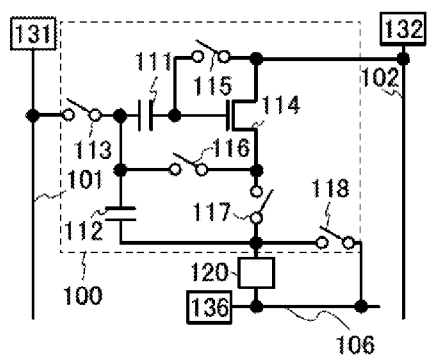
FIGS. 6A to 6C illustrate examples of a semiconductor device.

Unlike the semiconductor device illustrated in FIG. 4A, the semiconductor device illustrated in FIG. 6A has a wiring 106 and the circuit 136 and does not have the wiring 103, the wiring 105, the circuit 133, and the circuit 135.

Figure 6B:
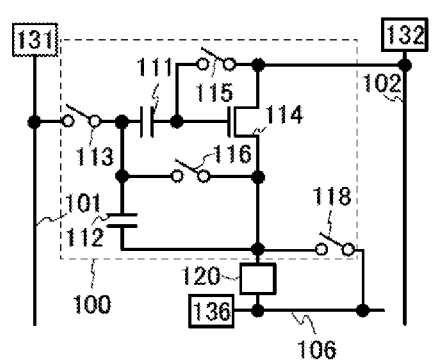

Unlike the semiconductor device illustrated in FIG. 5A, the semiconductor device illustrated in FIG. 6B has the wiring 106 and the circuit 136 and does not have the wiring 103, the wiring 105, the circuit 133, and the circuit 135.

Figure 6C:
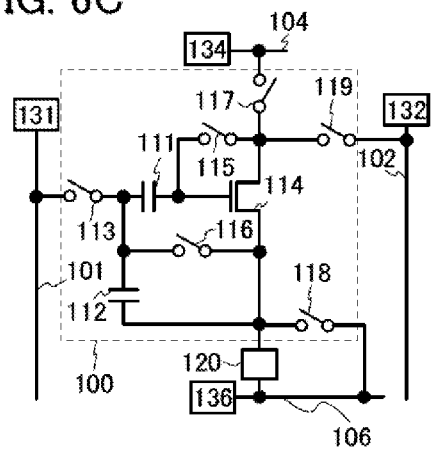

Unlike the semiconductor device illustrated in FIG. 5D, the semiconductor device illustrated in FIG. 6C has the wiring 106 and the circuit 136 and does not have the wiring 103, the wiring 105, the circuit 133, and the circuit 135.

The wiring 106 functions as a potential supplying line. In the semiconductor device illustrated in FIGS. 6A to 6C, the switch 118 has a function of controlling electrical connection between the wiring 106 and the other of the pair of electrodes of the capacitor 112. The other of the two terminals of the load 120 is connected to the wiring 106.

The wiring 106 may be connected to a circuit 136. The circuit 136 is formed using, for example, a driver circuit, a source driver, a power supply circuit, or the like. Note that the circuit 136 is not necessarily provided.

In this embodiment, initialization or precharge of the semiconductor device may be performed by controlling the potential of the wiring 106.

In this embodiment, a bias inverted from a bias applied to the wiring 106 in a certain period may be applied to the wiring 106 in a period different from the certain period.

In this embodiment, a pulse signal may be supplied to the wiring 106.

In this embodiment, the wiring 106 may function as a negative electrode or a counter electrode.

Note that the structure of this embodiment is not limited to the structure of the semiconductor devices illustrated in FIG. 4A, FIG. 5A, and FIG. 5D, and for example, the wiring 106 may be provided in the semiconductor devices illustrated in FIG. 4C, FIG. 4D, and FIG. 5E instead of the wiring 103 and the wiring 105.

An example of a semiconductor device which has a capacitor connected to one of the two terminal of the load 120 will be described with reference to FIGS. 7A to 7E.

For example, a capacitor may be additionally provided for each of the semiconductor devices in FIGS. 1A to 1E, FIGS. 2A to 2E, FIGS. 3A to 3E, FIGS. 4A to 4E, FIGS. 5A to 5F, and FIGS. 6A to 6C. As an example, unlike the semiconductor device illustrated in FIG. 4A, a semiconductor device illustrated in FIG. 7A has the capacitor 141. In the semiconductor device illustrated in FIG. 7A, one of a pair of electrodes of the capacitor 141 is connected to the other of the pair of electrodes of the capacitor 112.

Figure 7A:
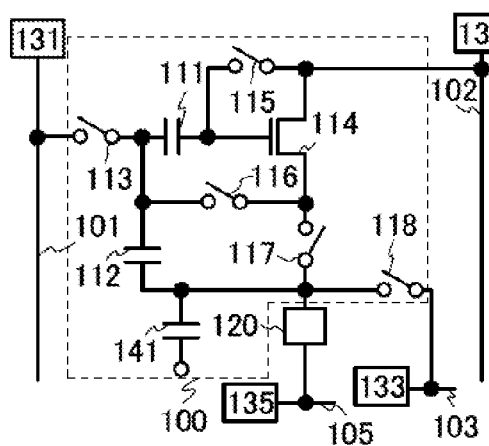
FIGS. 7A to 7E illustrate examples of a semiconductor device.
Figure 7B:
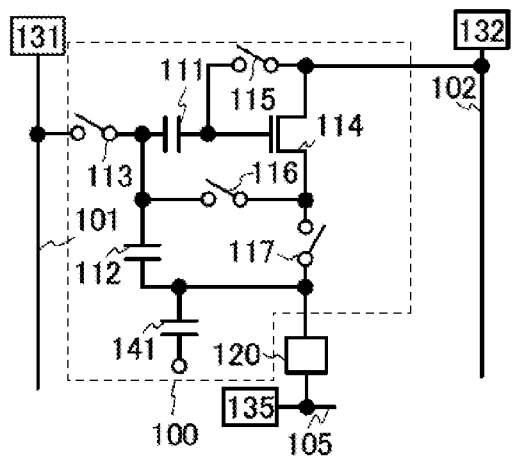

Unlike the semiconductor device illustrated in FIG. 4B, a semiconductor device illustrated in FIG. 7B has the capacitor 141, and does not have the switch 123, the wiring 103, and the circuit 133. That is, unlike the semiconductor device illustrated in FIG. 7A, the semiconductor device illustrated in FIG. 7B does not have the wiring 103, the switch 118, and the circuit 133.

Figure 7C:
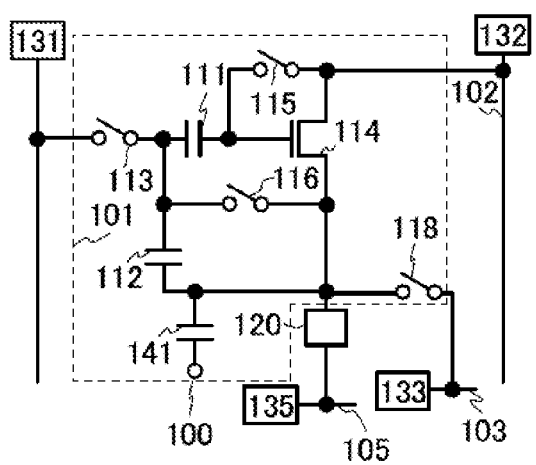

Unlike the semiconductor device illustrated in FIG. 5A, a semiconductor device illustrated in FIG. 7C has the capacitor 141. That is, unlike the semiconductor device illustrated in FIG. 7A, the semiconductor device illustrated in FIG. 7C does not have the switch 117. In the semiconductor device illustrated in FIG. 7C, the switch 118 has a function of controlling electrical connection between the wiring 103 and the other of the pair of electrodes of the capacitor 112 and between the wiring 103 and the other of the source and the drain of the transistor 114. The one of the pair of electrodes of the capacitor 141 is connected to the other of the pair of electrodes of the capacitor 112 and the other of the source and the drain of the transistor 114.

Figure 7D:
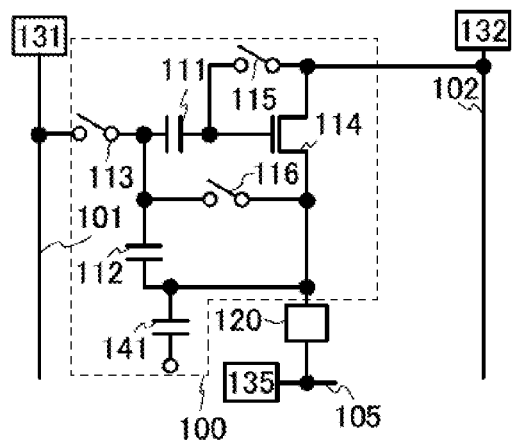

Unlike the semiconductor device illustrated in FIG. 5C, a semiconductor device illustrated in FIG. 7D has the capacitor 141. That is, unlike the semiconductor device illustrated in FIG. 7C, the semiconductor device illustrated in FIG. 7D does not have the switch 118, the wiring 103, and the circuit 133.

Figure 7E:
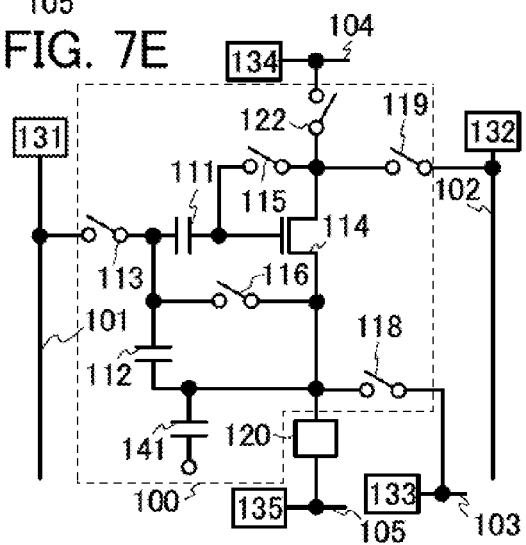

Unlike the semiconductor device illustrated in FIG. 5D, a semiconductor device illustrated in FIG. 7E has the capacitor 141. That is, unlike the semiconductor device illustrated in FIG. 7A, the semiconductor device illustrated in FIG. 7E has the switch 122, the wiring 104, and the switch 119 and does not have the switch 117.

Note that the structure of this embodiment is not limited to the structure of the semiconductor devices illustrated in FIG. 4A, FIG. 4B, FIG. 5A, FIG. 5C, and FIG. 5D, and for example, a capacitor may be additionally provided in the semiconductor devices illustrated in FIGS. 4C to 4E, FIG. 5B, and FIG. 5E.

Next an example of a method for driving the semiconductor device in this embodiment will be described with reference to FIGS. 8A to 8D, FIGS. 9A to 9D, FIGS. 10A to 10D, FIGS. 11A to 11D, and FIGS. 12A to 12D.

Figure 8A:
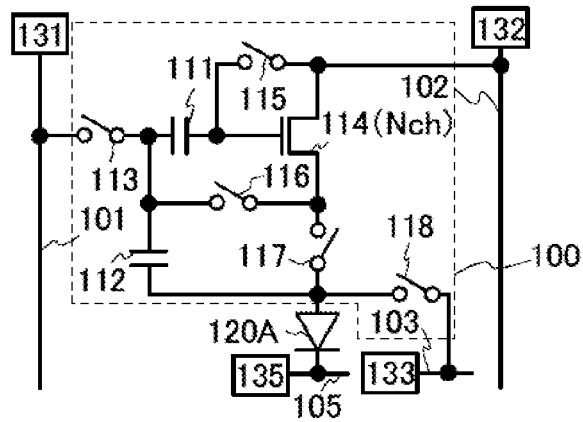
FIGS. 8A to 8D illustrate examples of a semiconductor device.

Next, a method for driving a semiconductor device illustrated in FIG. 8A will be described with reference to timing charts in FIGS. 8B and 8C. The semiconductor device illustrated in FIG. 8A is an example of a semiconductor device having a structure in which a light-emitting diode 120A is provided instead of the load 120 unlike the semiconductor device illustrated in FIG. 4A and the transistor 114 is an n-channel transistor. In this case, an anode of the light-emitting diode 120A is connected to the other of the pair of electrodes of the capacitor 112, and a cathode of the light-emitting diode 120A is connected to the wiring 105. A potential Vdd (also simply referred to as Vdd) is applied to the wiring 102. A potential Vcat (also simply referred to as Vcat) which is lower than the potential Vdd is applied to the wiring 105. A potential Vinit (also simply referred to as Vinit) which is lower than or equal to the potential Vcat is applied to the wiring 103. Here, an example of a method for driving a semiconductor device having the light-emitting diode 120A is shown; however, this embodiment is not limited thereto. The method for driving the semiconductor device except the method for driving the light-emitting diode 120A can be used as appropriate for a semiconductor device which does not have the light-emitting diode 120A.

Figure 8B:
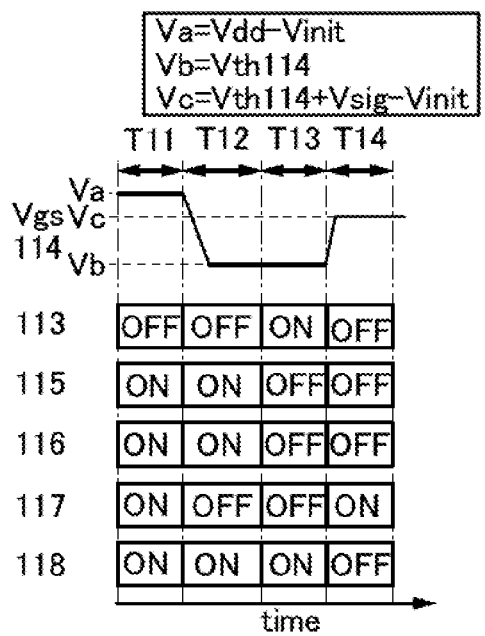
Figure 8C:
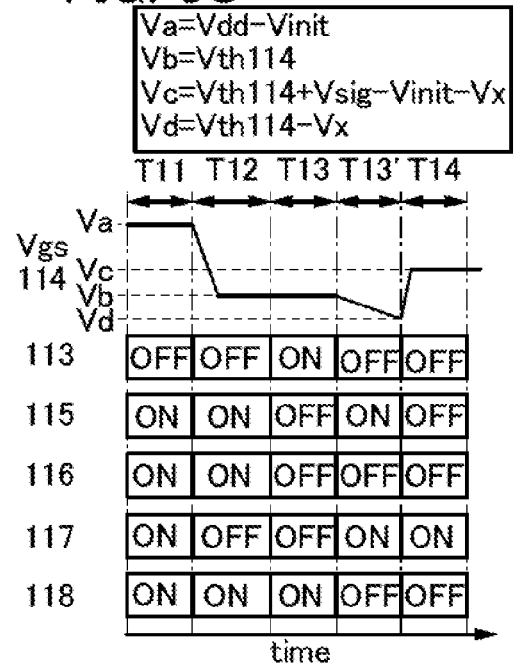

In an example of a method for driving the semiconductor device illustrated in FIG. 8A, as shown in FIGS. 8B and 8C, in a period T11, the switch 113 is in an off state (also referred to as the OFF state), the switch 115 is in an on state (also referred to as the ON state), the switch 116 is in an on state, the switch 117 is in an on state, and the switch 118 is in an on state. Note that the period T11 can be referred to initialization period.

At this time, the potentials of the gate and the drain of the transistor 114 are each the potential Vdd. The potential of the source of the transistor 114 is the potential Vinit. Accordingly, the voltage between the gate and the source (also referred to as Vgs) of the transistor 114 is Vdd−Vinit (which is defined as Va). The value Vdd−Vinit is larger than the value of the threshold voltage of the transistor 114 (also referred to as Vth114). Accordingly, the transistor 114 is in an on state. The voltage applied across the capacitor 111 is Vdd−Vinit. In the case where the potential Vinit is lower than the potential Vcat, the light-emitting diode 120A can be reverse biased to inhibit current flow through the light-emitting diode 120A, whereby, for example, degradation of the light-emitting diode 120A can be prevented.

In a period T12, the switch 113 be in an off state, the switch 115 be in an on state, the switch 116 be in an on state, the switch 117 is in an off state, and the switch 118 be in an on state. Note that in the period T12, the switch 118 may be in an off state. Note that the period T12 can be referred to threshold voltage data acquisition period.

At this time, the transistor 114 keeps being in an on state. The potential of the source of the transistor 114 is changed by current flow between the source and the drain of the transistor 114. At the time when the voltage between the gate and the source of the transistor 114 (Vgs114) becomes lower than or equal to the threshold voltage of the transistor 114 (Vth114, i.e., Vb), the transistor 114 is turned off. A voltage applied across the capacitor 111 is substantially equal to the threshold voltage of the transistor 114 (Vth114). Note that in the period T12, the voltage between the gate and the source of the transistor 114 is not necessarily lower than or equal to the threshold voltage of the transistor 114 (Vth114). For example, the voltage between the gate and the source of the transistor 114 may be higher than the threshold voltage of the transistor 114 (Vth114).

In a period T13 (also referred to as a signal input period), the switch 113 is in an on state, the switch 115 is in an off state, the switch 116 is in an off state, the switch 117 be in an off state, and the switch 118 be in an on state. A signal is input through the wiring 101. In the period T13, both of the switch 116 and the switch 117 are not necessarily turned off as long as one of the switch 116 and the switch 117 is in an off state. When the capacitance of the capacitor 112 is so large that the capacitance of the light-emitting diode 120A can be ignored, the switch 118 may be in an off state.

At this time, the potential of the one of the pair of electrodes of the capacitor 111 is substantially equal to the potential of the input signal (also referred to as Vsig). Further, the gate of the transistor 114 is in a floating state, and the potential of the gate of the transistor 114 is changed in accordance with the input signal. A voltage applied across the capacitor 111 is substantially equal to the threshold voltage of the transistor 114 (Vth114). A voltage applied across the capacitor 112 is Vsig−Vinit. Note that the transistor 114 may be in an on state.

In a period T14 (also referred to as a current generation period), the switch 113 is in an off state, the switch 115 be in an off state, the switch 116 be in an off state, the switch 117 is in an on state, and the switch 118 is in an off state.

At this time, the transistor 114 is in an on state, and current flows between the source and the drain of the transistor 114. Further, since the pair of electrodes of the capacitor 111 and the pair of electrodes of the capacitor 112 are each in a floating state, the potential of the gate of the transistor 114 is changed. Further, current flows between the anode and the cathode of the light-emitting diode 120A, whereby the light-emitting diode 120A emits light. At this time when the potential of the source of the transistor 114 is defined as a potential Vel (also simply referred to as Vel), the potential of the gate of the transistor 114 is Vth114+Vsig−Vinit+Vel; accordingly, the voltage between the gate and the source of the transistor 114 (Vgs114) is Vth114+Vsig−Vinit (which is defined as Vc). Therefore, change in the voltage between the gate and the source of the transistor 114 (Vgs114) caused by change in the potential of the source of the transistor 114 can be prevented.

Note that as shown in FIG. 8C, in a period T13', the switch 113 may be in an off state, the switch 115 may be in an on state, the switch 116 may be in an off state, the switch 117 may be in an on state, and the switch 118 may be in an off state. Note that the period T13' can be referred to mobility correction period.

At this time, the voltage between the gate and the source of the transistor 114 is changed to Vth114−Vx (which is defined as Vd) in accordance with the length of the period T13'. The potential Vx is the amount of change in potential which changes depending on the length of the period T13'. After that, in the period T14, the voltage between the gate and the source of the transistor 114 becomes Vth114+Vsig−Vinit−Vx (which is defined as Vc).

An influence of variations in mobility among the transistors 114 can be prevented by setting the length of the period T13' and setting the voltage between the gate and the source of the transistor 114 to be a predetermined value, as shown in FIG. 8C.

The above is description of an example of a method for driving the semiconductor device illustrated in FIG. 8A.

Figure 8D:
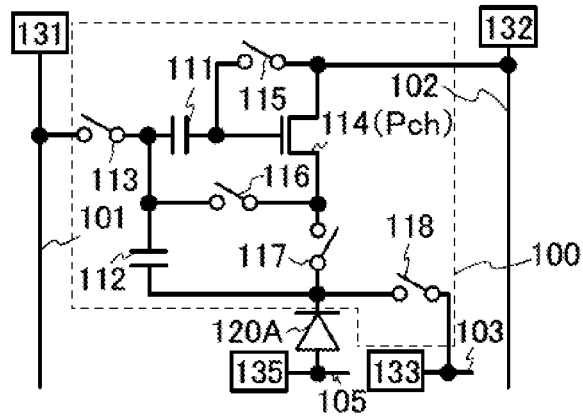

Note that as illustrated in FIG. 8D, the transistor 114 of the semiconductor device illustrated in FIG. 8A may be a p-channel transistor. In this case, the anode of the light-emitting diode 120A is connected to the wiring 105. The cathode of the light-emitting diode 120A is connected to the other of the pair of electrodes of the capacitor 112. The potential Vcat is applied to the wiring 102. The potential Vinit2 or the potential Vdd is applied to the wiring 105. As an example of a method for driving the semiconductor device illustrated in FIG. 8D, for example, the example of the method for driving the semiconductor device illustrated in FIG. 8A (operation of the switch 113, the switch 115, the switch 116, the switch 117, and the switch 118 and potentials of the wiring 101 and the wiring 103) can be used.

Figure 9A:
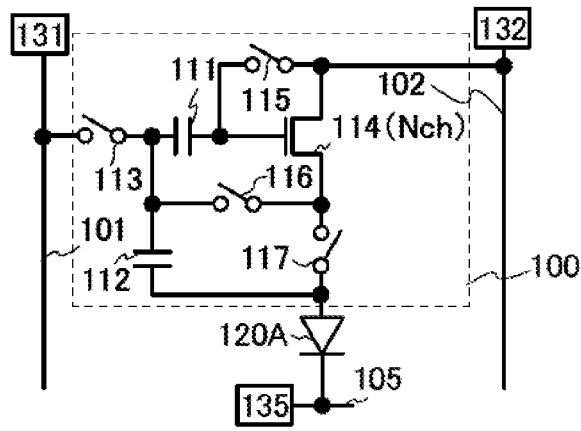
FIGS. 9A to 9D illustrate examples of a semiconductor device.

Next, an example of a method for driving a semiconductor device illustrated in FIG. 9A will be described with reference to timing charts in FIGS. 9B and 9C. The semiconductor device illustrated in FIG. 9A is an example of a semiconductor device having a structure in which the light-emitting diode 120A is provided instead of the load 120, and not having the switch 123, the wiring, 103, and the circuit 133 unlike the semiconductor device illustrated in FIG. 4B and the transistor 114 is an n-channel transistor. In this case, the anode of the light-emitting diode 120A is connected to the other of the pair of electrodes of the capacitor 112, and the cathode of the light-emitting diode 120A is connected to the wiring 105. The potential Vdd is applied to the wiring 102. The potential Vcat is applied to the wiring 105. Here, an example of a method for driving a semiconductor device having the light-emitting diode 120A is shown; however, this embodiment is not limited thereto. The method for driving the semiconductor device except the method for driving the light-emitting diode 120A can be used as appropriate for a semiconductor device which does not have the light-emitting diode 120A.

Figure 9B:
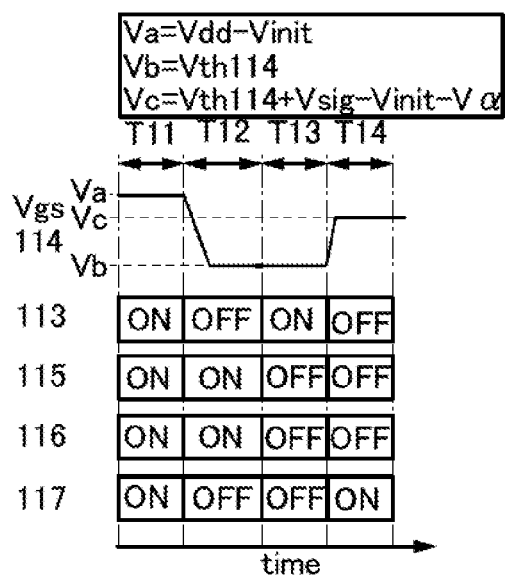
Figure 9C:
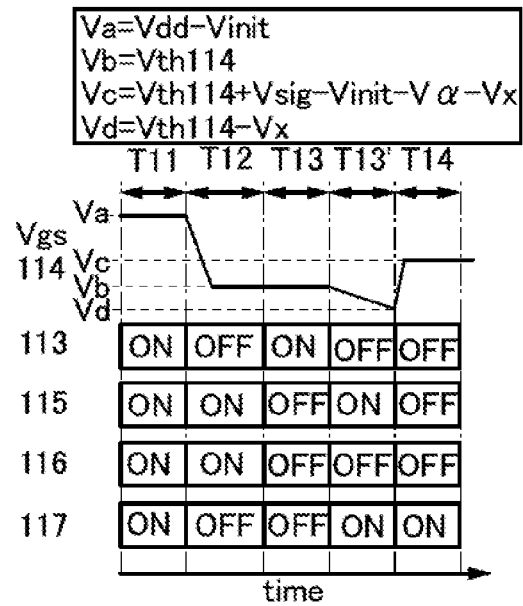

As illustrated in FIGS. 9B and 9C, in a period T11, the switch 113 is in an on state, the switch 115 is in an on state, the switch 116 is in an on state, and the switch 117 is in an on state. The potential of the wiring 101 is the potential Vinit. Note that the period T11 can be referred to initialization period.

At this time, the potentials of the gate and the drain of the transistor 114 are each the potential Vdd. The potential of the source of the transistor 114 is the potential Vinit. Accordingly, the voltage between the gate and the source of the transistor 114 (Vgs114) is Vdd−Vinit (Va). The value Vdd−Vinit is larger than the value of the threshold voltage of the transistor 114 (Vth114). Accordingly, the transistor 114 is in an on state. The voltage applied across the capacitor 111 is Vdd−Vinit. Since the potential Vinit is lower than the potential Vcat, the light-emitting diode 120A can be reverse biased to inhibit current flow through the light-emitting diode 120A, whereby, for example, degradation of the light-emitting diode 120A can be prevented.

In a period T12, the switch 113 is in an off state, the switch 115 be in an on state, the switch 116 be in an on state, and the switch 117 is in an off state. Note that the period T12 can be referred to threshold voltage data acquisition period.

At this time, the transistor 114 keeps being in an on state. The potential of the source of the transistor 114 is changed by current flow between the source and the drain of the transistor 114. At the time when the voltage between the gate and the source of the transistor 114 (Vgs114) becomes lower than or equal to the threshold voltage of the transistor 114 (Vth114, i.e., Vb), the transistor 114 is turned off. A voltage applied across the capacitor 111 is substantially equal to the threshold voltage of the transistor 114 (Vth114). Note that in the period T12, the voltage between the gate and the source of the transistor 114 is not necessarily lower than or equal to the threshold voltage of the transistor 114 (Vth114). For example, the voltage between the gate and the source of the transistor 114 (Vgs114) may be higher than the threshold voltage of the transistor 114 (Vth114).

In a period T13, the switch 113 is in an on state, the switch 115 is in an off state, the switch 116 is in an off state, and the switch 117 be in an off state. A signal is input through the wiring 101. At this time, the potential of a signal input through the wiring 101 is defined as the potential Vsig. In the period T13, the switch 116 and the switch 117 may be in any state as long as at least one of the switch 116 and the switch 117 is in an off state. Note that the period T13 can be referred to signal input period.

At this time, the potential of the one of the pair of electrodes of the capacitor 111 is the potential of the input signal (Vsig). Further, the gate of the transistor 114 is in a floating state, and the potential of the gate of the transistor 114 is changed in accordance with the input signal. A voltage applied across the capacitor 111 is substantially equal to the threshold voltage of the transistor 114 (Vth114). The potential of the other of the pair of electrodes of the capacitor 112 is Vinit+Vα. The value Vα is determined in accordance with the ratio between the capacitance of the capacitor 112 and the capacitance of the light-emitting diode 120A. Therefore, a voltage applied across the capacitor 112 is Vsig−Vinit+Vα. Further, the voltage between the gate and the source of the transistor 114 (Vgs114) is the voltage Vb (i.e., Vth114). Note that the transistor 114 may also be in an on state.

In a period T14, the switch 113 is in an off state, the switch 115 be in an off state, the switch 116 be in an off state, and the switch 117 is in an on state. Note that the period T14 can be referred to current generation period.

At this time, the transistor 114 is in an on state, and current flows between the source and the drain of the transistor 114. Further, since the pair of electrodes of the capacitor 111 and the pair of electrodes of the capacitor 112 are each in a floating state, the potential of the gate of the transistor 114 is changed. Further, current flows between the anode and the cathode of the light-emitting diode 120A, whereby the light-emitting diode 120A emits light. At this time, when the potential of the source of the transistor 114 is defined as Vel, the potential of the gate of the transistor 114 is Vth114+Vsig−Vinit−Vα+Vel; accordingly, the voltage between the gate and the source of the transistor 114 (Vgs114) is Vth114+Vsig−Vinit−Vα (which is defined as Vc). Therefore, change in the voltage between the gate and the source of the transistor 114 (Vgs114) caused by change in the potential of the source of the transistor 114 can be prevented.

Note that as shown in FIG. 9C, in a period T13', the switch 113 may be in an off state, the switch 115 may be in an on state, the switch 116 may be in an off state, and the switch 117 may be in an on state. Note that the period T13' can be referred to mobility correction period.

At this time, the voltage between the gate and the source of the transistor 114 is changed to Vth114−Vx (Vd) in accordance with the length of the period T13'. The potential Vx is the amount of change in potential which changes depending on the length of the period T13'. After that, in the period T14, the voltage between the gate and the source of the transistor 114 becomes Vth114+Vsig−Vinit−Vα−Vx (which is defined as Vc).

An influence of variations in mobility among the transistors 114 can be prevented by setting the length of the period T13' and setting the voltage between the gate and the source of the transistor 114 to be a predetermined value, as shown in FIG. 9C.

The above is description of an example of a method for driving the semiconductor device illustrated in FIG. 9A.

Figure 9D:
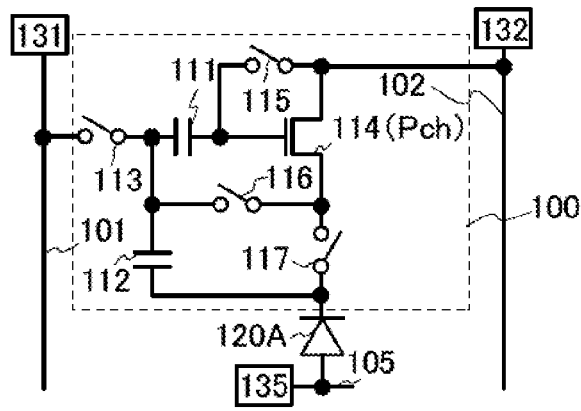

Note that as illustrated in FIG. 9D, the transistor 114 of the semiconductor device illustrated in FIG. 9A may be a p-channel transistor. In this case, the anode of the light-emitting diode 120A is connected to the wiring 105. The cathode of the light-emitting diode 120A is connected to the other of the pair of electrodes of the capacitor 112. The potential Vcat is applied to the wiring 102. The potential Vinit2 or the potential Vdd is applied to the wiring 105. As an example of a method for driving the semiconductor device illustrated in FIG. 9D, for example, the example of the method for driving the semiconductor device illustrated in FIG. 9A (operation of the switch 113, the switch 115, the switch 116, and the switch 117 and potential of the wiring 101) can be used.

Figure 10A:
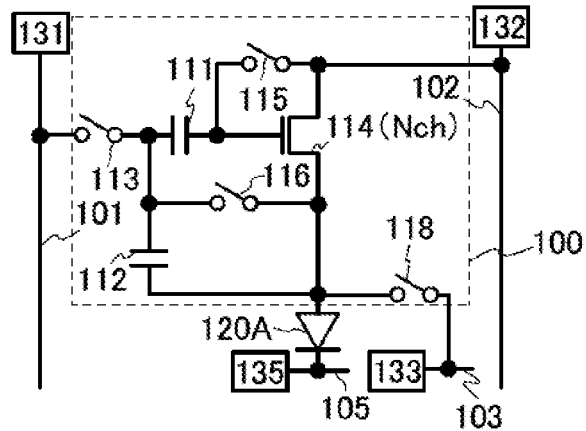
FIGS. 10A to 10D illustrate examples of a semiconductor device.

Next, a method for driving a semiconductor device illustrated in FIG. 10A is described with reference to timing charts in FIGS. 10B and 10C. The semiconductor device illustrated in FIG. 10A is an example of a semiconductor device having a structure in which a light-emitting diode 120A is provided instead of the load 120 unlike the semiconductor device illustrated in FIG. 5A and the transistor 114 is an n-channel transistor. In this case, the anode of the light-emitting diode 120A is connected to the other of the pair of electrodes of the capacitor 112, and the cathode of the light-emitting diode 120A is connected to the wiring 105. A potential Vinit1 (also simply referred to as Vinit1) is applied to the wiring 103. The potential Vcat is applied to the wiring 105. Here, an example of a method for driving a semiconductor device having the light-emitting diode 120A is shown; however, this embodiment is not limited thereto. The method for driving the semiconductor device except the method for driving the light-emitting diode 120A can be used as appropriate for a semiconductor device which does not have the light-emitting diode 120A.

Figure 10B:
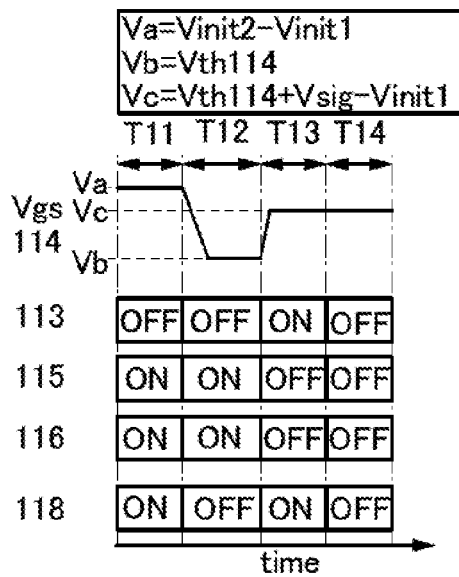
Figure 10C:
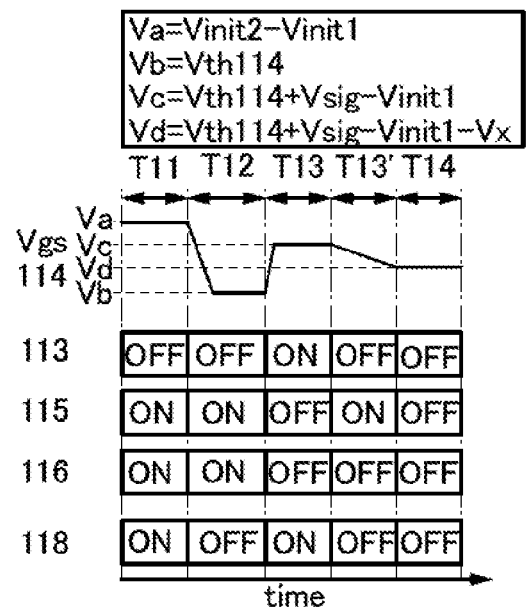

As illustrated in FIGS. 10B and 10C, in a period T11, the switch 113 is in an off state, the switch 115 is in an on state, the switch 116 is in an on state, and the switch 118 is in an on state. The potential of the wiring 102 is a potential Vinit2. Note that the period T11 can be referred to initialization period.

At this time, the potentials of the gate and the drain of the transistor 114 are each the potential Vinit2. The potential of the source of the transistor 114 is the potential Vinit1. Accordingly, the voltage between the gate and the source of the transistor 114 (Vgs114) is Vinit2−Vinit1 (which is defined as Va). The value Vinit2−Vinit1 is larger than the value of the threshold voltage of the transistor 114 (also referred to as Vth114). Accordingly, the transistor 114 is in an on state. The voltage applied across the capacitor 111 is Vinit2−Vinit1. Since the potential Vinit1 is lower than the potential Vcat, the light-emitting diode 120A can be reverse biased to inhibit current flow through the light-emitting diode 120A, whereby, for example, degradation of the light-emitting diode 120A can be prevented.

In a period T12, the switch 113 be in an off state, the switch 115 be in an on state, the switch 116 be in an on state, and the switch 118 is in an off state. The potential of wiring 102 be the potential Vinit2. Note that the period T12 can be referred to threshold voltage data acquisition period.

At this time, the transistor 114 keeps being in an on state. The potential of the source of the transistor 114 is changed by current flow between the source and the drain of the transistor 114. At the time when the voltage between the gate and the source of the transistor 114 (Vgs114) becomes lower than or equal to the threshold voltage of the transistor 114 (Vth114, i.e., Vb), the transistor 114 is turned off. A voltage applied across the capacitor 111 is substantially equal to the threshold voltage of the transistor 114 (Vth114). Note that in the period T12, the voltage between the gate and the source of the transistor 114 (Vgs114) is not necessarily lower than or equal to the threshold voltage of the transistor 114 (Vth114). For example, the voltage between the gate and the source of the transistor 114 may be higher than the threshold voltage of the transistor 114 (Vth114).

In a period T13, the switch 113 is in an on state, the switch 115 is in an off state, the switch 116 is in an off state, and the switch 118 is in an on state. A signal is input through the wiring 101. The potential of the wiring 102 be the potential Vinit2. At this time, the potential of a signal input through the wiring 101 is the potential Vsig. Note that the period T13 can be referred to signal input period. In the period T13, the potential of the wiring 102 may be the potential Vdd.

At this time, the potential of the one of the pair of electrodes of the capacitor 111 is the potential of the input signal (Vsig). Further, the gate of the transistor 114 is in a floating state, and the potential of the gate of the transistor 114 is changed in accordance with the input signal. A voltage applied across the capacitor 111 is substantially equal to the threshold voltage of the transistor 114 (Vth114). The potential of the source of the transistor 114 and the potential of the other of the pair of electrodes of the capacitor 112 are each Vinit1. Therefore, a voltage applied across the capacitor 112 is Vsig−Vinit1. Further, the voltage between the gate and the source of the transistor 114 (Vgs114) is Vth114+Vsig−Vinit1 (which is defined as Vc). Note that the transistor 114 may also be in an on state.

In a period T14, the switch 113 is in an off state, the switch 115 be in an off state, the switch 116 be in an off state, and the switch 118 is in an off state. The potential of the wiring 102 is the potential Vdd. Note that the period T14 can be referred to current generation period.

In this case, the transistor 114 is in an on state, and current flows between the source and the drain of the transistor 114. Further, since the pair of electrodes of the capacitor 111 and the pair of electrodes of the capacitor 112 are each in a floating state, the potential of the gate of the transistor 114 is changed. Further, current flows between the anode and the cathode of the light-emitting diode 120A, whereby the light-emitting diode 120A emits light. When the potential of the source of the transistor 114 is defined as Vel at this time, the potential of the gate of the transistor 114 is Vth114+Vsig−Vinit1+Vel; accordingly, the voltage between the gate and the source of the transistor 114 (Vgs114) is Vth114+Vsig−Vinit1 (Vc). Therefore, change in the voltage between the gate and the source of the transistor 114 (Vgs114) caused by change in the potential of the source of the transistor 114 can be prevented.

Note that as shown in FIG. 10C, in a period T13', the switch 113 may be in an off state, the switch 115 may be in an on state, the switch 116 may be in an off state, and the switch 118 may be in an off state. In this case, the period T13' can be referred to mobility correction period.

At this time, the voltage between the gate and the source of the transistor 114 is changed to Vth114+Vsig−Vinit1−Vx (which is defined as Vd) in accordance with the length of the period T13'. The potential Vx is the amount of change in potential which changes depending on the length of the period T13'. After that, in the period T14, the voltage between the gate and the source of the transistor 114 becomes Vth114+Vsig−Vinit1−Vx (Vd).

An influence of variations in mobility among the transistors 114 can be prevented by setting the length of the period T13' and setting the voltage between the gate and the source of the transistor 114 to be a predetermined value, as shown in FIG. 10C.

The above is description of an example of a method for driving the semiconductor device illustrated in FIG. 10A.

Figure 10D:
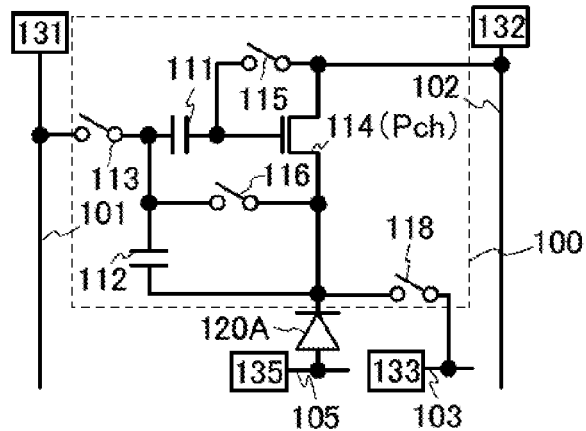

Note that as illustrated in FIG. 10D, the transistor 114 of the semiconductor device illustrated in FIG. 10A may be a p-channel transistor. In this case, the anode of the light-emitting diode 120A is connected to the wiring 105. The cathode of the light-emitting diode 120A is connected to the other of the pair of electrodes of the capacitor 112. The potential Vcat is applied to the wiring 102. The potential Vinit2 or the potential Vdd is applied to the wiring 105. As an example of a method for driving the semiconductor device illustrated in FIG. 10D, for example, the example of the method for driving the semiconductor device illustrated in FIG. 10A (an example of operation of the switch 113, the switch 115, the switch 116, and the switch 118 and potentials of the wiring 101 and the wiring 103) can be used.

Figure 11A:
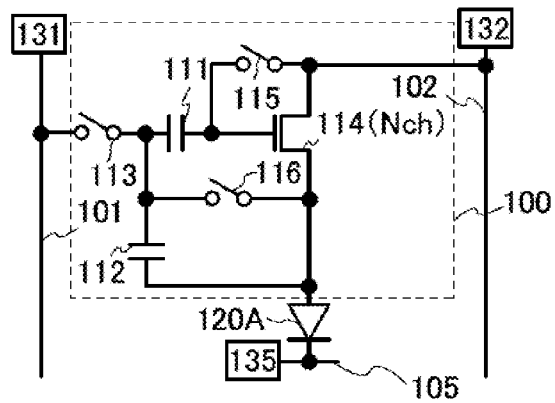
FIGS. 11A to 11D illustrate examples of a semiconductor device.

Next, a method for driving a semiconductor device illustrated in FIG. 11A is described with reference to timing charts in FIGS. 11B and 11C. The semiconductor device illustrated in FIG. 11A is an example of a semiconductor device having a structure in which a light-emitting diode 120A is provided instead of the load 120 unlike the semiconductor device illustrated in FIG. 5C and the transistor 114 is an n-channel transistor. In this case, the anode of the light-emitting diode 120A is connected to the other of the pair of electrodes of the capacitor 112, and the cathode of the light-emitting diode 120A is connected to the wiring 105. The potential Vcat is applied to the wiring 105. Here, an example of a method for driving a semiconductor device having the light-emitting diode 120A is shown; however, this embodiment is not limited thereto. The method for driving the semiconductor device except the method for driving the light-emitting diode 120A can be used as appropriate for a semiconductor device which does not have the light-emitting diode 120A.

Figure 11B:
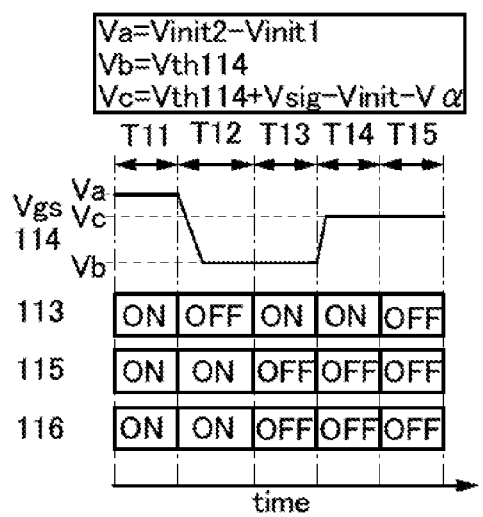
Figure 11C:
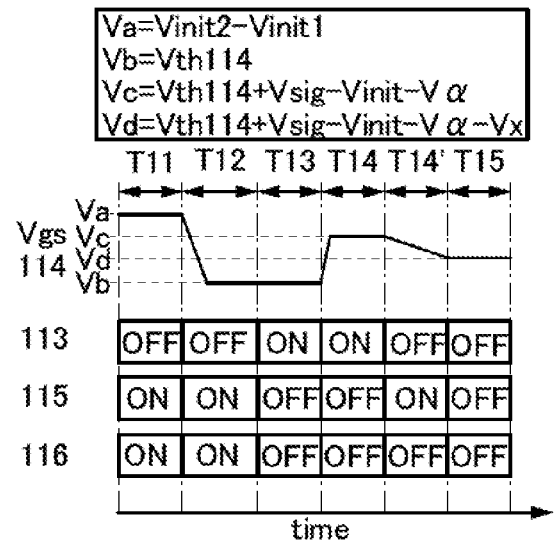

As illustrated in FIGS. 11B and 11C, in a period T11, the switch 113 is in an on state, the switch 115 is in an on state, and the switch 116 is in an on state. The potential of the wiring 101 is the potential Vinit1. The potential of the wiring 102 is the potential Vinit2. Note that the period T11 can be referred to initialization period.

At this time, the potentials of the gate and the drain of the transistor 114 are each the potential Vinit2. The potential of the source of the transistor 114 is the potential Vinit1. Accordingly, the voltage between the gate and the source of the transistor 114 (Vgs114) is Vinit2−Vinit1 (Va). The value Vinit2−Vinit1 is larger than the value of the threshold voltage of the transistor 114 (Vth114). Accordingly, the transistor 114 is in an on state. The voltage applied across the capacitor 111 is Vinit2−Vinit1. Since the potential Vinit1 is lower than the potential Vcat, the light-emitting diode 120A can be reverse biased to inhibit current flow through the light-emitting diode 120A, whereby, for example, degradation of the light-emitting diode 120A can be prevented.

In a period T12, the switch 113 is in an off state, the switch 115 be in an on state, and the switch 116 be in an on state. The potential of the wiring 102 be the potential Vinit2. Note that the period T12 can be referred to threshold voltage data acquisition period.

At this time, the transistor 114 keeps being in an on state. The potential of the source of the transistor 114 is changed by current flow between the source and the drain of the transistor 114. At the time when the voltage between the gate and the source of the transistor 114 (Vgs114) becomes lower than or equal to the threshold voltage of the transistor 114 (Vth114, i.e., Vb), the transistor 114 is turned off. A voltage applied across the capacitor 111 is substantially equal to the threshold voltage of the transistor 114 (Vth114). Note that in the period T12, the voltage between the gate and the source of the transistor 114 (Vgs114) is not necessarily lower than or equal to the threshold voltage of the transistor 114 (Vth114). For example, the voltage between the gate and the source of the transistor 114 may be higher than the threshold voltage of the transistor 114 (Vth114).

In a period T13, the switch 113 is in an on state, the switch 115 is in an off state, and the switch 116 is in an off state. The potential of the wiring 101 be the potential Vinit1. The potential of the wiring 102 be the potential Vinit2. Note that the period T13 can be referred to signal input preprocessing period.

At this time, the potential of the source of the transistor 114 is Vinit1. Further, the gate of the transistor 114 is in a floating state, and the potential of the gate of the transistor 114 is changed to Vinit1+Vth114 in accordance with an input signal. A voltage applied across the capacitor 111 is substantially equal to Vth114. A voltage applied across the capacitor 112 is zero. Further, the voltage between the gate and the source of the transistor 114 (Vgs114) is Vth114.

In a period T14, the switch 113 be in an on state, the switch 115 be in an off state, and the switch 116 be in an off state. A signal is input through the wiring 101. The potential of the wiring 102 be the potential Vinit2. At this time, the potential of a signal input through the wiring 101 is defined as the potential Vsig.

At this time, the potential of the one of the pair of electrodes of the capacitor 111 is the potential of the input signal (Vsig). Further, the gate of the transistor 114 is in a floating state, and the potential of the gate of the transistor 114 is changed in accordance with the input signal. A voltage applied across the capacitor 111 is substantially equal to Vth114. The potential of the other of the pair of electrodes of the capacitor 112 is Vinit1+Vα. The value Vα is determined in accordance with the ratio between the capacitance of the capacitor 112 and the capacitance of the light-emitting diode 120A. Therefore, a voltage applied across the capacitor 112 is Vsig−Vinit1−Vα. Further, the voltage between the gate and the source of the transistor 114 (Vgs114) is Vth114+Vsig−Vinit1−Vα(Vc). Note that the transistor 114 may also be in an on state.

In a period T15, the switch 113 is in an off state, the switch 115 be in an off state, and the switch 116 be in an off state. The potential of the wiring 102 is the potential Vdd. Note that the period T15 can be referred to current generation period.

At this time, the transistor 114 is in an on state, and current flows between the source and the drain of the transistor 114. Further, since the pair of electrodes of the capacitor 111 and the pair of electrodes of the capacitor 112 are each in a floating state, the potential of the gate of the transistor 114 is changed. Further, current flows between the anode and the cathode of the light-emitting diode 120A, whereby the light-emitting diode 120A emits light. At this time, when the potential of the source of the transistor 114 is defined as Vel, the potential of the gate of the transistor 114 is Vth114+Vsig−Vinit1−Vα+Vel; accordingly, the voltage between the gate and the source of the transistor 114 (Vgs114) is Vth114+Vsig−Vinit1−Vα(Vc). Therefore, change in the voltage between the gate and the source of the transistor 114 (Vgs114) caused by change in the potential of the source of the transistor 114 can be prevented.

Note that as shown in FIG. 11C, in a period T14', the switch 113 may be in an off state, the switch 115 may be in an on state, and the switch 116 may be in an off state. Note that the period T14' can be referred to mobility correction period.

At this time, the voltage between the gate and the source of the transistor 114 is changed to Vth114+Vsig−Vinit1−Vx (Vd) in accordance with the length of the period T14'. The potential Vx is the amount of change in potential which changes depending on the length of the period T14'. After that, in the period T15, the voltage between the gate and the source of the transistor 114 becomes Vth114+Vsig−Vinit1−Vx (Vd).

An influence of variations in mobility among the transistor 114 can be prevented by setting the length of the period T14' and setting the voltage between the gate and the source of the transistor 114 to be a predetermined value, as shown in FIG. 11C.

The above is description of an example of a method for driving the semiconductor device illustrated in FIG. 11A.

Figure 11D:
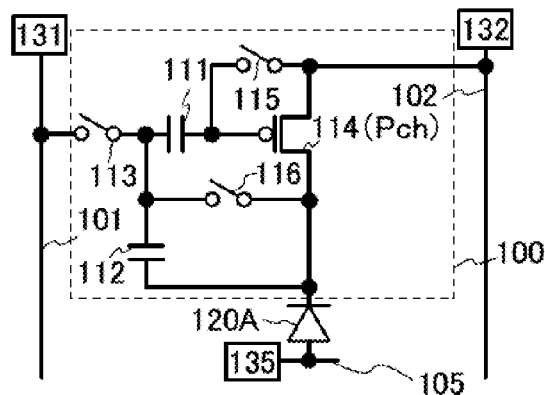

Note that as illustrated in FIG. 11D, the transistor 114 of the semiconductor device illustrated in FIG. 11A may be a p-channel transistor. In this case, the anode of the light-emitting diode 120A is connected to the wiring 105. The cathode of the light-emitting diode 120A is connected to the other of the pair of electrodes of the capacitor 112. The potential Vcat is applied to the wiring 102. The potential Vinit2 or the potential Vdd is applied to the wiring 105. As an example of a method for driving the semiconductor device illustrated in FIG. 11D, for example, the example of the method for driving the semiconductor device illustrated in FIG. 11A (an example of operation of the switch 113, the switch 115, and the switch 116 and potential of the wiring 101) can be used.

Figure 12A:
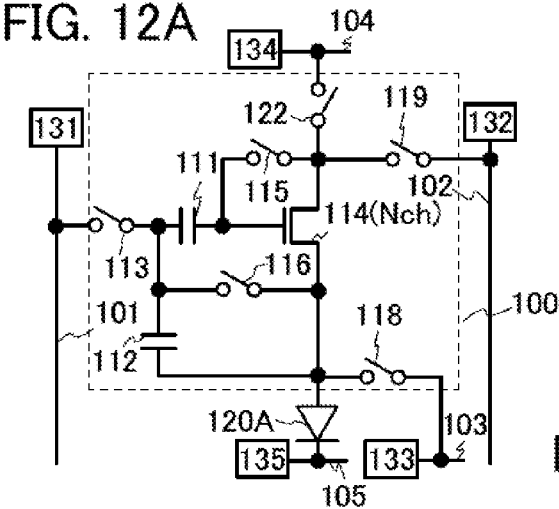
FIGS. 12A to 12D illustrate examples of a semiconductor device.

Next, a method for driving a semiconductor device illustrated in FIG. 12A is described with reference to timing charts in FIGS. 12B and 12C. The semiconductor device illustrated in FIG. 12A is an example of a semiconductor device having a structure in which a light-emitting diode 120A is provided instead of the load 120 unlike the semiconductor device illustrated in FIG. 5D and the transistor 114 is an n-channel transistor. In this case, the anode of the light-emitting diode 120A is connected to the other of the pair of electrodes of the capacitor 112, and the cathode of the light-emitting diode 120A is connected to the wiring 105. The potential Vdd is applied to the wiring 102. The potential Vinit1 is applied to the wiring 103. The potential Vinit2 is applied to the wiring 104. The potential Vcat is applied to the wiring 105. Here, an example of a method for driving a semiconductor device having the light-emitting diode 120A is shown; however, this embodiment is not limited thereto. The method for driving the semiconductor device except the method for driving the light-emitting diode 120A can be used as appropriate for a semiconductor device which does not have the light-emitting diode 120A.

Figure 12B:
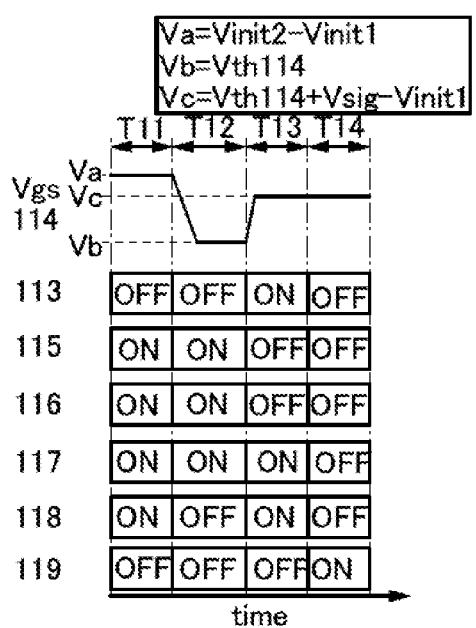
Figure 12C:
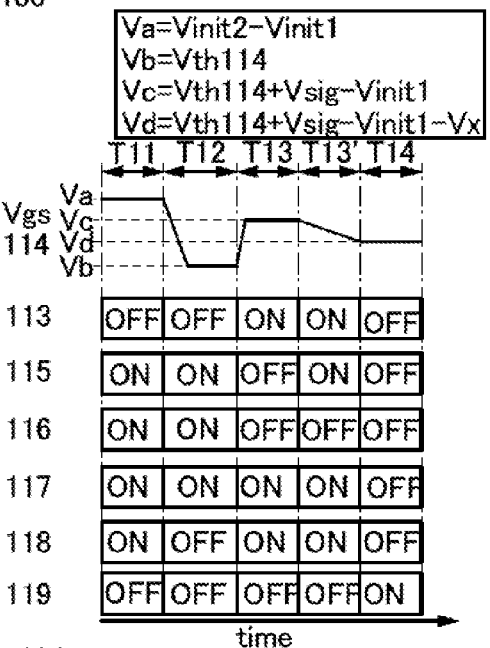

As illustrated in FIGS. 12B and 12C, in a period T11, the switch 113 is in an off state, the switch 115 is in an on state, the switch 116 is in an on state, the switch 117 is in an on state, the switch 118 is in an on state, and the switch 119 is in an off state. Note that the period T11 can be referred to initialization period.

At this time, the potentials of the gate and the drain of the transistor 114 are each the potential Vinit2. The potential of the source of the transistor 114 is the potential Vinit1. Accordingly, the voltage between the gate and the source of the transistor 114 (Vgs114) is Vinit2−Vinit1 (Va). The value Vinit2−Vinit1 is larger than the value of the threshold voltage of the transistor 114 (Vth114). Accordingly, the transistor 114 is in an on state. The voltage applied across the capacitor 111 is Vinit2−Vinit1. Since the potential Vinit1 is lower than the potential Vcat, the light-emitting diode 120A can be reverse biased to inhibit current flow through the light-emitting diode 120A, whereby, for example, degradation of the light-emitting diode 120A can be prevented.

In a period T12, the switch 113 be in an off state, the switch 115 be in an on state, the switch 116 be in an on state, the switch 117 be in an on state, the switch 118 is in an off state, and the switch 119 be in an off state. Note that the period T12 can be referred to threshold voltage data acquisition period.

At this time, the transistor 114 keeps being in an on state. The potential of the source of the transistor 114 is changed by current flow between the source and the drain of the transistor 114. At the time when the voltage between the gate and the source of the transistor 114 (Vgs114) becomes lower than or equal to the threshold voltage of the transistor 114 (Vth114, i.e., Vb), the transistor 114 is turned off. A voltage applied across the capacitor 111 is substantially equal to the threshold voltage of the transistor 114 (Vth114). Note that in the period T12, the voltage between the gate and the source of the transistor 114 (Vgs114) is not necessarily lower than or equal to the threshold voltage of the transistor 114 (Vth114). For example, the voltage between the gate and the source of the transistor 114 (Vgs114) may be higher than the threshold voltage of the transistor 114 (Vth114).

In a period T13, the switch 113 is in an on state, the switch 115 is in an off state, the switch 116 is in an off state, the switch 117 be in an on state, the switch 118 is in an on state, and the switch 119 be in an off state. At this time, the potential of a signal input through the wiring 101 is defined as the potential Vsig. Note that the period T13 can be referred to signal input preprocessing period.

At this time, the potential of the one of the pair of electrodes of the capacitor 111 is the potential of the input signal (Vsig). Further, the gate of the transistor 114 is in a floating state, and the potential of the gate of the transistor 114 is changed in accordance with the input signal, whereby the potential of the source of the transistor 114 becomes Vinit1. A voltage applied across the capacitor 111 is substantially equal to Vth114. A voltage applied across the capacitor 112 is Vsig−Vinit1. Further, the voltage between the gate and the source of the transistor 114 (Vgs114) is Vsig−Vth114−Vinit1 (Vc).

In a period T14, the switch 113 is in an off state, the switch 115 be in an off state, the switch 116 be in an off state, the switch 117 is in an off state, the switch 118 is in an off state, and the switch 119 is in an on state. Note that the period T14 can be referred to current generation period.

At this time, the transistor 114 is in an on state, and current flows between the source and the drain of the transistor 114. Further, since the pair of electrodes of the capacitor 111 and the pair of electrodes of the capacitor 112 are each in a floating state, the potential of the gate of the transistor 114 is changed. Further, current flows between the anode and the cathode of the light-emitting diode 120A, whereby the light-emitting diode 120A emits light. At this time, when the potential of the source of the transistor 114 is defined as Vel, the potential of the gate of the transistor 114 is Vth114+Vsig−Vinit1+Vel; accordingly, the voltage between the gate and the source of the transistor 114 (Vgs114) is Vth114+Vsig−Vinit1 (Vc). Therefore, change in the voltage between the gate and the source of the transistor 114 (Vgs114) caused by change in the potential of the source of the transistor 114 can be prevented.

Note that as shown in FIG. 12C, in a period T13', the switch 113 may be in an on state, the switch 115 may be in an on state, the switch 116 may be in an off state, the switch 117 may be in an on state, the switch 118 may be in an on state, and the switch 119 may be in an off state. Note that the period T13' can be referred to a mobility correction period.

At this time, the voltage between the gate and the source of the transistor 114 (Vgs114) is changed to Vth114+Vsig−Vinit1−Vx (Vd) in accordance with the length of the period T13'. The potential Vx is the amount of change in potential which changes depending on the length of the period T13'. After that, in the period T14, the voltage between the gate and the source of the transistor 114 (Vgs114) becomes Vth114+Vsig−Vinit1−Vx (Vd).

An influence of variations in mobility among the transistors 114 can be prevented by setting the length of the period T13' and setting the voltage between the gate and the source of the transistor 114 (Vgs114) to be a predetermined value, as shown in FIG. 12C, a.

The above is description of an example of a method for driving the semiconductor device illustrated in FIG. 12A.

Figure 12D:
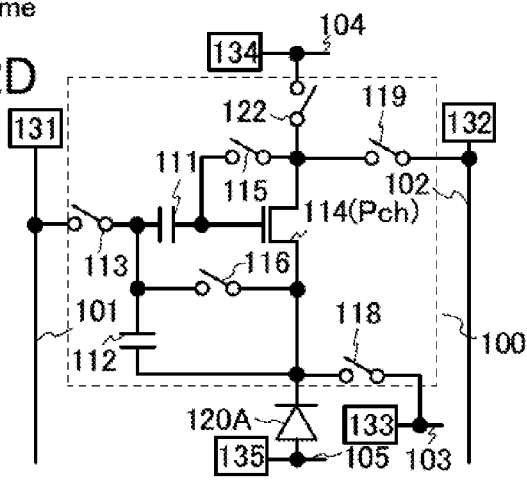

Note that as illustrated in FIG. 12D, the transistor 114 of the semiconductor device illustrated in FIG. 12A may be a p-channel transistor. In this case, the anode of the light-emitting diode 120A is connected to the wiring 105. The cathode of the light-emitting diode 120A is connected to the other of the pair of electrodes of the capacitor 112. The potential Vcat is applied to the wiring 102. The potential Vinit2 or the potential Vdd is applied to the wiring 105. As an example of a method for driving the semiconductor device illustrated in FIG. 12D, for example, the example of the method for driving the semiconductor device illustrated in FIG. 12A (the example of operation of the switch 113, the switch 115, the switch 116, the switch 117, the switch 118, and the switch 119 and potentials of the wiring 101 and the wiring 103) can be used.

In each of the semiconductor devices illustrated in FIG. 8A, FIG. 9A, FIG. 10A, FIG. 11A, and FIG. 12A, the amount of current flowing through the light-emitting diode 120A is determined on the basis of the amount of current flowing through the source and the drain of the transistor 114 (also referred to as Ids114). In the case where the transistor 114 operates in a saturation region, the amount of current flowing between the source and the drain of the transistor 114 (Ids114) is determined depending on the value of an input signal, regardless of the threshold voltage of the transistor 114 (Vth114). The same applies to the examples of a method for driving a semiconductor device which are described with reference to FIGS. 8D, 9D, 10D, 11D, and 12D.

The above is the description of an example of a method for driving a semiconductor device in this embodiment.

As described with reference to FIGS. 1A to 1E, FIGS. 2A to 2E, FIGS. 3A to 3E, FIGS. 4A to 4E, FIGS. 5A to 5F, FIGS. 6A to 6C, FIGS. 7A to 7E, FIGS. 8A to 8D, FIGS. 9A to 9D, FIGS. 10A to 10D, FIGS. 11A to 11D, and FIGS. 12A to 12D, in an example of the semiconductor device in this embodiment, the data of the threshold voltage of the transistor is obtained in a threshold voltage data acquisition period in advance. Accordingly, the amount of current flowing between the source and the drain of the transistor can be determined regardless of the threshold voltage of the transistor; thus, an influence of variations in threshold voltage among the transistors can be prevented. Therefore, an influence of degradation of the transistor can be prevented.

In an example of the semiconductor device in this embodiment, there is a mobility correction period for setting the potential of the gate of the transistor in accordance with the mobility of the transistor; accordingly, an influence of variations in mobility among the transistors can be prevented.

Accordingly, in an example of the semiconductor device in this embodiment, the amount of current flowing between the source and the drain of the transistor can be controlled, and thus an operation defect can be prevented.

Note that in this specification and the like, it might be possible for those skilled in the art to constitute one embodiment of the invention even when portions to which all the terminals of an active element (e.g., a transistor and a diode), a passive element (e.g., a capacitor and a resistor), or the like are connected are not specified. In other words, even when such portions are not specified, one embodiment of the invention can be clear and it can be determined that one embodiment of the present invention is disclosed in this specification and the like in some cases. In particular, in the case where the number of portions to which the terminal is connected is plural, it is not necessary to specify the portions to which the terminal is connected. Therefore, it might be possible to constitute one embodiment of the invention by specifying only portions to which some of terminals of an active element (e.g., a transistor and a diode), a passive element (e.g., a capacitor and a resistor), or the like are connected.

Note that in this specification and the like, it might be possible for those skilled in the art to specify one embodiment of the present invention when at least the connection portion or the function of a circuit is specified. In other words, when a connection portion or a function of a circuit is specified, one embodiment of the present invention can be clear and it can be determined that one embodiment of the invention is disclosed in this specification and the like in some cases. Therefore, when a function of a connection portion is specified, even if a function is not specified, the circuit is regarded as being disclosed as one embodiment of the invention. Alternatively, when a function of a circuit is specified, even if a connection portion is not specified, the circuit is regarded as being disclosed as one embodiment of the invention.

By stipulating that content that is not specified in the drawings and texts in this specification is excluded, one embodiment of the present invention may be constructed. By stipulating that a conventional technology is not included in the scope of the present invention, for example, one embodiment of the present invention can be constructed.

This embodiment shows an example of a basic principle. Thus, part of or the whole of this embodiment can be combined with, applied to, or replaced with part of or the whole of another embodiment.

Embodiment 2

In this embodiment, an example of a semiconductor device which functions as a current source and includes a plurality of unit circuits will be described.

An example of a semiconductor device in this embodiment will be described with reference to FIGS. 13A to 13F, FIG. 14, FIG. 15, and FIGS. 16A and 16B.

Figure 13A:
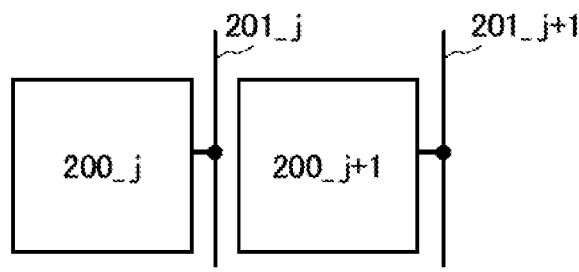
FIGS. 13A to 13F illustrate examples of a semiconductor device.

A semiconductor device illustrated in FIG. 13A includes a plurality of unit circuits (unit circuits 200_*j* (j is a natural number) and 200_*j*+1) arranged in a row direction and a plurality of wirings (wirings 201_*j* and 201_*j*+1). The unit circuit 200_*j* is connected to the wiring 201_*j*. The unit circuit 200_*j*+1 is connected to the wiring 201_*j*+1.

Figure 13B:
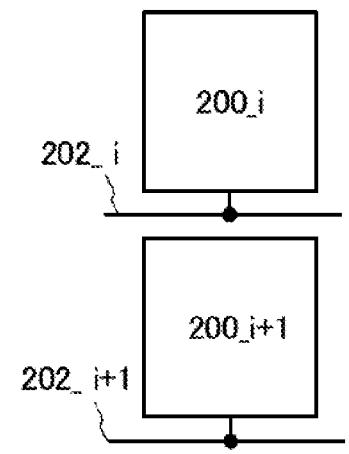

A semiconductor device illustrated in FIG. 13B includes the plurality of unit circuits (unit circuits 200_*i* (i is a natural number) and 200_*i*+1) arranged in a column direction and a plurality of wirings (wirings 202_*i* and 202_*i*+1). The unit circuit 200_*i* is connected to the wiring 202_*i*. The unit circuit 200_*i*+1 is connected to the wiring 202_*i*+1.

As each of the unit circuits 200_*j*, 200_*j*+1, 200_*j*, and 200_*j*+1, the unit circuit 100 of the semiconductor device in Embodiment 1 can be used, for example. The load 120 of the semiconductor device in Embodiment 1 may be provided for each of the unit circuits 200_*j*, 200_*j*+1, 200_*j*, and 200_*i*+1. Alternatively, three or more unit circuits may be provided for the semiconductor device.

Each of the wirings 201_*j* and 201_*j*+1 is a wiring which can function as the wiring 101 or 102 of the semiconductor device in Embodiment 1, for example.

Each of the wiring s 202_*i* and 202_*i*+1 is a wiring which can function as the wiring 103 or 104 of the semiconductor device in Embodiment 1, for example.

Figure 13C:
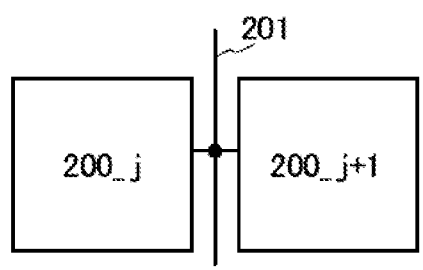

In the semiconductor device illustrated in FIG. 13C, the unit circuits 200_*j* and 200_*j*+1 in the semiconductor device illustrated in FIG. 13A are both connected to the wiring 201. With this structure, the number of wirings can be small, and therefore the area of the semiconductor device can be small.

Figure 13D:
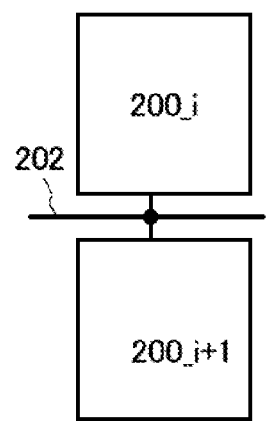

In the semiconductor device illustrated in FIG. 13D, the unit circuits 200_*j* and 200_*j*+1 in the semiconductor device illustrated in FIG. 13B are both connected to the wiring 202. With this structure, the number of wirings can be small, and therefore the area of the semiconductor device can be small.

Figure 13E:
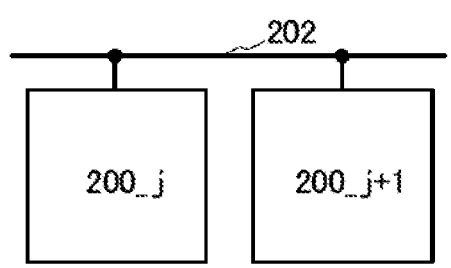
Figure 13F:
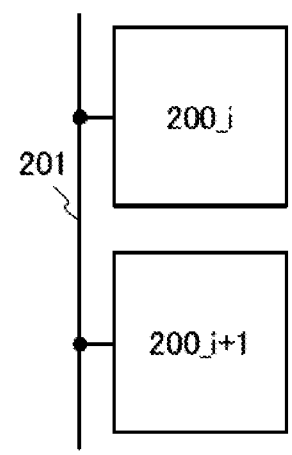

Note that this embodiment is not limited to the above structure, and for example, a semiconductor device may be formed in such a manner that the unit circuits 200_*j* and 200_*j*+1 of the semiconductor device illustrated in FIG. 13A are both connected to the wiring 202 as illustrated in FIG. 13E. For example, as illustrated in FIG. 13F, a semiconductor device may be formed in such a manner that the unit circuits 200_*i* and 200_*i*+1 of the semiconductor device illustrated in FIG. 13B are both connected to the wiring 201.

As a specific example of a semiconductor device including the plurality of unit circuits 200_*j*, 200_*j*+1, 200_*i*, and 200_*i*+1, an example of a structure of the semiconductor device including the plurality of unit circuits 100 which is described in Embodiment 1 will be described with reference to FIG. 14. Note that in FIG. 14, the unit circuit 100 which has the structure similar to that illustrated in FIG. 4A and has the transistors 113T, 115T, 116T, 117T, and 118T instead of the switches 113, 115, 116, 117, and 118, respectively is illustrated as an example; however, this embodiment is not limited thereto. The unit circuit 100 may have another structure.

Figure 14:
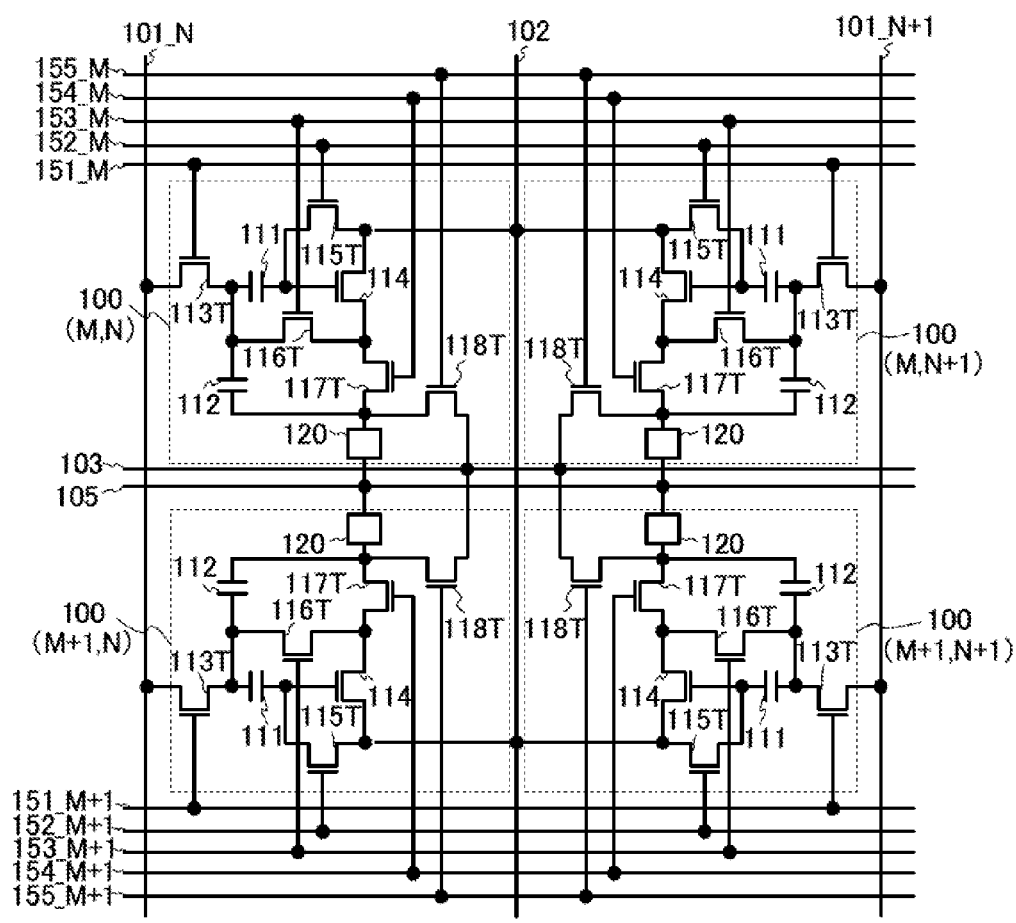
FIG. 14 illustrates an example of a semiconductor device.

The semiconductor device illustrated in FIG. 14 includes the plurality of unit circuits (the unit circuits 100(M, N), 100(M+1, N), 100(M, N+1), and 100(M+1, N+1); M and N are natural numbers) arranged in matrix, the plurality of wirings (wirings 101_N and 101_N+1), the wiring 102, the wiring 103, the wiring 105, a plurality of wirings (wirings 151_M and 151_M+1), a plurality of wirings (wirings 152_M and 152M+1), a plurality of wirings (wirings 153_M and 153_M+1), a plurality of wirings (wirings 154_M and 154_M+1), and a plurality of wirings (wirings 155_M and 155_M+1).

In the semiconductor device illustrated in FIG. 14, one of a source and a drain of the transistor 118T, which functions as the switch 118, in each of the unit circuits 100(M, N), 100(M+1, N), 100(M, N+1), and 100(M+1, N+1) is connected to the wiring 103, and the other of the two terminals of each of the loads 120 is connected to the wiring 105.

In the semiconductor device illustrated in FIG. 14, one of a source and a drain of the transistor 113T, which functions as the switch 113, in each of the unit circuits 100(M, N) and 100(M+1, N) in the N-th column is connected to the wiring 101_N. The one of the source and the drain of the transistor 113T, which functions as the switch 113, in each of the unit circuits 100(M, N+1) and 100(M+1, N+1) in the (N+1)-th column is connected to the wiring 101_N+1.

In the semiconductor device illustrated in FIG. 14, in each of the unit circuits 100(M, N) and 100(M, N+1) in the M-th row, the gate of the transistor 113T which functions as the switch 113 is connected to the wiring 151_M, the gate of the transistor 115T which functions as the switch 115 is connected to the wiring 152_M, the gate of the transistor 116T which functions as the switch 116 is connected to the wiring 153_M, the gate of the transistor 117T which functions as the switch 117 is connected to the wiring 154_M, and the gate of the transistor 118T which functions as the switch 118 is connected to the wiring 155_M. In each of the unit circuits 100(M+1, N) and 100(M+1, N+1) in the (M+1)-th row, the gate of the transistor 113T which functions as the switch 113 is connected to the wiring 151_M+1, the gate of the transistor 115T which functions as the switch 115 is connected to the wiring 152_M+1, the gate of the transistor 116T which functions as the switch 116 is connected to the wiring 153_M+1, the gate of the transistor 117T which functions as the switch 117 is connected to the wiring 154_M+1, and the gate of the transistor 118T which functions as the switch 118 is connected to the wiring 155_M+1. In this case, the potentials of the wirings 151_M, 151_M+1, 152_M, 152M+1, 153_M, 153_M+1, 154_M, 154_M+1, 155_M and 155_M+1 are controlled, whereby the transistors 113T, 115T, 116T, 117T, and 118T functioning as the switches 113, 115, 116, 117, and 118 can be controlled to be in an on state or an off state.

In the unit circuit 100(I, J) in the I-th row (I is a natural number not less than M and not more than M+1) and the J-th column (J is a natural number not less than N and not more than N+1), the one of the source and the drain of the transistor 113T functions as the switch 113 is connected to the wiring 101_J and the gate of the transistor 113T which functions as the switch 113 is connected to the wiring 151_I. The gate of the transistor 115T which functions as the switch 115 is connected to the wiring 152_I. The gate of the transistor 116T which functions as the switch 116 is connected to the wiring 153_I. The gate of the transistor 117T which functions as the switch 117 is connected to the wiring 154_I. The gate of the transistor 118T which functions as the switch 118 is connected to the wiring 155_I.

As shown in FIG. 14, for example, a plurality of wirings each of which is connected to a plurality of unit circuits may be provided. In this manner, the number of wirings can be further reduced.

Further, another example of a semiconductor device including a plurality of unit circuits will be described with reference to FIG. 15.

Figure 15:
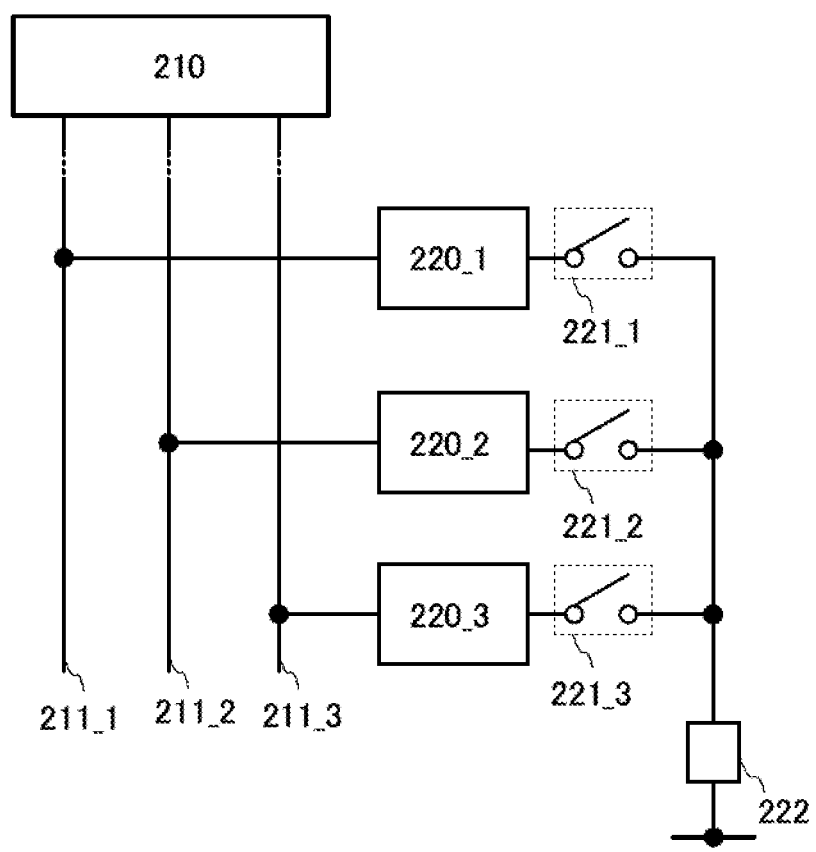
FIG. 15 illustrates an example of a semiconductor device.

A semiconductor device illustrated in FIG. 15 includes a driver circuit 210, a plurality of wirings (wirings 211_1 to 211_3), a plurality of unit circuits (unit circuits 220_1 to 220_3), a plurality of switches (switches 221_1 to 221_3), and a load 222.

As the unit circuit 200, the unit circuit 100 in Embodiment 1 can be used.

In the semiconductor device illustrated in FIG. 15, the driver circuit 210 supplies a potential or a signal to the plurality of unit circuits 220_1 to 220_3 through the plurality of wirings 211_1 to 211_3, whereby the amount of current generated in the plurality of unit circuits 220_1 to 220_3 is determined. Further, the amount of current flowing to the load 222 is controlled by the plurality of switches 221_1 to 221_3.

With the above structure, a semiconductor device can function as a current source in which the amount of current flowing to a load is controlled by a plurality of unit circuits.

The above is the description of the structural example of the semiconductor device illustrated in FIG. 15.

A semiconductor device can be formed using a plurality of unit circuits as described with reference to FIGS. 13A to 13F, FIG. 14, and FIG. 15.

In an example of the semiconductor device in this embodiment, an influence of variations in threshold voltage among transistors in each of a plurality of unit circuits can be prevented, and thus an influence of degradation of the transistor can be prevented.

In an example of the semiconductor device in this embodiment, the potential of a gate of a transistor is set in accordance with the mobility of the transistor in each of a plurality of unit circuits; as a result, an influence of variations in mobility among the transistors can be prevented.

Accordingly, in an example of the semiconductor device in this embodiment, the amount of current flowing between the source and the drain of the transistor in each of a plurality of unit circuits can be controlled, and thus an operation defect can be prevented.

Embodiment 3

In this embodiment, an example of the transistor in the semiconductor device in the above embodiments will be described.

Examples of the structure of the transistors in this embodiment will be described with reference to FIGS. 16A and 16B.

Figure 16A:
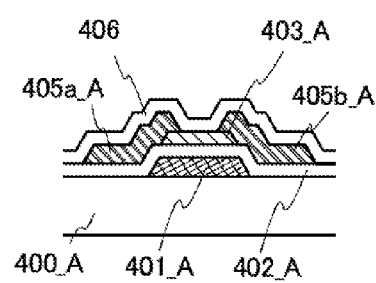
FIGS. 16A and 16B illustrate examples of a transistor.

A transistor in FIG. 16A includes a conductive layer 401_A, an insulating layer 402_A, a semiconductor layer 403_A, a conductive layer 405a_A, a conductive layer 405b_A, and an insulating layer 406 which are provided over an element formation layer 400_A.

Figure 16B:
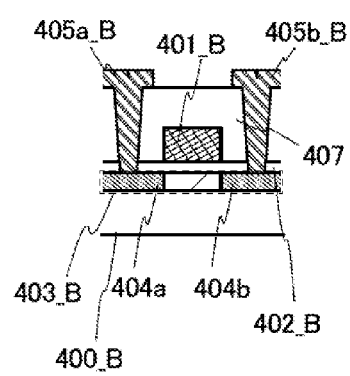

A transistor in FIG. 16B includes a conductive layer 401_B, an insulating layer 402_B, a semiconductor layer 403_B including regions 404a and 404b, a conductive layer 405a_B, a conductive layer 405b_B, and an insulating layer 407 which are provided over an element formation layer 400_B.

Next, the components illustrated in FIGS. 16A and 16B will be described. Note that each layer can be a stack of a plurality of materials.

As the element formation layers 400_A and 400_B, insulating layers or substrates having insulating surfaces can be used, for example.

As the substrate, a semiconductor substrate (e.g., a single crystal substrate or a silicon substrate), a silicon on insulator (SOI) substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate are a barium borosilicate glass substrate, an aluminoborosilicate glass substrate, and a soda-lime glass substrate. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film are attachment films formed using polypropylene, polyester, polyvinyl fluoride, polyvinyl chloride, and the like. Examples of a base film are a base film formed using polyester, polyamide, polyimide, inorganic vapor deposition film, paper, and the like. In particular, by forming transistors with the use of a semiconductor substrate, a single crystal substrate, an SOI substrate, or the like, transistors with fewer variations in characteristics, sizes, shapes, or the like, with high current supply capability, and with small sizes can be formed. By forming a circuit using such transistors, power consumption of the circuit can be reduced or the circuit can be highly integrated.

Note that the transistor may be formed using one substrate, and then, the transistor may be transferred to another substrate. Examples of a substrate to which a transistor is transferred are, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, transistors with excellent properties or transistors with low power consumption can be formed, a device with high durability or high heat resistance can be formed, or reduction in weight or thinning can be achieved.

Note that it is possible not to form all the circuits that are necessary to realize the predetermined function over the same substrate. In other words, some of the circuits which are necessary to realize the predetermined functions can be formed using one substrate and some of the circuits which are necessary to realize the predetermined functions can be formed using another substrate. For example, some of the circuits which are necessary to realize the predetermined function can be formed using a glass substrate and some of the circuits which are necessary to realize the predetermined function can be formed using a single crystal substrate (or an SOI substrate). In this case, the single crystal substrate over which some of the circuits which are necessary to realize the predetermined function (such a substrate is also referred to as an integrated circuit (IC) chip) can be connected to the glass substrate by chip on glass (COG), and the IC chip can be provided over the glass substrate.

In this embodiment, the IC chip can be connected to the glass substrate by using tape automated bonding (TAB), chip on film (COF), surface mount technology (SMT), a printed substrate, or the like. When some of the circuits are formed using the same substrate as a pixel portion in this manner, cost can be reduced by reduction in the number of components or reliability can be improved by reduction in the number of connections to circuit components. In particular, a circuit with high drive voltage, a circuit with high drive frequency, or the like consumes a large amount of power in many cases. In order to deal with it, such a circuit is formed over a substrate (e.g., a single crystal substrate) which is different from a substrate over which the pixel portion is formed, so that an IC chip is formed. With the IC chip, the increase in power consumption can be prevented.

Each of the conductive layers 401_A and 401_B functions as a gate of the transistor. Note that a layer functioning as a gate of the transistor can be called a gate electrode or a gate wiring.

As the conductive layers 401_A and 401_B, it is possible to use, for example, a layer including a metal material such as molybdenum, magnesium, titanium, chromium, tantalum, tungsten, aluminum, copper, neodymium, or scandium or an alloy material containing any of these materials as a main component.

Each of the insulating layers 402_A and 402_B functions as a gate insulating layer of the transistor.

Each of the insulating layers 402_A and 402_B can be a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer.

As the insulating layers 402_A and 402_B, an insulating layer of a material containing, for example, an element that belongs to Group 13 in the periodic table and oxygen can also be used.

Each of the semiconductor layers 403_A and 403_B functions as a layer in which a channel of the transistor is formed (also referred to as channel formation layer), that is, a layer including a channel formation region. For the semiconductor layers 403_A and 403_B, a semiconductor containing an element that belongs to Group 14 in the periodic table (e.g., silicon) can be used, for example. In that case, the semiconductor layer may be a single crystal semiconductor layer, a polycrystalline semiconductor layer, a microcrystalline semiconductor layer, or an amorphous semiconductor layer.

A semiconductor layer which can be applied to the semiconductor layers 403_A and 403_B may be an oxide semiconductor layer.

The oxide semiconductor layer is in a single crystal state, a polycrystalline (also referred to as polycrystal) state, an amorphous state, or the like. The oxide semiconductor layer may be a stack of an amorphous layer and a layer including crystals.

Examples of an oxide semiconductor are a metal oxide containing zinc and at least one of indium and gallium, and the metal oxide in which gallium is partly or entirely replaced with another metal element.

For example, In-based metal oxide, Zn-based metal oxide, In—Zn-based metal oxide, In—Ga—Zn-based metal oxide, or the like can be used as the metal oxide. Alternatively, a metal oxide including another metal element instead of part or all of Ga (gallium) in the In—Ga—Zn-based metal oxide may be used.

As another metal element, for example, one or more of titanium, zirconium, hafnium, germanium, and tin, or the like can be used. Further, as another metal element, one or more of lanthanum, cerium, praseodymium, neodymium, samarium, europium, gadolinium, terbium, dysprosium, holmium, erbium, thulium, ytterbium, and lutetium, or the like can be also used. The above metal elements each have a function as a stabilizer. Note that the amount of the metal element is the amount at which the metal oxide can serve as a semiconductor.

For example, when tin is used instead of all gallium (Ga) contained in the In—Ga—Zn-based metal oxide, In—Sn—Zn-based metal oxide is obtained. When titanium is used instead of part of Ga contained in the In—Ga—Zn-based metal oxide, In—Ti—Ga—Zn-based metal oxide is obtained.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

An oxide semiconductor layer may include a CAAC-OS. In the CAAC-OS, for example, c-axes are aligned, and a-axes and/or b-axes are not macroscopically aligned.

For example, an oxide semiconductor layer may include microcrystal. Note that an oxide semiconductor including microcrystal is referred to as a microcrystalline oxide semiconductor. A microcrystalline oxide semiconductor layer includes microcrystal (also referred to as nanocrystal) with a size greater than or equal to 1 nm and less than 10 nm, for example.

For example, an oxide semiconductor layer may include an amorphous part. Note that an oxide semiconductor including an amorphous part is referred to as an amorphous oxide semiconductor. An amorphous oxide semiconductor layer, for example, has disordered atomic arrangement and no crystalline component. Alternatively, an amorphous oxide semiconductor layer is, for example, absolutely amorphous and has no crystal part.

Note that an oxide semiconductor layer may be a mixed layer including any of a CAAC-OS, a microcrystalline oxide semiconductor, and an amorphous oxide semiconductor. The mixed layer, for example, includes a region of an amorphous oxide semiconductor, a region of a microcrystalline oxide semiconductor, and a region of a CAAC-OS. Further, the mixed layer may have a stacked-layer structure including a region of an amorphous oxide semiconductor, a region of a microcrystalline oxide semiconductor, and a region of a CAAC-OS, for example.

An oxide semiconductor layer may be in a single-crystal state, for example.

An oxide semiconductor layer preferably includes a plurality of crystal parts. In each of the crystal parts, a c-axis is preferably aligned in a direction parallel to a normal vector of a surface where the oxide semiconductor layer is formed or a normal vector of a surface of the oxide semiconductor layer. Note that, among crystal parts, the directions of the a-axis and the b-axis of one crystal part may be different from those of another crystal part. An example of such an oxide semiconductor layer is a CAAC-OS layer.

In most cases, the crystal part included in the CAAC-OS layer fits inside a cube whose one side is less than 100 nm. In an image obtained with a transmission electron microscope (TEM), a boundary between crystal parts in the CAAC-OS layer are not clearly detected. Further, with the TEM, a grain boundary in the CAAC-OS layer is not clearly found. Thus, in the CAAC-OS layer, a reduction in electron mobility, due to the grain boundary, is suppressed.

In each of the crystal parts included in the CAAC-OS layer, for example, a c-axis is aligned in a direction parallel to a normal vector of a surface where the CAAC-OS layer is formed or a normal vector of a surface of the CAAC-OS layer. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5.

In the CAAC-OS layer, distribution of crystal parts is not necessarily uniform. For example, in the formation process of the CAAC-OS layer, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS layer, the crystal part in a region to which the impurity is added becomes diminished in some cases.

Since the c-axes of the crystal parts included in the CAAC-OS layer are aligned in the direction parallel to a normal vector of a surface where the CAAC-OS layer is formed or a normal vector of a surface of the CAAC-OS layer, the directions of the c-axes may be different from each other depending on the shape of the CAAC-OS layer (the cross-sectional shape of the surface where the CAAC-OS layer is formed or the cross-sectional shape of the surface of the CAAC-OS layer). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS layer is formed or a normal vector of the surface of the CAAC-OS layer.

In a field-effect transistor that uses an oxide semiconductor layer including the CAAC-OS as a channel formation layer, a change in electric characteristics due to irradiation with visible light or ultraviolet light can be reduced; thus, the transistor has high reliability.

The regions 404a and 404b illustrated in FIG. 16B are doped with a dopant and function as a source and a drain of the transistor. As the dopant, at least one of elements of Group 13 in the periodic table (e.g., boron), elements of Group 15 in the periodic table (e.g., one or more of nitrogen, phosphorus, and arsenic), and rare gas elements (e.g., one or more of helium, argon, and xenon) can be used, for example. A region functioning as a source of the transistor can be called source region, and a region functioning as a drain of the transistor can be called drain region. Addition of the dopant to the regions 404a and 404b can reduce the resistance between the regions 404a and 404b and the conductive layers.

The conductive layers 405a_A, 405b_A, 405a_B, and 405b_B each function as the source or the drain of the transistor. Note that a layer functioning as a source of the transistor can be called source electrode or source wiring, and a layer functioning as a drain of the transistor can be called drain electrode or drain wiring.

The conductive layers 405a_A, 405b_A, 405a_B, and 405b_B can be formed using, for example, a layer including a metal material such as aluminum, magnesium, chromium, copper, tantalum, titanium, molybdenum, or tungsten or an alloy material containing any of the above metal materials as a main component.

As the insulating layer 406, for example, a layer including a material that can be used for the insulating layers 402_A and 402_B can be used.

As the insulating layer 407, for example, a layer including a material that can be used for the insulating layers 402_A and 402_B can be used.

In the case where an oxide semiconductor layer is used as the semiconductor layer 403_A or the semiconductor layer 403_B, for example, dehydration or dehydrogenation is performed; thus, impurities such as hydrogen, water, a hydroxyl group, and a hydride (also referred to as hydrogen compound) are removed from the oxide semiconductor layer, and in addition, oxygen is supplied to the oxide semiconductor layer. In such a manner, the oxide semiconductor layer can be highly purified. For example, a layer containing oxygen is used as the layer in contact with the oxide semiconductor layer, and heat treatment is performed; thus, the oxide semiconductor layer can be highly purified.

For example, heat treatment is performed at a temperature higher than or equal to 400° C. and lower than or equal to 750° C., or higher than or equal to 400° C. and lower than the strain point of the substrate. Heat treatment may be further performed in a later step. As a heat treatment apparatus for the heat treatment, for example, a rapid thermal anneal (RTA) apparatus such as a gas rapid thermal anneal (GRTA) apparatus or a lamp rapid thermal anneal (LRTA) apparatus can be used. As the high-temperature gas, a rare gas or an inert gas (e.g., nitrogen) which does not react with the object by the heat treatment can be used.

Further, after the heat treatment is performed and while the heating temperature is being maintained or being decreased, a high-purity oxygen gas, a high-purity $N_2O$ gas, or ultra-dry air (having a dew point $-40°$ C. or lower, preferably $-60°$ C. or lower) may be introduced into the furnace where the heat treatment has been performed. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, further preferably 7N or higher; that is, the impurity concentration in the oxygen gas or the $N_2O$ gas is preferably 1 ppm or lower, further preferably 0.1 ppm or lower. By the action of the oxygen gas or the $N_2O$ gas, oxygen is supplied to the oxide semiconductor layer, and defects due to oxygen vacancy in the oxide semiconductor layer can be reduced. Note that the high-purity oxygen gas, high-purity $N_2O$ gas, or ultra-dry air may be introduced during the heat treatment.

With the use of the highly purified oxide semiconductor layer for the transistor, the carrier density of the oxide semiconductor layer can be lower than $1\times10^{14}/cm^3$, preferably lower than $1\times10^{12}/cm^3$, further preferably lower than $1\times10^{11}/cm^3$, so that the threshold voltage of the transistor can be positively shifted to make the transistor normally off. The off-state current of the transistor per micrometer of channel width can be 10 aA ($1\times10^{-17}$ A) or less, 1 aA ($1\times10^{-18}$ A) or less, 10 zA ($1\times10^{-20}$ A) or less, further 1 zA ($1\times10^{-21}$ A) or less, and furthermore 100 yA ($1\times10^{-22}$ A) or less. It is preferable that the off-state current of the transistor be as low as possible; the lower limit of the off-state current of the transistor in this embodiment is estimated to be about $10^{-30}$ A/μm.

As described with reference to FIGS. 16A and 16B, a semiconductor device can be formed by using an example of the transistor of this embodiment as a transistor in the semiconductor device of one embodiment of the present invention.

Embodiment 4

In this embodiment, examples of a structure of a semiconductor device of one embodiment of the present invention will be described.

Figure 17A:
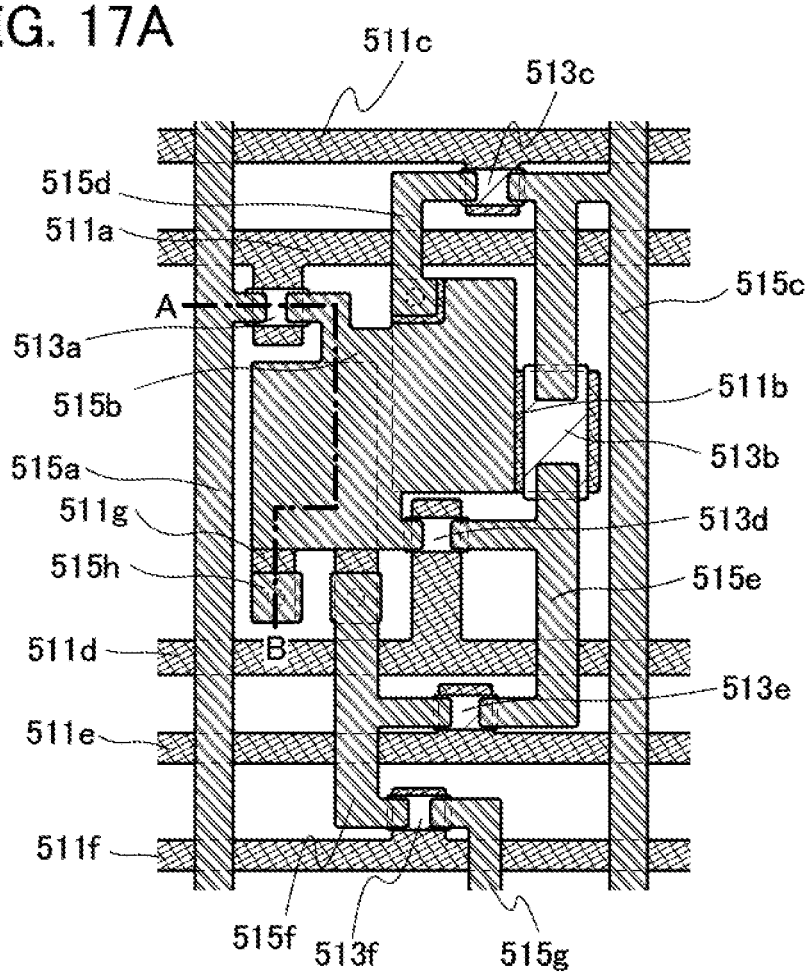
FIGS. 17A and 17B illustrate an example of a structure of a semiconductor device.
Figure 17B:
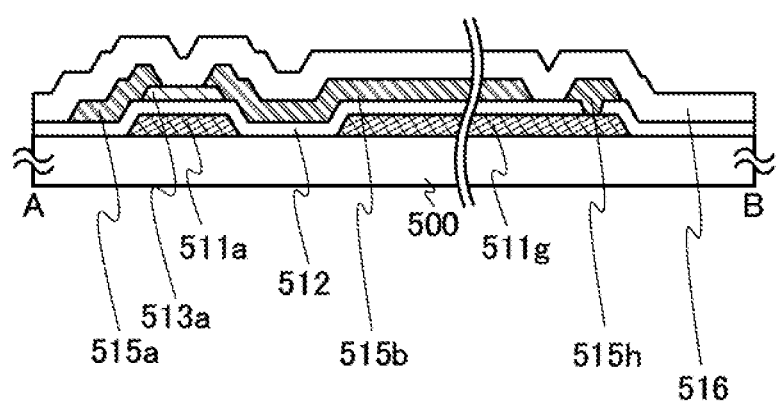

An example of a structure of the semiconductor device in this embodiment is described with reference to FIGS. 17A and 17B. FIG. 17A is a schematic plan view and FIG. 17B is a schematic cross-sectional view taken along line A-B in FIG. 17A. Note that the components illustrated in FIGS. 17A and 17B may have sizes different from the actual sizes. For convenience, in FIG. 17B, part of a cross section taken along line A-B in FIG. 17A is omitted. Note that FIGS. 17A and 17B show an example of a semiconductor device in which transistors used instead of the switches 113, 115, 116, 117, and 118 in FIG. 1A are provided; however, this embodiment is not limited thereto. The structure of the semiconductor device in this embodiment can be used for a semiconductor device with another structure.

The semiconductor device illustrated in FIGS. 17A and 17B includes conductive layers 511a to 511g, an insulating layer 512, semiconductor layers 513a to 513f, conductive layers 515a to 515h, and an insulating layer 516.

The conductive layers 511a to 511g are provided on one plane of a substrate 500.

The conductive layer 511a functions as, for example, a gate of the transistor used instead of the switch 113 in the semiconductor device illustrated in FIG. 1A and a wiring.

The conductive layer 511b functions as, for example, a gate of the transistor 114 in the semiconductor device illustrated in FIG. 1A and the other of the pair of electrodes of the capacitor 111 in the semiconductor device illustrated in FIG. 1A.

The conductive layer 511c functions as, for example, a gate of the transistor used instead of the switch 115 in the semiconductor device illustrated in FIG. 1A and a wiring.

The conductive layer 511d functions as, for example, a gate of the transistor used instead of the switch 116 in the semiconductor device illustrated in FIG. 1A and a wiring.

The conductive layer 511e functions as, for example, a gate of the transistor used instead of the switch 117 in the semiconductor device illustrated in FIG. 1A and a wiring.

The conductive layer 511f functions as, for example, a gate of the transistor used instead of the switch 118 in the semiconductor device illustrated in FIG. 1A and a wiring.

The conductive layer 511g functions as, for example, the other of the pair of electrodes of the capacitor 112 in the semiconductor device illustrated in FIG. 1A. Note that in the case where a plurality of unit circuits are provided, the area of one or both of the capacitors 111 and 112 may be different among the plurality of unit circuits.

The insulating layer 512 is provided over one plane of the substrate 500 with the conductive layers 511a to 511g laid therebetween.

The insulating layer 512 functions as, for example, a dielectric layer of the capacitor 111 in the semiconductor device illustrated in FIG. 1A, a dielectric layer of the capacitor 112 in the semiconductor device illustrated in FIG. 1A, a gate insulating layer of the transistor used instead of the switch 113 in the semiconductor device illustrated in FIG. 1A, the gate insulating layer of the transistor 114 in the semiconductor device illustrated in FIG. 1A, a gate insulating layer of the transistor used instead of the switch 115 in the semiconductor device illustrated in FIG. 1A, a gate insulating layer of the transistor used instead of the switch 116 in the semiconductor device illustrated in FIG. 1A, a gate insulating layer of the transistor used instead of the switch 117 in the semiconductor device illustrated in FIG. 1A, and a gate insulating layer of the transistor used instead of the switch 118 in the semiconductor device illustrated in FIG. 1A.

The semiconductor layer 513a overlaps the conductive layer 511a with the insulating layer 512 laid therebetween.

The semiconductor layer 513a functions as, for example, a channel formation layer of the transistor used instead of the switch 113 in the semiconductor device illustrated in FIG. 1A.

The semiconductor layer 513b overlaps the conductive layer 511b with the insulating layer 512 laid therebetween.

The semiconductor layer 513b functions as, for example, a channel formation layer of the transistor 114 in the semiconductor device illustrated in FIG. 1A. The area of the semiconductor layer 513b is larger than the area of a semiconductor layer which functions as a channel formation layer of each of the other transistors serving as switches. Although this embodiment is not necessarily limited thereto, a large area of the semiconductor layer 513b enables the amount of current flowing between the source and the drain of the transistor 114 to be adjusted.

The semiconductor layer 513c overlaps the conductive layer 511c with the insulating layer 512 laid therebetween.

The semiconductor layer 513c functions as, for example, a channel formation layer of the transistor used instead of the switch 115 in the semiconductor device illustrated in FIG. 1A.

The semiconductor layer 513d overlaps the conductive layer 511d with the insulating layer 512 laid therebetween.

The semiconductor layer 513d functions as, for example, a channel formation layer of the transistor used instead of the switch 116 in the semiconductor device illustrated in FIG. 1A.

The semiconductor layer 513e overlaps the conductive layer 511e with the insulating layer 512 laid therebetween.

The semiconductor layer 513e functions as, for example, a channel formation layer of the transistor used instead of the switch 117 in the semiconductor device illustrated in FIG. 1A.

The semiconductor layer 513f overlaps the conductive layer 511f with the insulating layer 512 laid therebetween.

The semiconductor layer 513f functions as, for example, a channel formation layer of the transistor used instead of the switch 118 in the semiconductor device illustrated in FIG. 1A.

The conductive layer 515a is connected to the semiconductor layer 513a.

The conductive layer 515a functions as, for example, one of a source and a drain of the transistor used instead of the switch 113 in the semiconductor device illustrated in FIG. 1A and the wiring 101 in the semiconductor device illustrated in FIG. 1A.

The conductive layer 515b is connected to the semiconductor layer 513a. The conductive layer 515b overlaps the conductive layer 511b with the insulating layer 512 laid therebetween. The conductive layer 515b overlaps the conductive layer 511g with the insulating layer 512 laid therebetween. The conductive layer 515b is connected to the semiconductor layer 513d.

The conductive layer 515b functions as, for example, the one of the pair of electrodes of the capacitor 111 in the semiconductor device illustrated in FIG. 1A, the one of the pair of electrodes of the capacitor 112 in the semiconductor device illustrated in FIG. 1A, and the other of the source and the drain of the transistor used instead of the switch 113 in the semiconductor device illustrated in FIG. 1A.

The conductive layer 515c is connected to the semiconductor layer 513b. The conductive layer 515c is connected to the semiconductor layer 513c.

The conductive layer 515c functions as, for example, the one of the source and the drain of the transistor 114 in the semiconductor device illustrated in FIG. 1A, one of a source and a drain of the transistor used instead of the switch 115 in the semiconductor device illustrated in FIG. 1A, and the wiring 102 in the semiconductor device illustrated in FIG. 1A.

The conductive layer 515d is connected to the semiconductor layer 513c. The conductive layer 515d is connected to the conductive layer 511b through an opening penetrating the insulating layer 512.

The conductive layer 515d functions as, for example, the other of the source and the drain of the transistor used instead of the switch 115 in the semiconductor device illustrated in FIG. 1A.

The conductive layer 515e is connected to the semiconductor layer 513b. The conductive layer 515e is connected to the semiconductor layer 513d. The conductive layer 515e is connected to the semiconductor layer 513e.

The conductive layer 515e functions as, for example, the other of the source and the drain of the transistor 114 in the semiconductor device illustrated in FIG. 1A, the other of the source and the drain of the transistor used instead of the switch 116 in the semiconductor device illustrated in FIG. 1A, and one of a source and a drain of the transistor used instead of the switch 117.

The conductive layer 515f is connected to the semiconductor layer 513e. The conductive layer 515f is connected to the semiconductor layer 513f. The conductive layer 515f is connected to the conductive layer 511g through an opening penetrating the insulating layer 512.

The conductive layer 515f functions as, for example, the other of the source and the drain of the transistor used instead of the switch 117 in the semiconductor device illustrated in FIG. 1A and the other of the source and the drain of the transistor used instead of the switch 118 in the semiconductor device illustrated in FIG. 1A.

The conductive layer 515g is connected to the semiconductor layer 513f.

The conductive layer 515g functions as, for example, one of a source and a drain of the transistor used instead of the switch 118 in the semiconductor device illustrated in FIG. 1A and the wiring 103 in the semiconductor device illustrated in FIG. 1A.

The conductive layer 515h is connected to the conductive layer 511g through an opening penetrating the insulating layer 512.

The insulating layer 516 is provided over one plane of the insulating layer 512 with the semiconductor layers 513a to 513f and the conductive layers 515a to 515h laid therebetween.

Figure 18A:
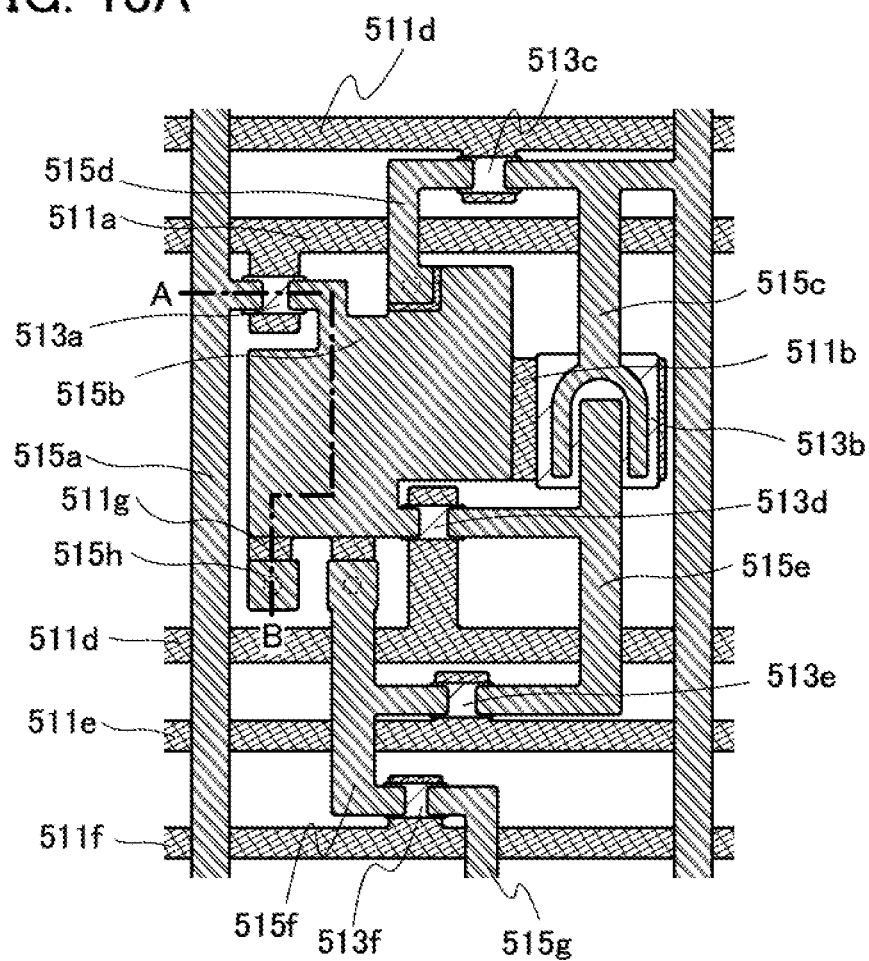
FIGS. 18A and 18B illustrate an example of a structure of a semiconductor device.
Figure 18B:
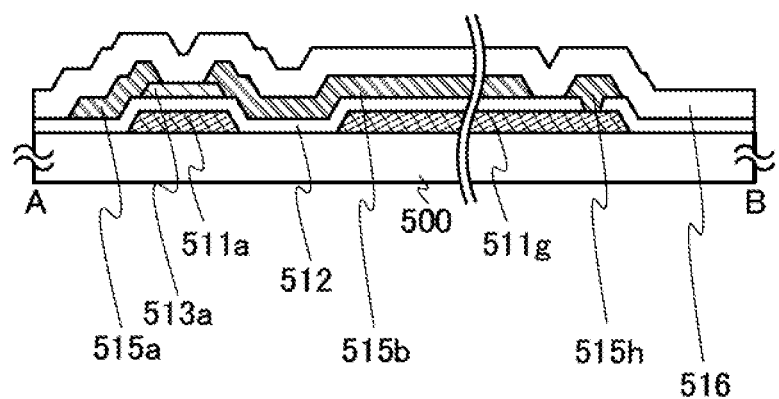

Another example of the structure of the semiconductor device in this embodiment will be described with reference to FIGS. 18A and 18B. A semiconductor device illustrated in FIGS. 18A and 18B has the conductive layers 515c and 515e different from those in the semiconductor device illustrated in FIGS. 17A and 17B in shapes. In this case, the conductive layer 515c has a U-shape part which overlaps with the semiconductor layer 513b.

Figure 19A:
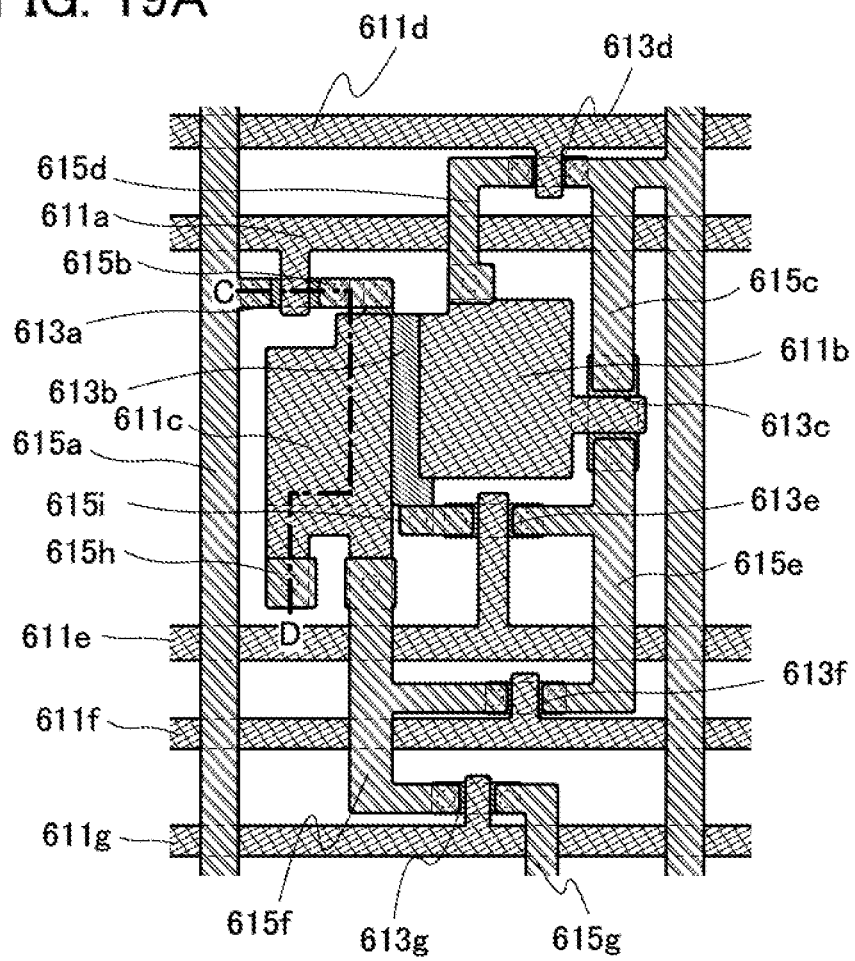
FIGS. 19A and 19B illustrate an example of a structure of a semiconductor device.
Figure 19B:
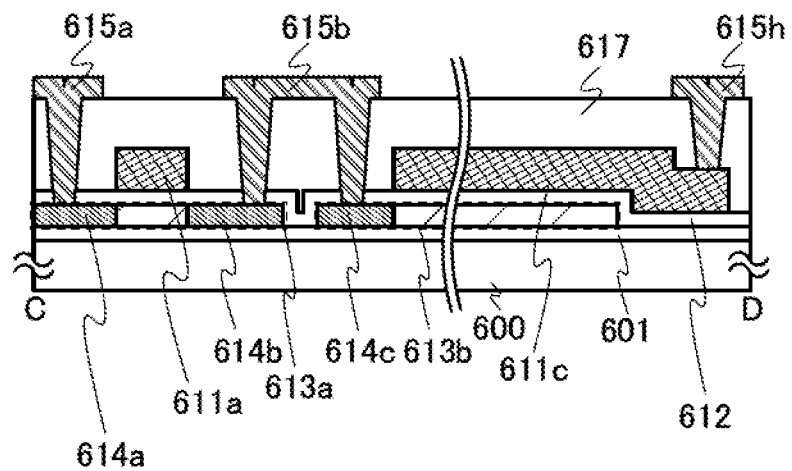

Another example of the structure of the semiconductor device in this embodiment will be described with reference to FIGS. 19A and 19B. FIG. 19A is a schematic plan view and FIG. 19B is a schematic cross-sectional view taken along line C-D in FIG. 19A. Note that the components illustrated in FIGS. 19A and 19B include those having sizes different from the actual sizes. For convenience, in FIG. 19B, part of a cross section taken along line C-D in FIG. 19A is omitted.

The semiconductor device illustrated in FIGS. 19A and 19B includes an insulating layer 601, conductive layers 611a to 611g, an insulating layer 612, semiconductor layers 613a to 613g, conductive layers 615a to 615i, and an insulating layer 617.

The semiconductor layers 613a to 613g are provided over one plane of a substrate 600 with the insulating layer 601 laid therebetween.

The semiconductor layer 613a functions as, for example, a channel formation layer of the transistor used instead of the switch 113 in the semiconductor device illustrated in FIG. 1A.

The semiconductor layer 613b functions as, for example, the one of the pair of electrodes of the capacitor 111 in the semiconductor device illustrated in FIG. 1A and the other of the pair of electrodes of the capacitor 112 in the semiconductor device illustrated in FIG. 1A. Note that in the case where a plurality of unit circuits are provided, the area of one or both of the capacitors 111 and 112 may be different among the plurality of unit circuits.

The semiconductor layer 613c functions as, for example, the channel formation layer of the transistor 114 in the semiconductor device illustrated in FIG. 1A.

The semiconductor layer 613d functions as, for example, the channel formation layer of the transistor used instead of the switch 115 in the semiconductor device illustrated in FIG. 1A.

The semiconductor layer 613e functions as, for example, the channel formation layer of the transistor used instead of the switch 116 in the semiconductor device illustrated in FIG. 1A.

The semiconductor layer 613f functions as, for example, the channel formation layer of the transistor used instead of the switch 117 in the semiconductor device illustrated in FIG. 1A.

The semiconductor layer 613g functions as, for example, the channel formation layer of the transistor used instead of the switch 118 in the semiconductor device illustrated in FIG. 1A.

The insulating layer 612 is provided over one plane of the substrate 600 with the insulating layer 601 and the semiconductor layers 613a to 613g laid therebetween.

The insulating layer 612 has a function as, for example, the dielectric layer of the capacitor 111 in the semiconductor device illustrated in FIG. 1A, the dielectric layer of the capacitor 112 in the semiconductor device illustrated in FIG. 1A, the gate insulating layer of the transistor used instead of the switch 113 in the semiconductor device illustrated in FIG. 1A, the gate insulating layer of the transistor 114 in the semiconductor device illustrated in FIG. 1A, the gate insulating layer of the transistor used instead of the switch 115 in the semiconductor device illustrated in FIG. 1A, the gate insulating layer of the transistor used instead of the switch 116 in the semiconductor device illustrated in FIG. 1A, the gate insulating layer of the transistor used instead of the switch 117, and the gate insulating layer of the transistor used instead of the switch 118 in the semiconductor device illustrated in FIG. 1A.

The conductive layer 611a overlaps the semiconductor layer 613a with the insulating layer 612 laid therebetween.

The conductive layer 611a functions as, for example, the gate of the transistor used instead of the switch 113 in the semiconductor device illustrated in FIG. 1A and a wiring.

The conductive layer 611b overlaps the semiconductor layers 613b and 613c with the insulating layer 612 laid therebetween.

The conductive layer 611b functions as, for example, the gate of the transistor 114 in the semiconductor device illustrated in FIG. 1A and the other of the pair of electrodes of the capacitor 111 in the semiconductor device illustrated in FIG. 1A.

The conductive layer 611c overlaps the semiconductor layer 613b with the insulating layer 612 laid therebetween.

The conductive layer 611c functions as, for example, the other of the pair of electrodes of the capacitor 112 in the semiconductor device illustrated in FIG. 1A.

The conductive layer 611d overlaps the semiconductor layer 613d with the insulating layer 612 laid therebetween.

The conductive layer 611d functions as, for example, the gate of the transistor used instead of the switch 115 in the semiconductor device illustrated in FIG. 1A and a wiring.

The conductive layer 611e overlaps the semiconductor layer 613e with the insulating layer 612 laid therebetween.

The conductive layer 611e functions as, for example, the gate of the transistor used instead of the switch 116 in the semiconductor device illustrated in FIG. 1A and a wiring.

The conductive layer 611f overlaps the semiconductor layer 613f with the insulating layer 612 laid therebetween.

The conductive layer 611f functions as, for example, the gate of the transistor used instead of the switch 117 in the semiconductor device illustrated in FIG. 1A and a wiring.

The conductive layer 611g overlaps the semiconductor layer 613g with the insulating layer 612 laid therebetween.

The conductive layer 611g functions as, for example, the gate of the transistor used instead of the switch 118 in the semiconductor device illustrated in FIG. 1A and a wiring.

The insulating layer 617 is provided over one plane of the insulating layer 612 with the conductive layers 611a to 611g laid therebetween.

The conductive layer 615a is connected to the semiconductor layer 613a through an opening penetrating the insulating layers 612 and 617.

The conductive layer 615b is connected to the semiconductor layer 613a through an opening penetrating the insulating layers 612 and 617. The conductive layer 615b is connected to the semiconductor layer 613b through an opening penetrating the insulating layers 612 and 617.

The conductive layer 615c is connected to the semiconductor layer 613c through an opening penetrating the insulating layers 612 and 617. The conductive layer 615c is connected to the semiconductor layer 613d through an opening penetrating the insulating layers 612 and 617.

The conductive layer 615d is connected to the semiconductor layer 613b through an opening penetrating the insulating layers 612 and 617. The conductive layer 615d is connected to the conductive layer 611b through an opening penetrating the insulating layer 617.

The conductive layer 615e is connected to the semiconductor layer 613c through an opening penetrating the insulating layers 612 and 617. The conductive layer 615e is connected to the semiconductor layer 613e through an opening penetrating the insulating layers 612 and 617. The conductive layer 615e is connected to the semiconductor layer 613f through an opening penetrating the insulating layers 612 and 617.

The conductive layer 615f is connected to the semiconductor layer 613f through an opening penetrating the insulating layers 612 and 617. The conductive layer 615f is connected to the semiconductor layer 613g through an opening penetrating the insulating layers 612 and 617. The conductive layer 615f is connected to the conductive layer 611c through an opening penetrating the insulating layer 617.

The conductive layer 615g is connected to the semiconductor layer 613g through an opening penetrating the insulating layers 612 and 617.

The conductive layer 615h is connected to the conductive layer 611c through an opening penetrating the insulating layer 617.

The conductive layer 615i is connected to the semiconductor layer 613b through an opening penetrating the insulating layers 612 and 617. The conductive layer 615i is connected to the semiconductor layer 613e through an opening penetrating the insulating layers 612 and 617.

Figure 20:
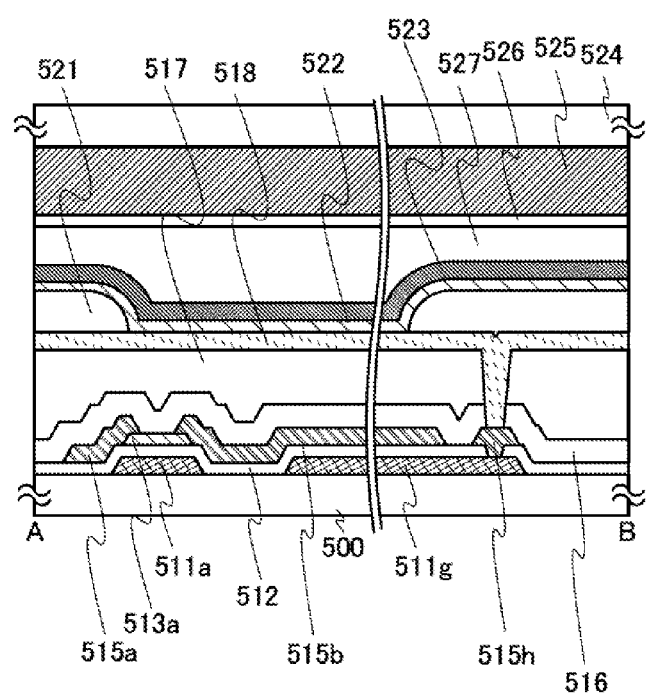
FIG. 20 illustrates an example of a structure of a semiconductor device.

Further, an example of a structure of a semiconductor device including a light-emitting element will be described with reference to FIG. 20. FIG. 20 is a schematic cross-sectional view illustrating an example of a structure of a display device in this embodiment. Note that in this embodiment, a light-emitting element in the display device emits light toward the top side of the display device; however, structures of display devices of the present invention are not limited thereto. The display device may emit light toward the bottom side or both the top and bottom sides.

The display device illustrated in FIG. 20 includes the structure of the semiconductor device illustrated in FIGS. 17A and 17B, an insulating layer 517, a conductive layer 518, an insulating layer 521, a light-emitting layer 522, a conductive layer 523, a substrate 524, a coloring layer 525, an insulating layer 526, and an insulating layer 527. Note that this embodiment is not limited thereto. For example, a semiconductor device including a light-emitting element may be formed using the structure of the semiconductor device illustrated in FIGS. 18A and 18B or FIGS. 19A and 19B.

The insulating layer 517 is provided over the insulating layer 516.

The conductive layer 518 is provided over the insulating layer 517 and is connected to the conductive layer 515$h$ through an opening penetrating the insulating layers 516 and 517.

The conductive layer 518 functions as an electrode of a light-emitting diode, for example.

The insulating layer 521 is provided over the conductive layer 518.

The light-emitting layer 522 is provided over the insulating layer 521 and is connected to the conductive layer 518 through an opening penetrating the insulating layer 521.

The light-emitting layer 522 functions as a light-emitting layer of the light-emitting diode, for example.

The conductive layer 523 is provided over the light-emitting layer 522 and is connected to the light-emitting layer 522.

The conductive layer 523 functions as an electrode of the light-emitting diode, for example.

The coloring layer 525 is provided on one plane of the substrate 524 so as to transmit light with a specific wavelength range which is emitted from the light-emitting layer 522.

The insulating layer 526 is provided over the one plane of the substrate 524 with the colored layer 525 laid therebetween.

The insulating layer 527 is provided between the insulating layer 526 and the conductive layer 523.

Further, the components of the semiconductor device illustrated in FIGS. 17A and 17B, 18A, 18B, 19A, 19B, and FIG. 20 will be described. Note that each layer can be a stack of a plurality of materials.

A glass substrate or a plastic substrate, for example, can be used for the substrates 500, 524, and 600. Note that the substrates 500, 524, and 600 are not necessarily provided.

As the insulating layer 601, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. For example, a silicon oxide layer, a silicon oxynitride layer, or the like can be used as the insulating layer 601. The oxide insulating layer may contain halogen. Note that the insulating layer 601 is not necessarily provided.

The conductive layers 511$a$ to 511$g$ and the conductive layers 611$a$ to 611$g$ each can be formed using a layer of a material which can be used for the conductive layer 401_A of the transistor in FIG. 16A, for example.

The semiconductor layers 513$a$ to 513$f$ and the semiconductor layers 613$a$ to 613$g$ each can be formed using a layer of a material which can be used for the semiconductor layer 403_A of the transistor in FIG. 16A, for example.

Each of the insulating layers 512 and 612 can be formed using a layer of a material which can be used for the insulating layer 402_A of the transistor in FIG. 16A, for example.

The conductive layers 515$a$ to 515$h$ and the conductive layers 615$a$ to 615$i$ each can be formed using a layer of a material which can be used for the conductive layers 405$a$_A and 405$b$_A of the transistor illustrated in FIG. 16A, for example.

The insulating layer 516 can be formed using a layer of a material which can be used for the insulating layer 406 in FIG. 16A, for example.

Each of the insulating layers 517 and 617 can be formed using a layer of a material which can be used for the insulating layer 512, for example.

The conductive layer 518 can be formed using a layer of a material which can be used for the conductive layers 515$a$ to 515$h$, for example.

The insulating layer 521 can be an organic insulating layer or an inorganic insulating layer, for example. Note that the insulating layer 521 is also referred to as a partition.

The light-emitting layer 522 is a layer which emits light of single color that is a specific color. As the light-emitting layer 522, for example, a light-emitting layer using a light-emitting material which emits light of specific one color can be used. The light-emitting layer 522 can also be formed using a stack of light-emitting layers which emit light of different colors. The light-emitting material can be an electroluminescent material such as a fluorescent material or a phosphorescent material. A material including a plurality of electroluminescent materials may be used as the light-emitting material. A light-emitting layer emitting white light may be formed by a stack of a layer of a fluorescent material emitting blue light, a layer of a first phosphorescent material emitting orange color, and a layer of a second phosphorescent material emitting orange color, for example. The electroluminescent material can be an organic electroluminescent material or an inorganic electroluminescent material. Further, the electroluminescent layer may be formed, for example, by, in addition to the above-described light-emitting layer, one or more of the following layers: a hole-injection layer, a hole-transport layer, an electron-transport layer, and an electron-injection layer.

The conductive layer 523 can be a layer of a light-transmitting material selected from the materials which can be used for the conductive layers 515$a$ to 515$h$ and the conductive layers 615$a$ to 615$i$.

The coloring layer 525 can be a layer which contains dye or pigment, for example, and which transmits light with the wavelength range of red, light with the wavelength range of green, or light with the wavelength range of blue. The coloring layer 525 can be formed using a layer which transmits cyan light, magenta light, or yellow light and which contains dye or pigment. When containing dye, the coloring layer 525 is formed by a photolithography method, a printing method, or an inkjet method, for example. When containing pigment, the coloring layer 525 is formed by a photolithography method, a printing method, an electrode-position method, an electrophotographic method, or the like. By using an inkjet method, for example, the coloring layer can be manufactured at room temperature, manufactured at a low vacuum, or formed over a large substrate. Since the coloring layer can be manufactured without a resist mask, manufacturing cost and the number of steps can be reduced.

The insulating layer 526 can be a layer of a material which can be used for the insulating layer 601. The insulating layer 526 can be a stack of materials which can be used for the insulating layer 526. Note that the insulating layer 526 is not necessarily provided; however, by providing the insulating layer 526, entry of an impurity from the coloring layer 525 to the light-emitting element can be prevented.

The insulating layer 527 can be a layer of a material which can be used for the insulating layer 601 or a layer of a resin material. The insulating layer 527 can be a stack of materials which can be used for the insulating layer 527.

As described with reference to FIGS. 17A and 17B and FIG. 20, the example of the semiconductor device in this embodiment includes a light-emitting element emitting light of a specific color, and a coloring layer which transmits light with a particular wavelength range emitted from the light-emitting element. The structure facilitates the manufacturing process and enhances yield. For example, a display element can be formed without a metal mask, therefore, a manufacturing process can be simple.

Further, in the example of the display device in this embodiment, a driver circuit may be provided over the substrate over which unit circuits are provided. In this case, the transistor in the circuit such as a driver circuit may have the same structure as the transistor in the unit circuit. A circuit such as the driver circuit is provided over the same substrate as the unit circuits, so that the number of connection wirings of the unit circuits and the driver circuit can be small.

Embodiment 5

In this embodiment, an example of a semiconductor device including a driver circuit will be described.

Next, an example of a structure of the semiconductor device in this embodiment is described with reference to FIGS. 21A and 21B.

Figure 21A:
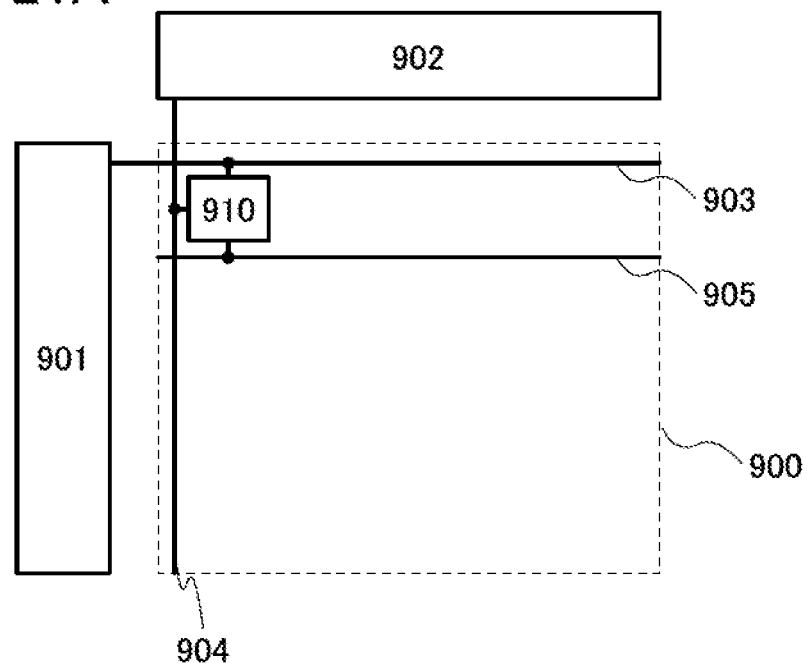
FIGS. 21A and 21B illustrate examples of a structure of a semiconductor device.

The semiconductor device illustrated in FIG. 21A includes a driver circuit (also referred to as Dry) 901, a driver circuit 902, a wiring 903, a wiring 904, a wiring 905, and a unit circuit (also referred to as UC) 910. Note that a plurality of unit circuits 910 may be provided. For example, when a plurality of unit circuits are provided as pixel circuits, a display device can be formed. Numeral 900 denotes a region in which the unit circuit 910 is provided.

The driver circuit 901 has a function of controlling the unit circuit 910 by inputting a potential or a signal to the unit circuit 910 through the wiring 903.

The driver circuit 901 is formed using a shift register, for example.

The driver circuit 902 has a function of controlling the unit circuit 910 by inputting a potential or a signal to the unit circuit 910 through the wiring 904.

The driver circuit 902 is formed using a shift register, for example.

Note that one of the driver circuits 901 and 902 may be provided over the same substrate as the unit circuit 910.

The wiring 905 can be a wiring for supplying a potential or a wiring for supplying a signal. The wiring 905 is connected to the driver circuit 901 or another circuit. Note that the number of the wirings 905 may be two or more.

Figure 21B:
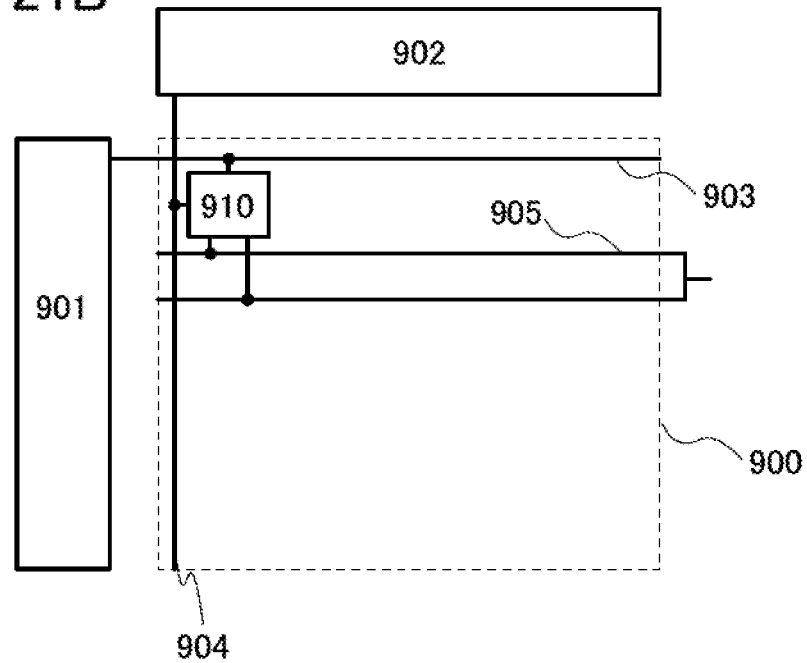

As illustrated in FIG. 21B, the wiring 905 may be a plurality of wirings which connect different elements in the unit circuit 910 and which connect each other outside a region 900 in which the unit circuit 910 is provided.

As described with reference to FIGS. 21A and 21B, in an example of the semiconductor device in this embodiment, a unit circuit and a driver circuit may be provided over the same substrate.

Embodiment 6

In this embodiment, an example of a semiconductor device functioning as an electronic module will be described.

Figure 22:
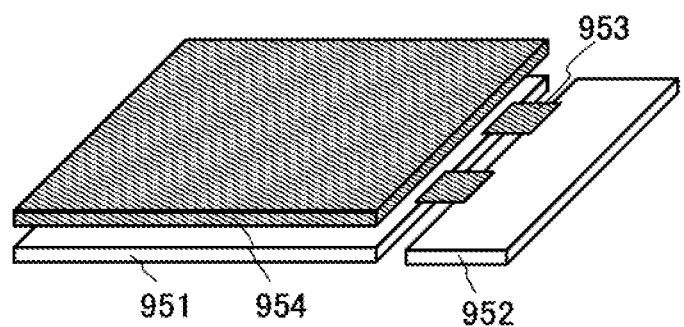
FIG. 22 illustrates an example of a structure of a semiconductor device.

An example of a structure of a semiconductor device in this embodiment will be described with reference to FIG. 22. FIG. 22 illustrates an example of a structure of the semiconductor device in this embodiment.

The semiconductor device illustrated in FIG. 22 includes a display panel 951, a circuit board 952 connected to the display panel 951 through a terminal 953, and a touch screen 954 overlapping the display panel 951.

The display panel 951 can employ a semiconductor device of one embodiment of the present invention.

A circuit having a function of controlling driving of the display panel 951 or the touch screen 954, or the like is provided in the circuit board 952, for example.

As the touch screen 954, one or more of a capacitive touch screen, a resistive touch screen, an optical touch screen, and the like can be used. Note that instead of or in addition to the touch screen 954, for example a display module may be provided by provision of a housing, a radiator plate, an optical film, a polarizing plate, a retardation film, a prism sheet, a diffusion plate, a backlight, and the like.

As illustrated in FIG. 22, the semiconductor device in this embodiment is formed using the semiconductor device described in the above embodiment and another component such as a touch screen.

Embodiment 7

In this embodiment, examples of an electronic device in which a housing is provided with a panel including any of the semiconductor devices in the above embodiment will be described with reference to FIGS. 23A to 23D.

Figure 23A:
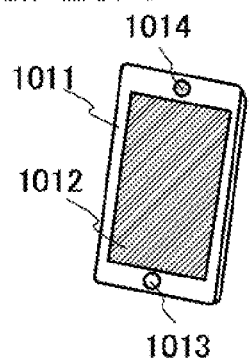
FIGS. 23A to 23D illustrate examples of electronic devices.

An electronic device in FIG. 23A is an example of a mobile information terminal.

The electronic device illustrated in FIG. 23A includes a housing 1011 and a panel 1012, a button 1013, and a speaker 1014 which are provided for the housing 1011.

Note that the housing 1011 may be provided with a connection terminal for connecting the electronic device illustrated in FIG. 23A to an external device and/or a button used to operate the electronic device illustrated in FIG. 23A.

The panel 1012 functions as a display panel and a touch screen. The panel 1012 can be a panel formed by superposing a touch screen on the semiconductor device of one embodiment of the present invention.

The button 1013 is provided for the housing 1011. For example, when the button 1013 is provided and has a function as a power button, whether power is supplied to circuits in the electronic device can be controlled by pressing the button 1013.

The speaker 1014 is provided for the housing 1011. The speaker 1014 has a function of outputting sound.

The housing 1011 may be provided with a microphone, in which case the electronic device in FIG. 23A can function as a telephone, for example.

The electronic device illustrated in FIG. 23A functions as one or more of a telephone set, an e-book reader, a personal computer, and a game machine, for example.

Figure 23B:
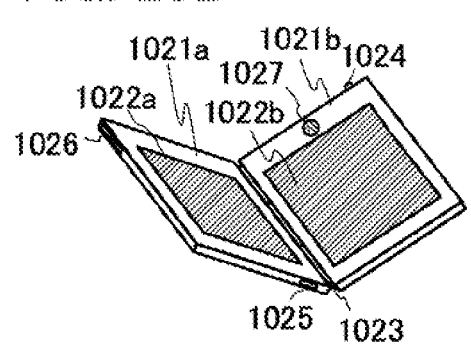

An electronic device illustrated in FIG. 23B is an example of a folding digital assistant.

The electronic device illustrated in FIG. 23B includes a housing 1021*a*, a housing 1021*b*, a panel 1022*a* incorporated in the housing 1021*a*, a panel 1022*b* incorporated in the housing 1021*b*, a hinge 1023, a button 1024, a connection terminal 1025, a storage medium insertion portion 1026, and a speaker 1027.

The housing 1021*a* and the housing 1021*b* are connected by the hinge 1023.

The panels 1022*a* and 1022*b* each function as a display panel and a touch screen. Each of the panels 1022*a* and 1022*b* can be a panel formed by superposing a touch screen on the semiconductor device of one embodiment of the present invention.

Since the electronic device illustrated in FIG. 23B has the hinge 1023, the housing 1021*a* or the housing 1021*b* can be moved to overlap the housing 1021*a* with the housing 1021*b*, for example; that is, the electronic device can fold.

The button 1024 is provided for the housing 1021*b*. Note that the housing 1021*a* may also be provided with the button 1024. For example, when the button 1024 is provided and has a function as a power button, whether power is supplied to circuits in the electronic device can be controlled by pressing the button 1024.

The connection terminal 1025 is provided for the housing 1021*a*. Note that the housing 1021*b* may be provided with the connection terminal 1025. A plurality of connection terminals 1025 may be provided on one or both of the housings 1021*a* and the housing 1021*b*. The connection terminal 1025 is a terminal for connecting the electronic device illustrated in FIG. 23B to another device.

The storage media inserting portion 1026 is provided for the housing 1021*a*. Note that the storage medium insertion portion 1026 may be provided on the housing 1021*b*. A plurality of storage medium insertion portions 1026 may be provided on one or both of the housings 1021*a* and 1021*b*. For example, when a card storage medium is inserted into the storage medium insertion portion, data can be read from the card storage medium and written to the electronic device, or data can be read from the electronic device and written to the card storage medium.

The speaker 1027 is provided for the housing 1021*b*. The speaker 1027 has a function of outputting sound. Note that the speaker 1027 may be provided for the housing 1021*a* instead of the housing 1021*b*.

The housing 1021*a* or the housing 1021*b* may be provided with a microphone, in which case the electronic device in FIG. 23B can function as a telephone, for example.

The electronic device illustrated in FIG. 23B has functions as one or more of a telephone set, an e-book reader, a personal computer, and a game machine, for example.

Figure 23C:
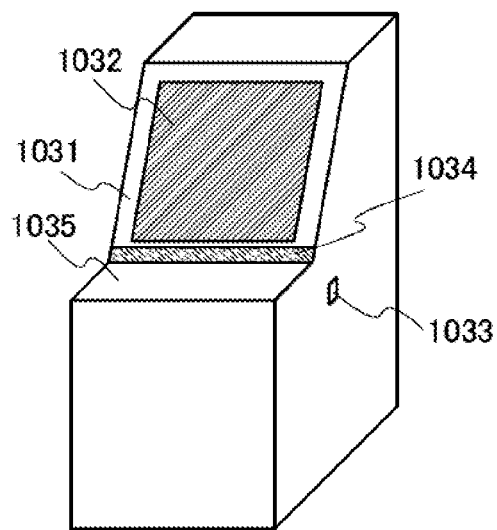

The electronic device in FIG. 23C is an example of a stationary information terminal. The stationary information terminal illustrated in FIG. 23C includes a housing 1031, and a panel 1032, a button 1033, and a speaker 1034 that are provided for the housing 1031.

The panel 1032 has functions as a display panel and a touch screen. The panel 1032 can be a panel formed by superposing a touch screen on the semiconductor device of one embodiment of the present invention.

Note that the panel 1032 may be provided on a top board 1035 of the housing 1031.

The housing 1031 may be provided with one or more of a ticket slot from which a ticket or the like is dispensed, a coin slot, and a bill slot.

The button 1033 is provided for the housing 1031. For example, when the button 1033 is provided and has a function as a power button, whether power is supplied to circuits in the electronic device can be controlled by pressing the button 1033.

The speaker 1034 is provided for the housing 1031. The speaker 1034 has a function of outputting sound.

The electronic device illustrated in FIG. 23C functions as, for example, an automated teller machine, an information communication terminal for ordering a ticket or the like (also referred to as a multi-media station), or a game machine.

Figure 23D:
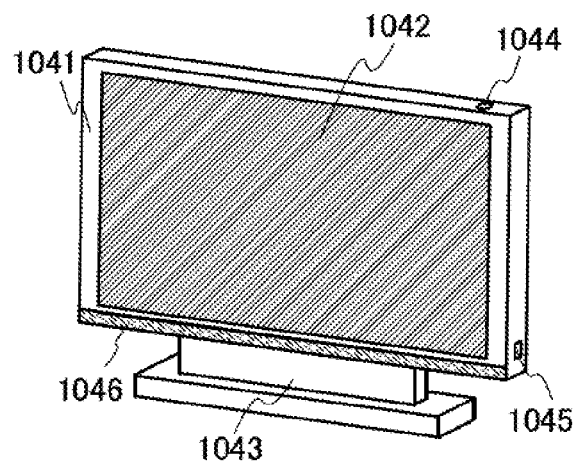

FIG. 23D shows an example of a stationary information terminal. The electronic device in FIG. 23D includes a housing 1041, a panel 1042 incorporated in the housing 1041, a support 1043 for supporting the housing 1041, a button 1044, a connection terminal 1045, and a speaker 1046.

Note that a connection terminal for connecting the electronic device illustrated in FIG. 23D to an external device and/or a button used to operate the electronic device illustrated in FIG. 23D may be provided in the housing 1041.

The panel 1042 has a function as a display panel. The semiconductor device of one embodiment of the present invention can be applied to the panel 1042. The panel 1042 may also function as a touch screen by superposing a touch screen on the semiconductor device of one embodiment of the present invention.

The button 1044 is provided for the housing 1041. For example, when the button 1044 is provided and has a function as a power button, whether power is supplied to circuits in the electronic device can be controlled by pressing the button 1044.

The connection terminal 1045 is provided for the housing 1041. The connection terminal 1045 is a terminal for connecting the electronic device in FIG. 23D to another device. For example, connecting the electronic device illustrated in FIG. 23D and a personal computer with the connection terminal 1045 enables the panel 1042 to display an image corresponding to a data signal input from the personal computer. For example, when the panel 1042 of the electronic device illustrated in FIG. 23D is larger than a panel of an electronic device connected thereto, a displayed image of the electronic device can be enlarged, in which case a plurality of viewers can recognize the image at the same time with ease.

The speaker 1046 is provided for the housing 1041. The speaker 1046 has a function of outputting sound.

The electronic device illustrated in FIG. 23D functions as, for example, an output monitor, a personal computer, or a television set.

As described with reference to FIGS. 23A to 23D, the semiconductor device of one embodiment of the present invention can be used for a panel.

Note that in this specification or the like, a circuit described with reference to various diagrams is a circuit structure example; thus, a transistor can be additionally provided. In contrast, for each node in the circuit diagram, it is possible not to provide an additional transistor, switch, passive element, or the like. For example, it is possible not to provide an additional transistor that is directly connected to a node.

Note that in this specification and the like, in a diagram or a text described in one embodiment, part of the diagram or the text is taken out, and one embodiment of the invention may be constituted. Thus, in the case where a diagram or a text related to a certain portion is described, the context taken out from part of the diagram or the text can be one embodiment of the invention. Therefore, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like can be taken out to constitute one embodiment of the invention. For example, from a circuit diagram in which X circuit elements (such as transistors or capacitors, where X is an integer) are provided, Y circuit elements (such as transistors or capacitors, where Y is an integer smaller than X) may be taken out to construct one embodiment of the invention. As another example, it is possible to take out Y pieces of layers from a cross-sectional view in which X pieces of layers are illustrated and constitute one embodiment of the invention. As another example, it is possible to constitute one embodiment of the invention by taking out Y elements from a timing chart in which X elements are provided.

Note that in the case where at least one specific example is described in a diagram or a text described in one embodiment in this specification and the like, it is easy for those skilled in the art to derive a broader concept of the specific example. Therefore, in the diagram or the text described in one embodiment, in the case where at least one specific example is described, a broader concept of the specific example is disclosed as one embodiment of the invention, and one embodiment of the invention can be constituted.

Note that, in this specification and the like, a content described in at least a diagram (which may be part of the diagram) is disclosed as one embodiment of the invention and can constitute one embodiment of the invention. Therefore, when a certain content is described in a diagram, the content is disclosed as an embodiment of the invention even when the content is not described with a text, and one embodiment of the invention can be constituted. Similarly, part of a diagram that is taken out from the diagram is disclosed as one embodiment of the invention, and one embodiment of the invention can be constituted.

This application is based on Japanese Patent Application serial no. 2012-066111 filed with Japan Patent Office on Mar. 22, 2012, the entire contents of which are hereby incorporated by reference.

What is claimed is:

1. A semiconductor device comprising:
a first wiring;
a first capacitor;
a second capacitor;
a first switch having a function of controlling electrical connection between the first wiring and one of a pair of electrodes of the first capacitor and between the first wiring and one of a pair of electrodes of the second capacitor;
a second wiring;
a third wiring;
a load including two terminals one of which is directly connected to the other of the pair of electrodes of the second capacitor and the other of which is electrically connected to the third wiring;
a transistor one of a source and a drain of which is electrically connected to the second wiring and a gate of which is electrically connected to the other of the pair of electrodes of the first capacitor;
a second switch having a function of controlling electrical connection between the gate of the transistor and the one of the source and the drain of the transistor;
a third switch having a function of controlling electrical connection between the other of the source and the drain of the transistor and the one of the pair of electrodes of the first capacitor; and
a fourth switch having a function of controlling electrical connection between the other of the pair of electrodes of the second capacitor and the other of the source and the drain of the transistor.

2. An electronic device comprising the semiconductor device according to claim 1.

3. A display module comprising:
the semiconductor device according to claim 1; and
a touch screen.

4. An electronic device comprising the display module according to claim 3.

5. A semiconductor device comprising:
a first wiring;
a first capacitor;
a second capacitor;
a first switch having a function of controlling electrical connection between the first wiring and one of a pair of electrodes of the first capacitor and between the first wiring and one of a pair of electrodes of the second capacitor;
a second wiring;
a transistor one of a source and a drain of which is electrically connected to the second wiring and a gate of which is electrically connected to the other of the pair of electrodes of the first capacitor;
a second switch having a function of controlling electrical connection between the gate of the transistor and the one of the source and the drain of the transistor;
a third switch having a function of controlling electrical connection between the other of the source and the drain of the transistor and the one of the pair of electrodes of the first capacitor;
a fourth switch having a function of controlling electrical connection between the other of the pair of electrodes of the second capacitor and the other of the source and the drain of the transistor;
a third wiring;
a fourth wiring;
a load including two terminals one of which is directly connected to the other of the pair of electrodes of the second capacitor and the other of which is electrically connected to the fourth wiring; and
a fifth switch having a function of controlling electrical connection between the third wiring and the other of the pair of electrodes of the second capacitor,
wherein the other of the pair of electrodes of the second capacitor is directly connected to the other of the source and the drain of the fourth switch.

6. An electronic device comprising the semiconductor device according to claim 5.

7. A display module comprising:
the semiconductor device according to claim 5; and
a touch screen.

8. An electronic device comprising the display module according to claim 7.

9. The semiconductor device according to claim 1, wherein the load is a display element or a light-emitting element.

10. The semiconductor device according to claim 5, wherein the load is a display element or a light-emitting element.

11. A semiconductor device comprising:
a first wiring;

a first capacitor;

a second capacitor;

a first switch having a function of controlling electrical connection between the first wiring and one of a pair of electrodes of the first capacitor and between the first wiring and one of a pair of electrodes of the second capacitor;

a second wiring;

a third wiring;

a load including two terminals one of which is directly connected to the other of the pair of electrodes of the second capacitor and the other of which is electrically connected to the third wiring;

a transistor one of a source and a drain of which is electrically connected to the second wiring and a gate of which is electrically connected to the other of the pair of electrodes of the first capacitor;

a second switch having a function of controlling electrical connection between the gate of the transistor and the one of the source and the drain of the transistor;

a third switch having a function of controlling electrical connection between the other of the source and the drain of the transistor and the one of the pair of electrodes of the second capacitor; and a fourth switch having a function of controlling electrical connection between the other of the pair of electrodes of the second capacitor and the other of the source and the drain of the transistor.

12. An electronic device comprising the semiconductor device according to claim 11.

13. A display module comprising:

the semiconductor device according to claim 11; and a touch screen.

14. An electronic device comprising the display module according to claim 13.

15. The semiconductor device according to claim 13, wherein the load is a display element or a light-emitting element.

* * * * *